US012707692B2

(12) United States Patent
Hsiung et al.

(10) Patent No.: US 12,707,692 B2
(45) Date of Patent: Aug. 11, 2026

(54) CONTACTS FOR SEMICONDUCTOR DEVICES AND METHODS OF FORMING THE SAME

(71) Applicant: Taiwan Semiconductor Manufacturing Co., Ltd., Hsinchu (TW)

(72) Inventors: Te-Chih Hsiung, Taipei City (TW); Jyun-De Wu, New Taipei City (TW); Yi-Chen Wang, Zhubei City (TW); Yi-Chun Chang, Hsinchu (TW); Yuan-Tien Tu, Puzih City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 353 days.

(21) Appl. No.: 18/590,634

(22) Filed: Feb. 28, 2024

(65) Prior Publication Data

US 2024/0250143 A1 Jul. 25, 2024

Related U.S. Application Data

(63) Continuation of application No. 17/352,195, filed on Jun. 18, 2021, now Pat. No. 11,961,893.

(Continued)

(51) Int. Cl.

*H01L 29/45* (2006.01)

*H10D 30/67* (2025.01)

(Continued)

(52) U.S. Cl.

CPC ......... *H10D 62/83* (2025.01); *H10D 30/6735* (2025.01); *H10D 62/118* (2025.01);

(Continued)

(58) Field of Classification Search

CPC ...... H10D 62/83; H10D 64/01; H10D 62/118; H10D 30/6735; H10D 64/62; H10P 95/06; H10P 50/28; H10W 20/42

See application file for complete search history.

(56) References Cited

U.S. PATENT DOCUMENTS 7,273,810 B2 9/2007 Naruse et al.
9,991,205 B2 6/2018 Chang et al.

(Continued)

FOREIGN PATENT DOCUMENTS

CN 101989591 A 3/2011
CN 107689355 A 2/2018

(Continued)

*Primary Examiner* — Victor A Mandala
*Assistant Examiner* — Colleen E Snow
(74) *Attorney, Agent, or Firm* — Slater Matsil, LLP

(57) ABSTRACT

Conductive contacts, methods for forming the same, and semiconductor devices including the same are disclosed. In an embodiment, a semiconductor device includes a first interlayer dielectric (ILD) layer over a transistor structure; a first contact extending through the first ILD layer, the first contact being electrically coupled with a first source/drain region of the transistor structure, a top surface of the first contact being convex, and the top surface of the first contact being disposed below a top surface of the first ILD layer; a second ILD layer over the first ILD layer and the first contact; and a second contact extending through the second ILD layer, the second contact being electrically coupled with the first contact.

20 Claims, 62 Drawing Sheets

Related U.S. Application Data

(60) Provisional application No. 63/180,891, filed on Apr. 28, 2021.

(51) Int. Cl.
*H10D 62/10* (2025.01)
*H10D 62/83* (2025.01)
*H10D 64/01* (2025.01)
*H10D 64/62* (2025.01)
*H10P 50/28* (2026.01)
*H10P 95/00* (2026.01)
*H10W 20/42* (2026.01)

(52) U.S. Cl.
CPC ............. *H10D 64/01* (2025.01); *H10D 64/62* (2025.01); *H10P 50/28* (2026.01); *H10P 95/06* (2026.01); *H10W 20/42* (2026.01)

(56) References Cited

U.S. PATENT DOCUMENTS 10,170,427 B2 1/2019 Chang et al.
10,224,242 B1 3/2019 Yang et al.
11,094,586 B2 8/2021 Choi et al.
11,355,363 B2 6/2022 Liaw
11,837,645 B2 12/2023 Hwang et al.
12,354,913 B2 7/2025 Hsieh et al.
2007/0007653 A1 1/2007 Chen et al.
2008/0079090 A1 4/2008 Hwang et al.
2011/0024907 A1 2/2011 Fujiyama
2014/0151893 A1 6/2014 Boyanov et al.
2015/0123286 A1 5/2015 Wada et al.
2015/0221642 A1 8/2015 Liaw
2019/0164887 A1* 5/2019 Wang .................... H10W 20/42
2020/0105586 A1 4/2020 Hsu et al.
2022/0069100 A1 3/2022 Hwang et al.

FOREIGN PATENT DOCUMENTS

CN 108987266 A 12/2018
JP 2005129902 A 5/2005
JP 2006216690 A 8/2006
JP 2011029552 A 2/2011
KR 20050006468 A 1/2005
KR 20200093110 A 8/2020
KR 20220030455 A 3/2022
TW 201824492 A 7/2018
TW 202109678 A 3/2021

* cited by examiner 66
86
68
83
81
50

CONTACTS FOR SEMICONDUCTOR DEVICES AND METHODS OF FORMING THE SAME

CROSS-REFERENCE TO RELATED APPLICATIONS

This application is a continuation of U.S. patent application Ser. No. 17/352,195, filed Jun. 18, 2021, which claims the benefit of U.S. Provisional Application No. 63/180,891, filed on Apr. 28, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
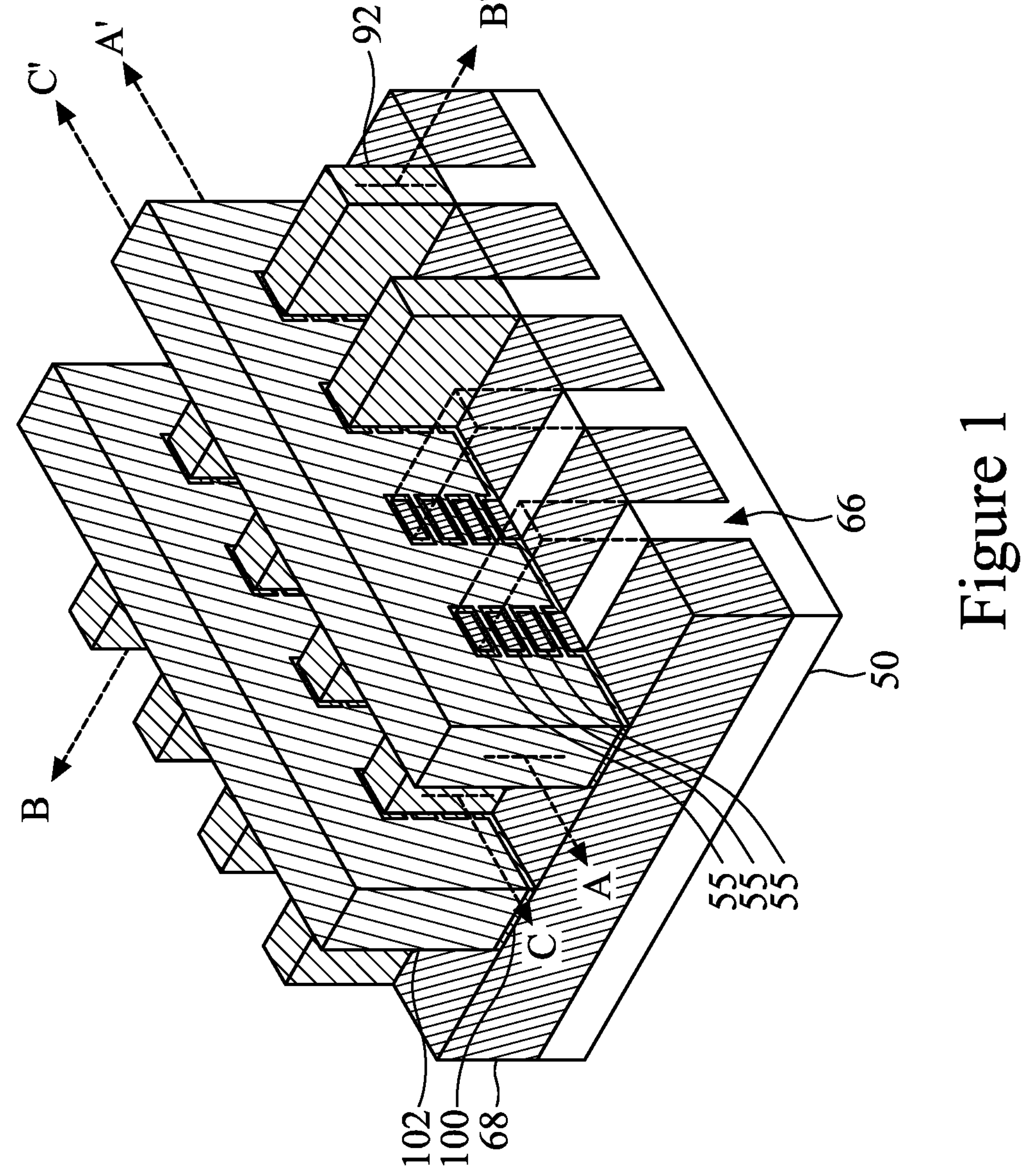
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved conductive contacts, methods of forming the improved conductive contacts, and semiconductor devices including the improved conductive contacts. The method includes forming a conductive contact. A planarization process, such as a chemical mechanical polish (CMP), an etch-back process, combinations thereof, may be performed on the conductive contact. An anneal process is performed on the conductive contact. The anneal process may be performed in the presence of hydrogen gas ($H_2$) and may be performed at a temperature greater than about 100° C. The anneal process helps to reduce oxidation of the conductive contact, reduces contact resistance (Rc) between the conductive contact and a conductive feature formed over and coupled to the conductive contact, provides a device boost, and provides improved device performance. The anneal process may restructure the conductive contact, such as recrystallizing the conductive contact, which may cause the material of the conductive contact to shrink and may reshape a top surface of the conductive contact. For example, prior to the anneal process being performed, the conductive contact may have a planar top surface. After the anneal process is performed, the top surface of the conductive contact may be restructured to have a convex shape. This change in shape may enlarge a contact area between the conductive feature and the conductive contact, further reducing the contact resistance, providing a device boost, and providing improved device performance.

Embodiments are described below in a particular context, a die comprising nanostructure FETs. Various embodiments may be applied, however, to dies comprising other types of transistors (e.g., fin field effect transistors (FinFETs), planar transistors, or the like) in lieu of or in combination with the nanostructure FETs.

FIG. 1 illustrates an example of nanostructure FETs (e.g., nanowire FETs, nanosheet FETs (Nano-FETs), or the like) in a three-dimensional view. The nano-FETs comprise nanostructures 55 (e.g., nanosheets, nanowires, or the like) over fins 66 on a substrate 50 (e.g., a semiconductor substrate). The nanostructures 55 act as channel regions for the nanostructure FETs. The nanostructures 55 may include p-type nanostructures, n-type nanostructures, or a combination thereof. Isolation regions 68 are disposed between adjacent fins 66. The fins 66 may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 is illustrated as being a single, continuous material with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces and sidewalls of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nanostructure FET. Cross-section B-B' is perpendicular to cross-section A-A' and is parallel to a longitudinal axis of a fin 66 of the nanostructure FET and in a direction of, for example, the current flow between the epitaxial source/drain regions 92 of the nanostructure FET. Cross-section C-C' is parallel to cross-section A-A' and extends through the epitaxial source/drain regions 92 of the nanostructure FET. Subsequent figures refer to these reference cross-sections for clarity.

Some embodiments discussed herein are discussed in the context of nanostructure FETs formed using a gate-last process. In other embodiments, a gate-first process may be used. Also, some embodiments contemplate aspects used in planar devices, such as planar FETs, or in fin field-effect transistors (FinFETs).

FIGS. 2 through 23D are cross-sectional views of intermediate stages in the manufacturing of nanostructure FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, and 23A illustrate reference cross-section A-A' illustrated in FIG. 1. FIGS. 6B, 7B, 8B, 9B, 10B, 11B, 11D, 12B, 12D, 13B, 14B, 15B, 16B, 17B, 18B, 19B, 19C, 19D, 19E, 20B, 20C, 20D, 20E, 21B, 21C, 21D, 21E, 22B, 22C, 23B, 23C, and 23D illustrate reference cross-section B-B' illustrated in FIG. 1. FIGS. 7C, 8C, 9C, 10C, 11C, 12C, and 12E illustrate reference cross-section C-C' illustrated in FIG. 1.

Figure 2:
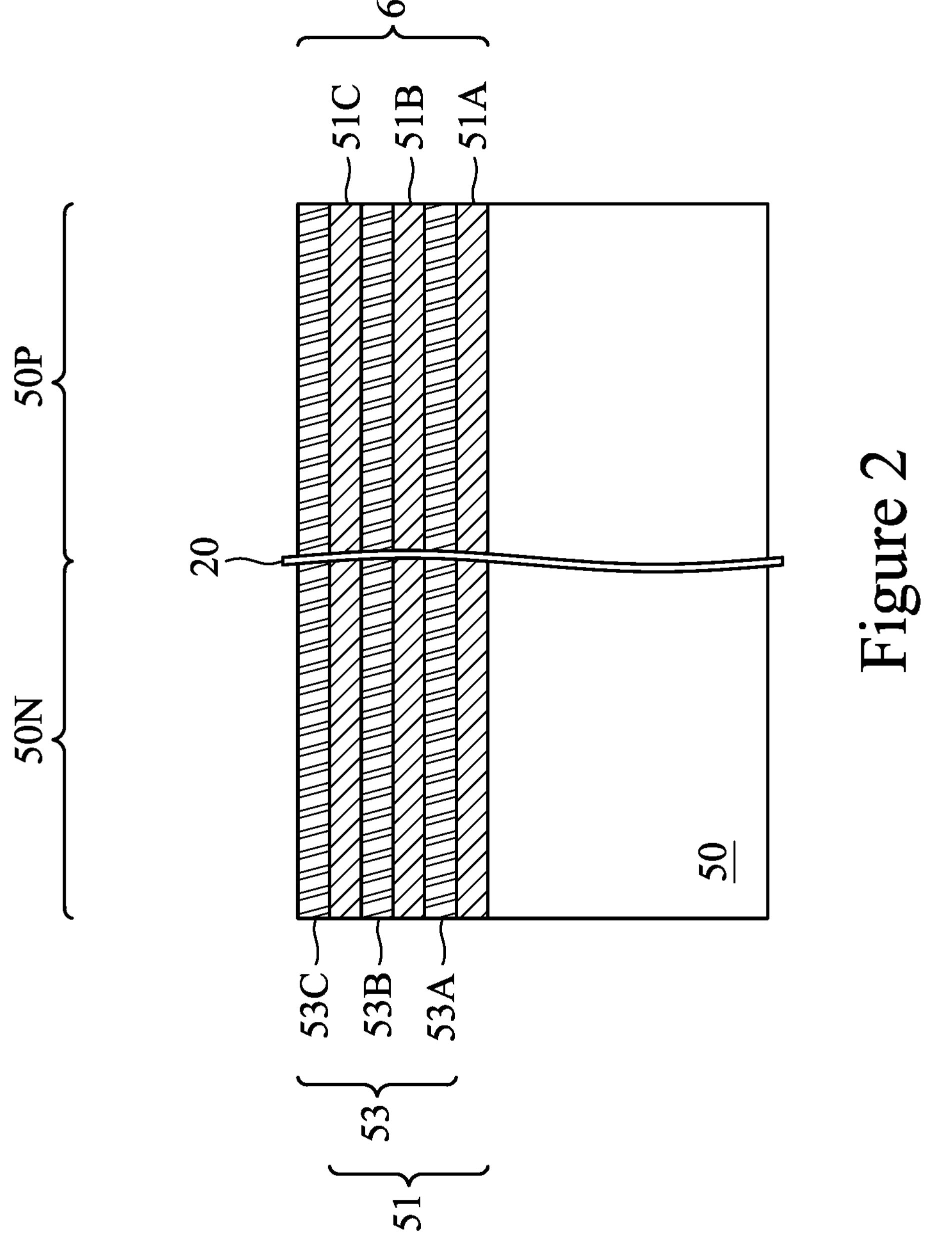
FIGS. 2, 3, 4, 5, 6A, 6B, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 14A, 14B, 15A, 15B, 16A, 16B, 17A, 17B, 18A, 18B, 19A, 19B, 19C, 19D, 19E, 20A, 20B, 20C, 20D, 20E, 21A, 21B, 21C, 21D, 21E, 22A, 22B, 22C, 23A, 23B, 23C, and 23D are cross-sectional views of intermediate stages in the manufacturing of nanostructure FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure FETs. The p-type region 50P can be for forming p-type devices, such as PMOS transistors, e.g., p-type nanostructure FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nanostructure FETs in the p-type region 50P. The first semiconductor layers 51 will be removed and the second semiconductor layers 53 will be patterned to form channel regions of nanostructure FETs in the n-type region 50N. Nevertheless, in some embodiments the first semiconductor layers 51 may be removed and the second semiconductor layers 53 may be patterned to form channel regions of nanostructure FETs in the p-type region 50P, and the second semiconductor layers 53 may be removed and the first semiconductor layers 51 may be patterned to form channel regions of nanostructure FETs in the n-type region 50N.

In some embodiments, the first semiconductor layers 51 may be removed and the second semiconductor layers 53 may be patterned to form channel regions of nanostructure FETS in both the n-type region 50N and the p-type region 50P. In some embodiments, the second semiconductor layers 53 may be removed and the first semiconductor layers 51 may be patterned to form channel regions of nanostructure FETs in both the n-type region 50N and the p-type region 50P. In such embodiments, the channel regions in both the n-type region 50N and the p-type region 50P may have a same material composition (e.g., silicon, or the another semiconductor material) and be formed simultaneously.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. The first semiconductor layers 51 may be formed of a first semiconductor material suitable for p-type nanostructure FETs, such as silicon germanium or the like. The second semiconductor layers 53 may be formed of a second semiconductor material suitable for n-type nanostructure FETs, such as silicon, silicon carbon, or the like. The multi-layer stack 64 is illustrated as having a bottommost semiconductor layer suitable for p-type nanostructure FETs (e.g., the first semiconductor layers 51) for illustrative purposes. In some embodiments, the multi-layer stack 64 may be formed such that the bottommost layer is a semiconductor layer suitable for n-type nanostructure FETs (e.g., the second semiconductor layers 53).

The first semiconductor materials and the second semiconductor materials may be materials having a high etch selectivity to one another. As such, the first semiconductor layers 51 formed of the first semiconductor materials may be removed without significantly removing the second semiconductor layers 53 formed of the second semiconductor materials in the n-type region 50N. This allows the second semiconductor layers 53 to be patterned to form channel regions of n-type nanostructure FETs. Similarly, the second semiconductor layers 53 formed of the second semiconductor materials may be removed without significantly removing the first semiconductor layers 51 formed of the first semiconductor materials in the p-type region 50P. This allows the first semiconductor layers 51 to be patterned to form channel regions of p-type nanostructure FETs.

Figure 3:
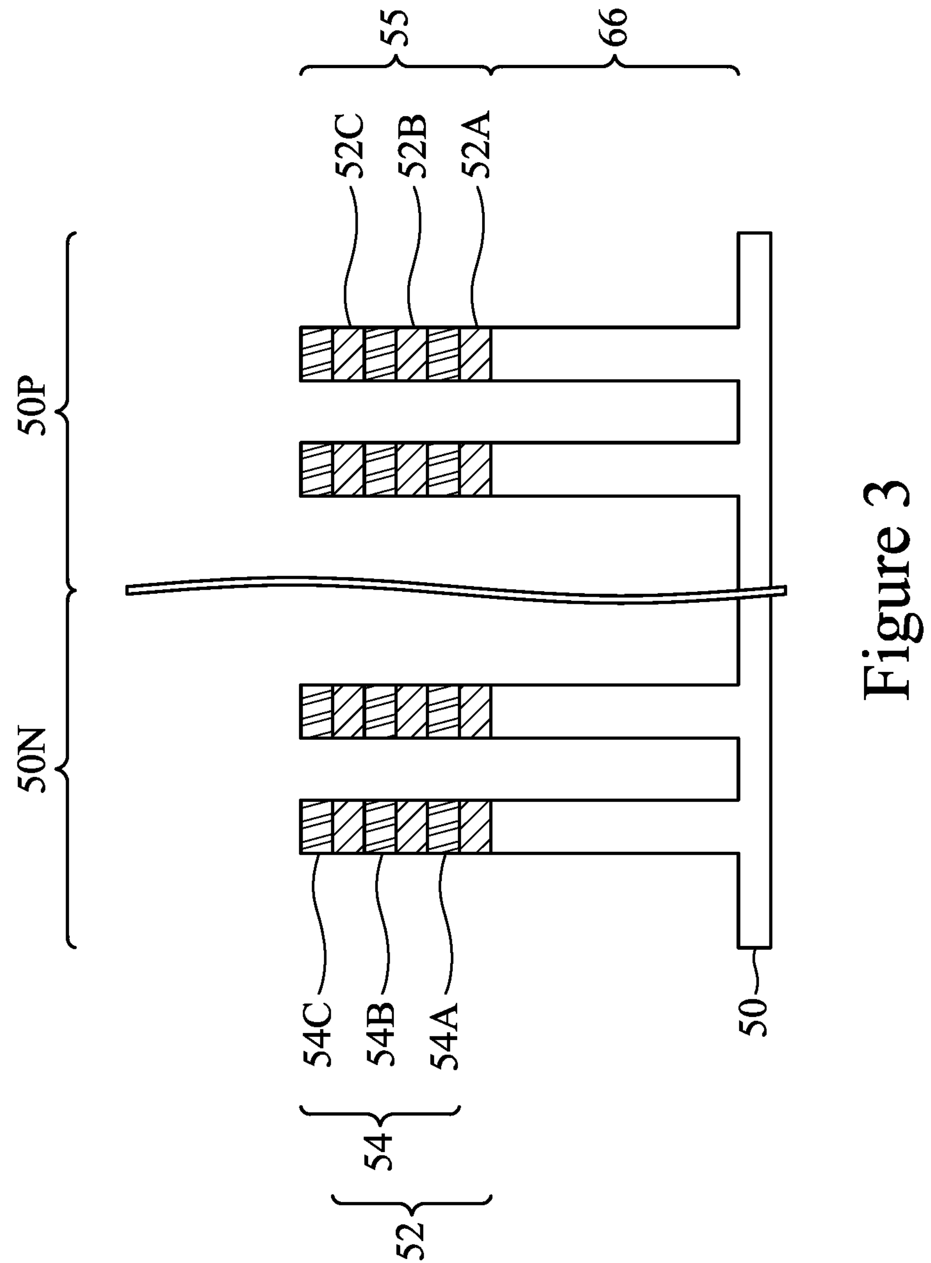

In FIG. 3, fins 66 are formed in the substrate 50 and nanostructures 55 are formed in the multi-layer stack 64. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as first nanostructures 52) from the first semiconductor layers 51 and define second nanostructures 54A-C (collectively referred to as second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers are used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater than or less than widths of the fins 66 in the p-type region 50P. Further, while each of the fins 66 and the nanostructures 55 are illustrated as having a consistent width throughout, in some embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and may be trapezoidal in shape.

Figure 4:
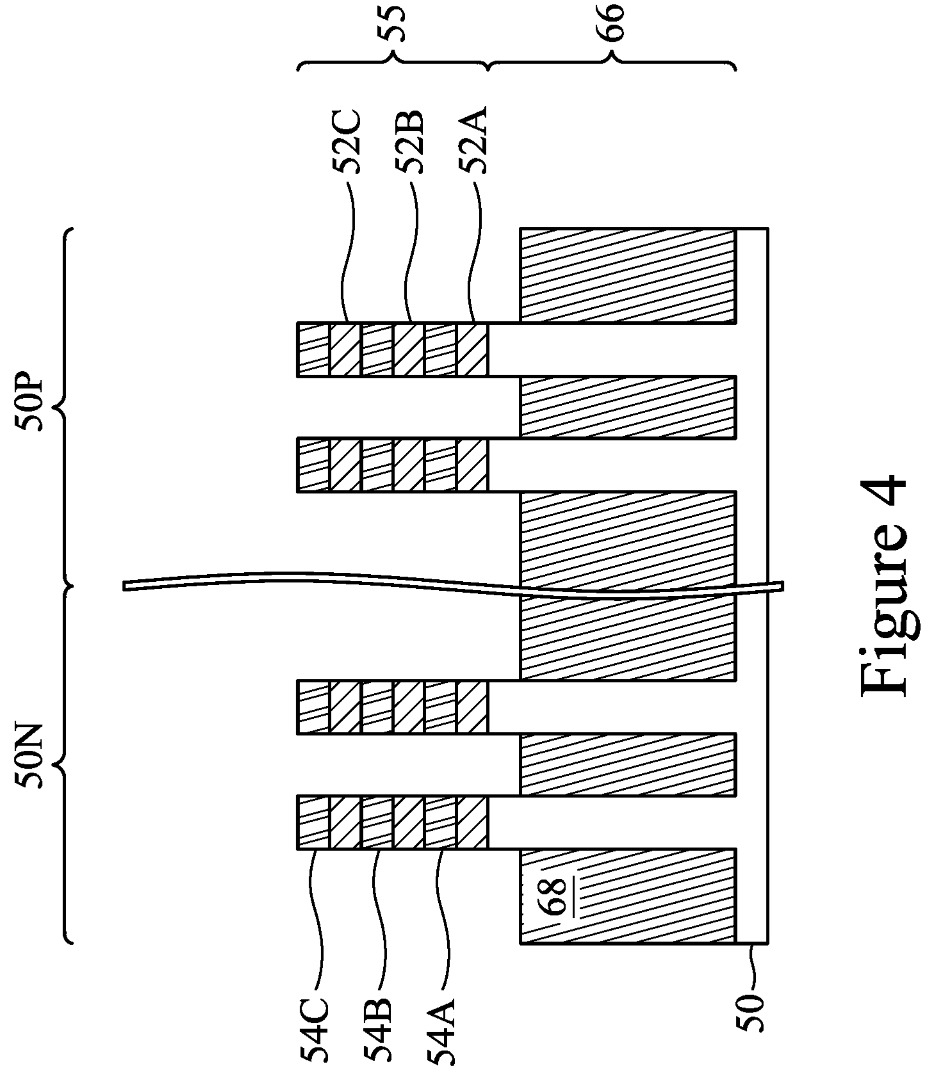

In FIG. 4, shallow trench isolation (STI) regions 68 are formed adjacent the fins 66. The STI regions 68 may be formed by depositing an insulation material over the substrate 50, the fins 66, and the nanostructures 55, and between adjacent fins 66. The insulation material may be an oxide (such as silicon oxide), a nitride, the like, or a combination thereof. The insulation material may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments, a liner (not separately illustrated) may be formed along surfaces of the substrate 50, the fins 66, and the nanostructures 55. Thereafter, a fill material, such as those discussed above, may be formed over the liner.

A removal process is then applied to the insulation material to remove excess insulation material over the nanostructures 55. In some embodiments, a planarization process, such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that the nanostructures 55 and upper portions of the fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etch process, such as one that is selective to the material of the insulation material (e.g., etches the material of the insulation material at a faster rate than the material of the fins 66 and the nanostructures 55). An oxide removal using dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth. This may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66, the nanostructures, and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/$cm^3$ to about $10^{14}$ atoms/$cm^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/$cm^3$ to about $10^{14}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
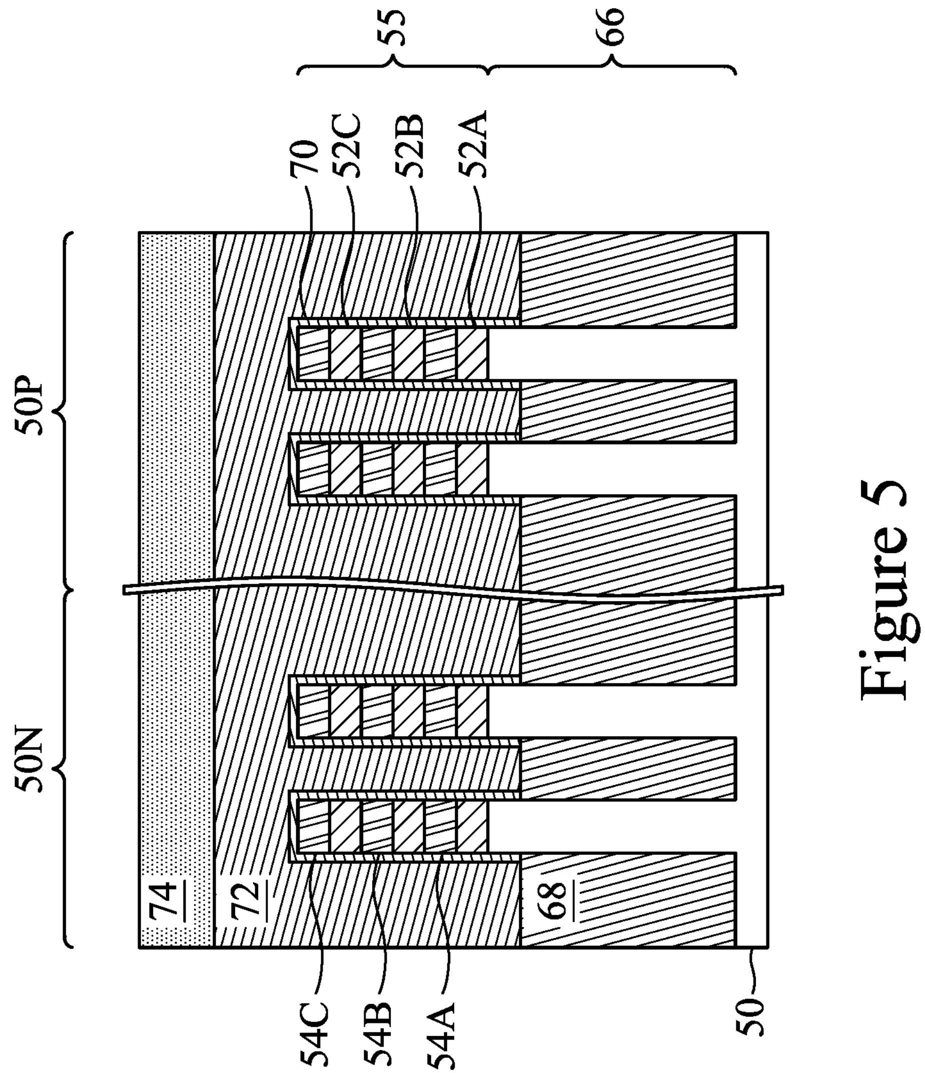

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques.

A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etch selectivity from the etching of isolation regions.

The mask layer 74 may be deposited over the dummy gate layer 72. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68. As such, the dummy dielectric layer 70 may extend between the dummy gate layer 72 and the STI regions 68.

Figure 6A:
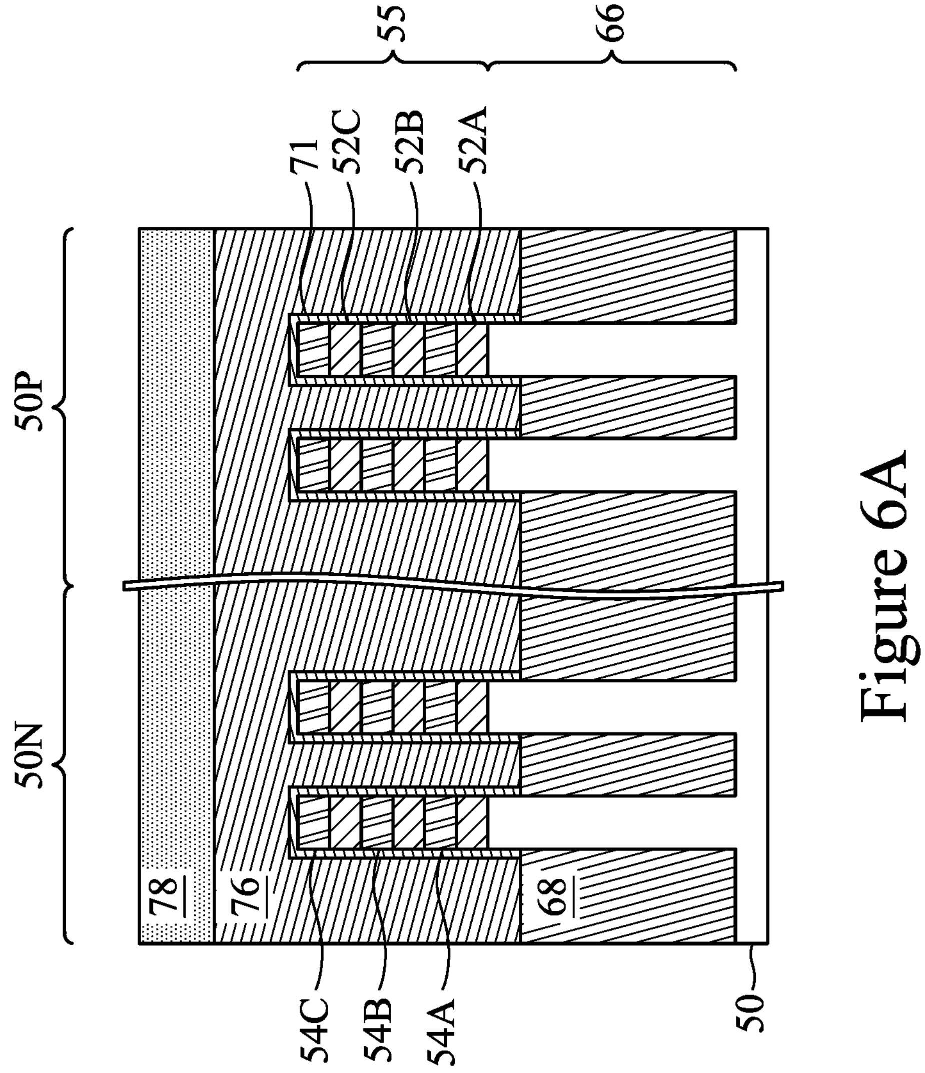
Figure 6B:
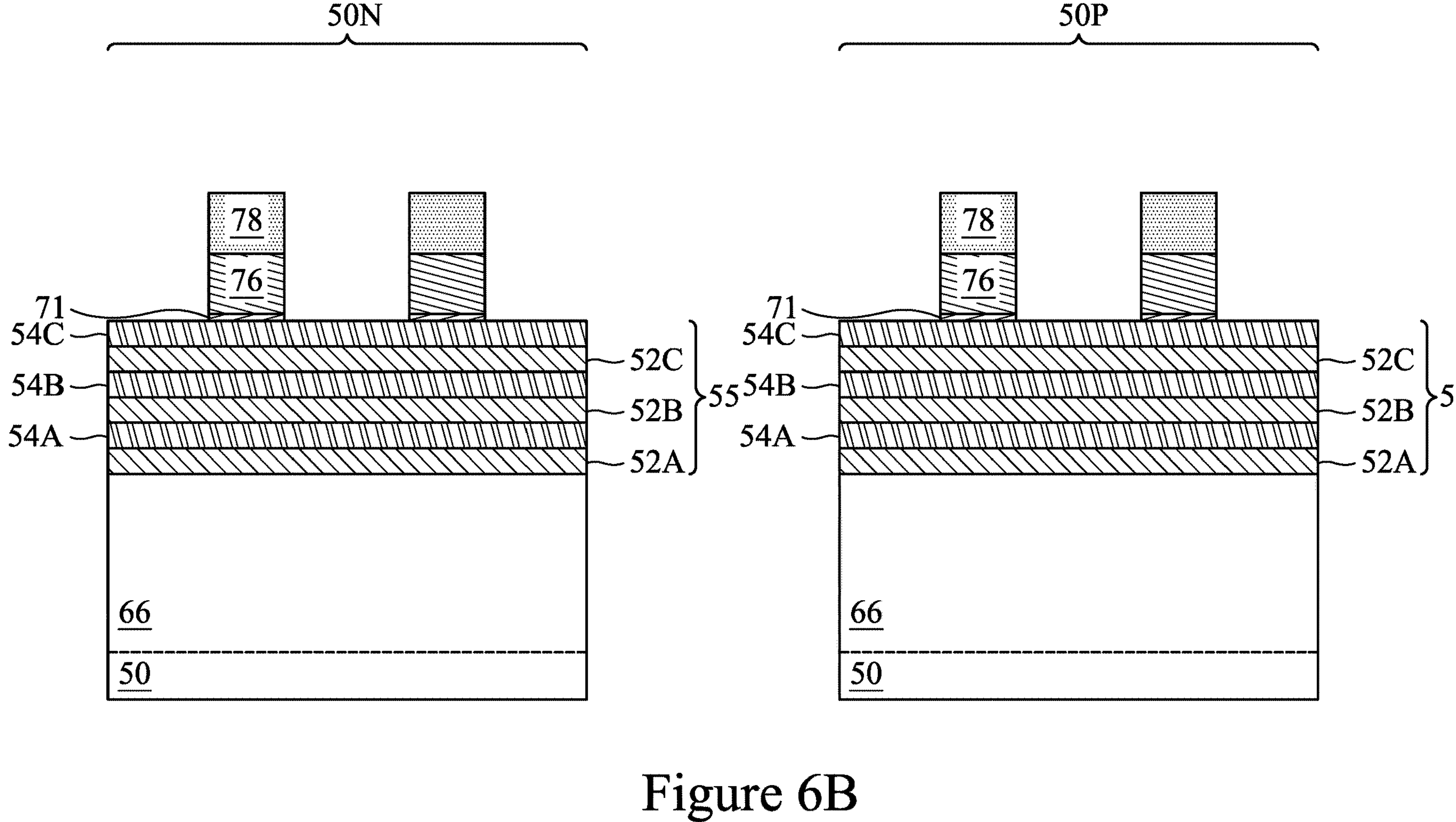

FIGS. 6A through 23D illustrate various additional steps in the manufacturing of embodiment devices. FIGS. 7A, 7C, 8A, 8C, 9A, 9C, 10A, 10C, 11A, 11C, 12A, 12C, 12E, 13A, 14A, and 15A illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may also have a lengthwise direction substantially perpendicular to the lengthwise direction of respective fins 66. The masks 78, the dummy gates 76, and the dummy gate dielectrics 71 may be collectively referred to as “dummy gate structures.”

Figure 7A:
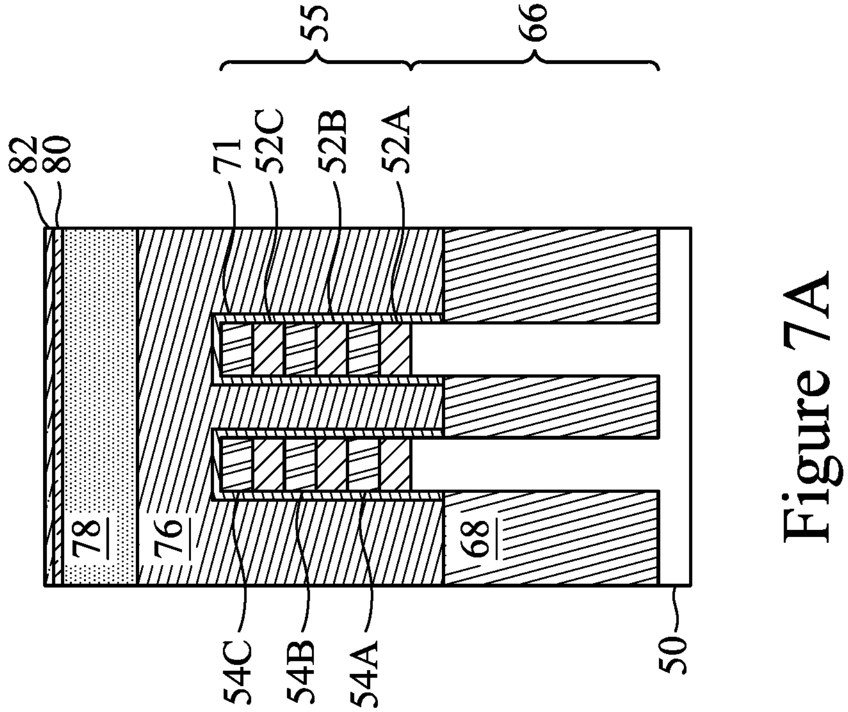
Figure 7B:
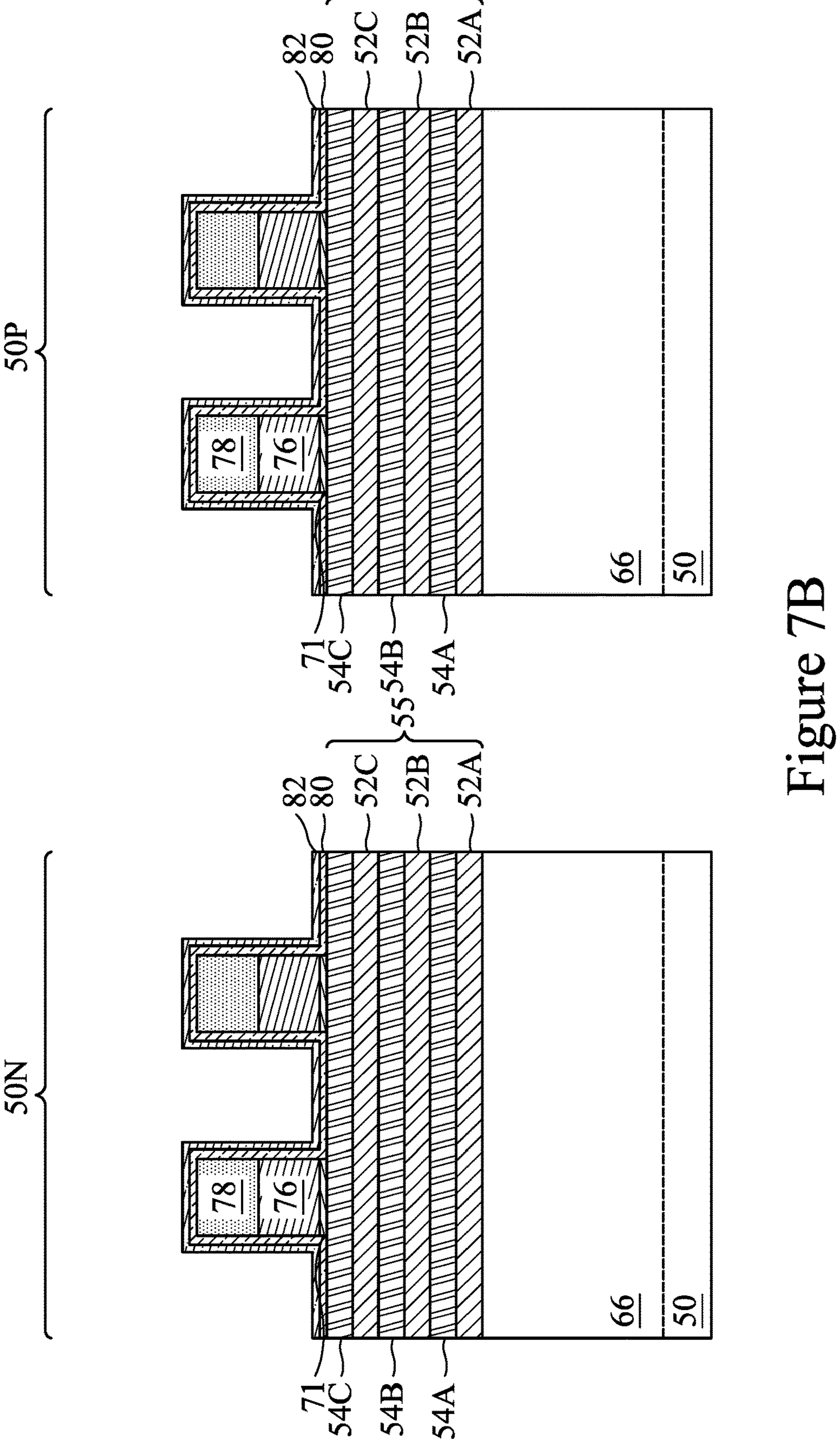
Figure 7C:
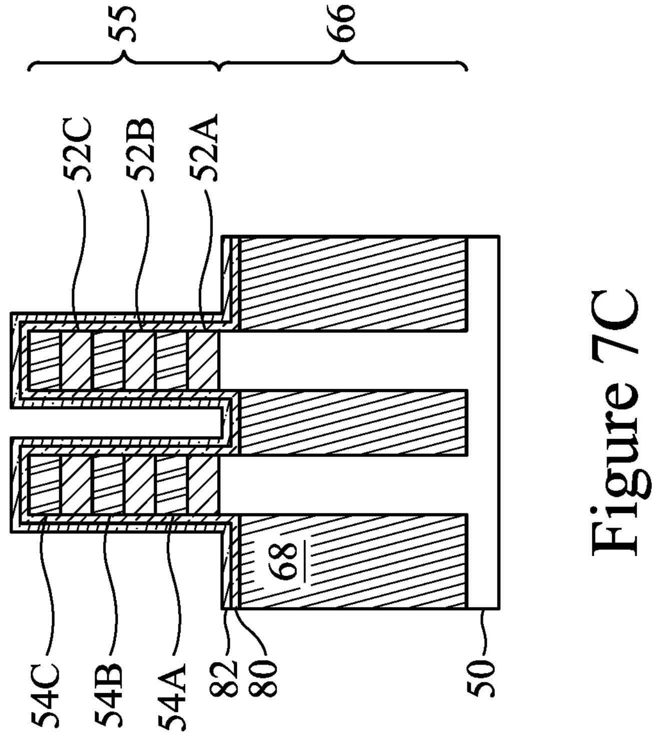

In FIGS. 7A through 7C, a first spacer layer 80 and a second spacer layer 82 are formed over dummy gate structures, the nanostructures 55, and the STI regions 68. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the nanostructures 55 and the masks 78; and sidewalls of the dummy gates 76, the dummy gate dielectrics 71, and the fins 66. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P. Appropriate type (e.g., p-type) impurities may be implanted into the exposed fins 66 and the nanostructures 55 in the p-type region 50P. The mask may then be removed. Subsequently, a mask, such as a photoresist, may be formed over the p-type region 50P while exposing the n-type region 50N. Appropriate type impurities (e.g., n-type) may be implanted into the exposed fins 66 and the nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/$cm^3$ to about $1\times10^{19}$ atoms/$cm^3$. An anneal may be used to repair implant damage and to activate the implanted impurities.

Figure 8A:
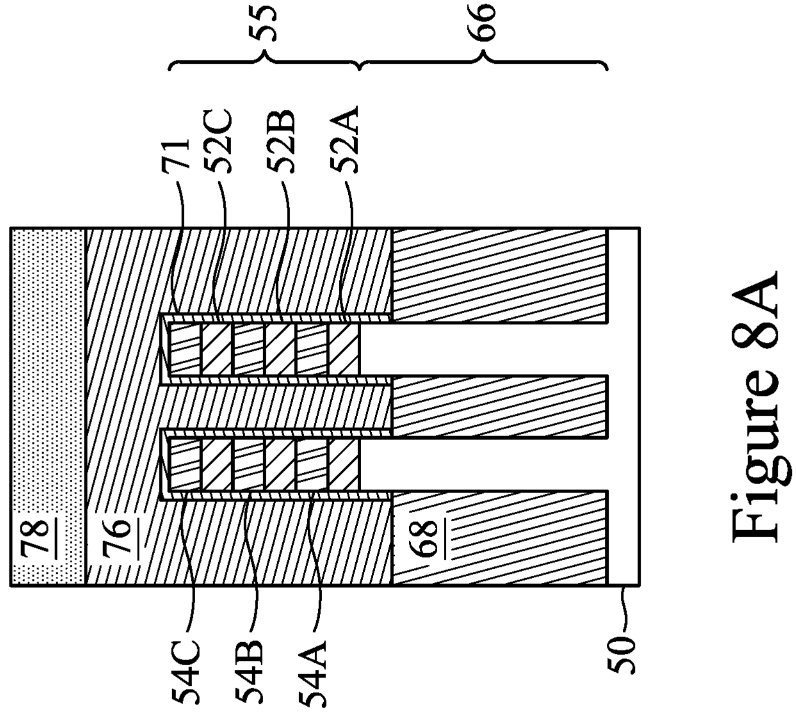
Figure 8B:
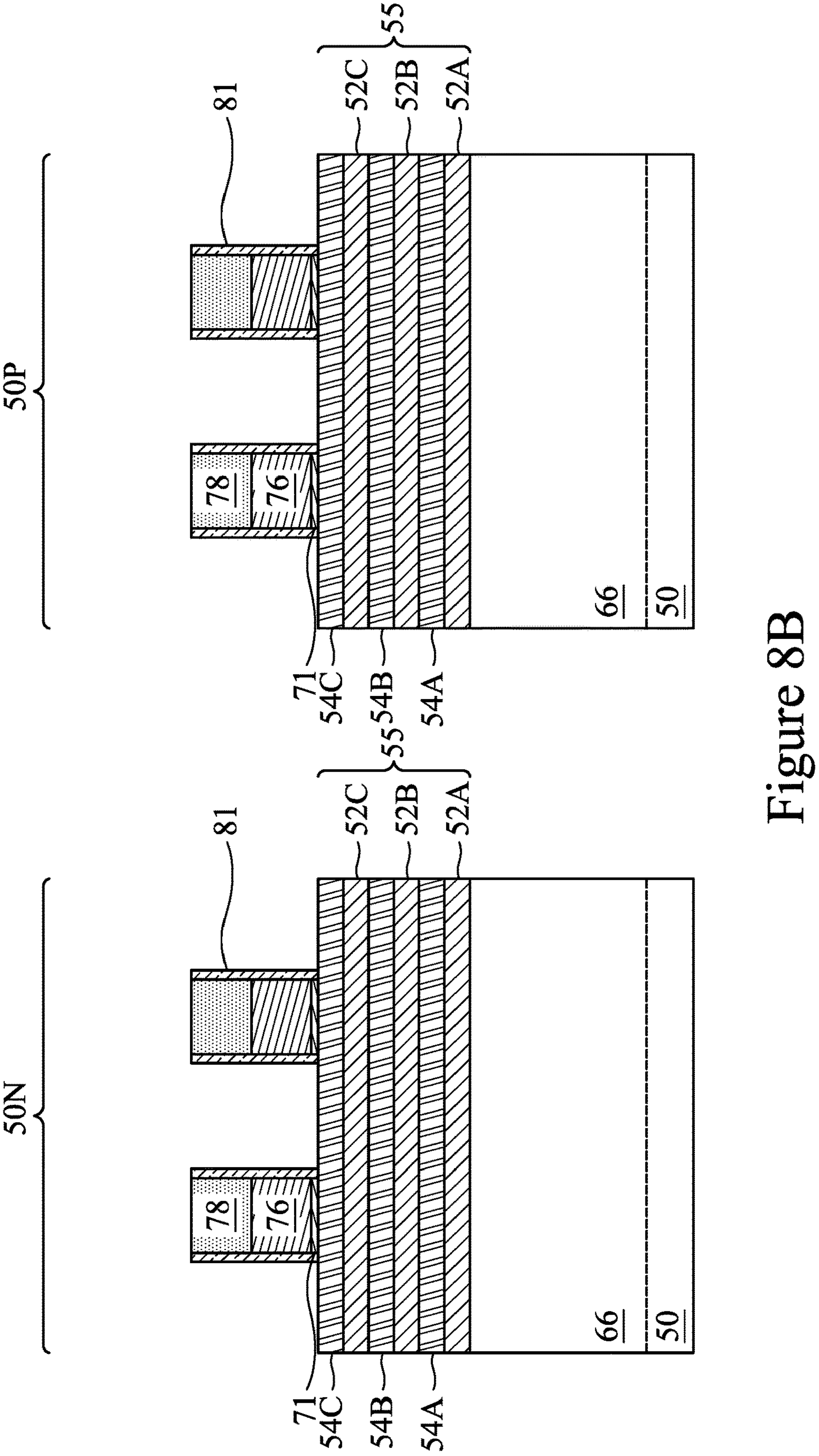
Figure 8C:
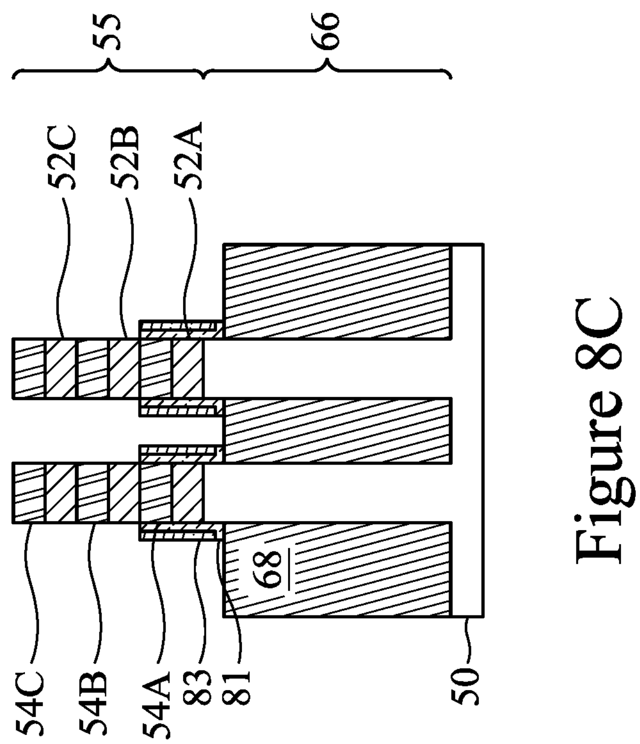

In FIGS. 8A through 8C, the first spacer layer 80 and the second spacer layer 82 (see FIGS. 7A through 7C) are etched to form first spacers 81 and second spacers 83. As will be discussed in greater detail below, the first spacers 81 and the second spacers 83 act to self-align subsequently formed source drain regions, as well as to protect sidewalls of the fins 66 and/or the nanostructure 55 during subsequent processing. The first spacer layer 80 and the second spacer layer 82 may be etched using a suitable etch process, such as an isotropic etch process (e.g., a wet etch process), an anisotropic etch process (e.g., a dry etch process), or the like. In some embodiments, the material of the second spacer layer 82 has a different etch rate than the material of the first spacer layer 80, such that the first spacer layer 80 may act as an etch stop layer when patterning the second spacer layer 82 and the second spacer layer 82 may act as a mask when patterning the first spacer layer 80. For example, the second spacer layer 82 may be etched using an anisotropic etch process wherein the first spacer layer 80 acts as an etch stop layer. Remaining portions of the second spacer layer 82 form second spacers 83, as illustrated in FIG. 8C. The second spacers 83 then act as a mask while etching exposed portions of the first spacer layer 80, thereby forming first spacers 81 as illustrated in FIGS. 8B and 8C.

As illustrated in FIG. 8C, the first spacers 81 and the second spacers 83 are disposed on sidewalls of the fins 66 and/or the nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and only the first spacers 81 are disposed on sidewalls of the masks 78, the dummy gates 76, and dummy gate dielectrics 71. In some embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
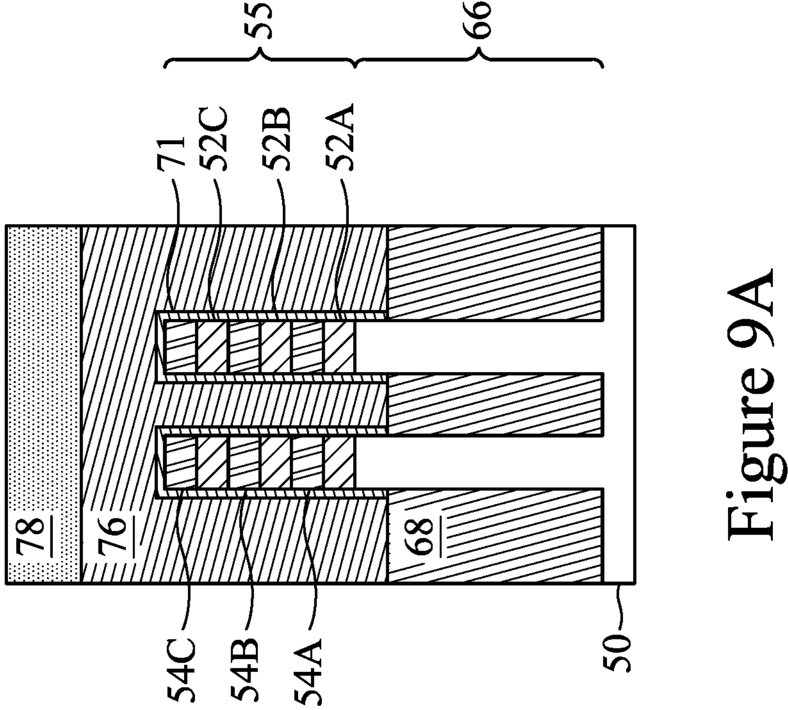
Figure 9B:
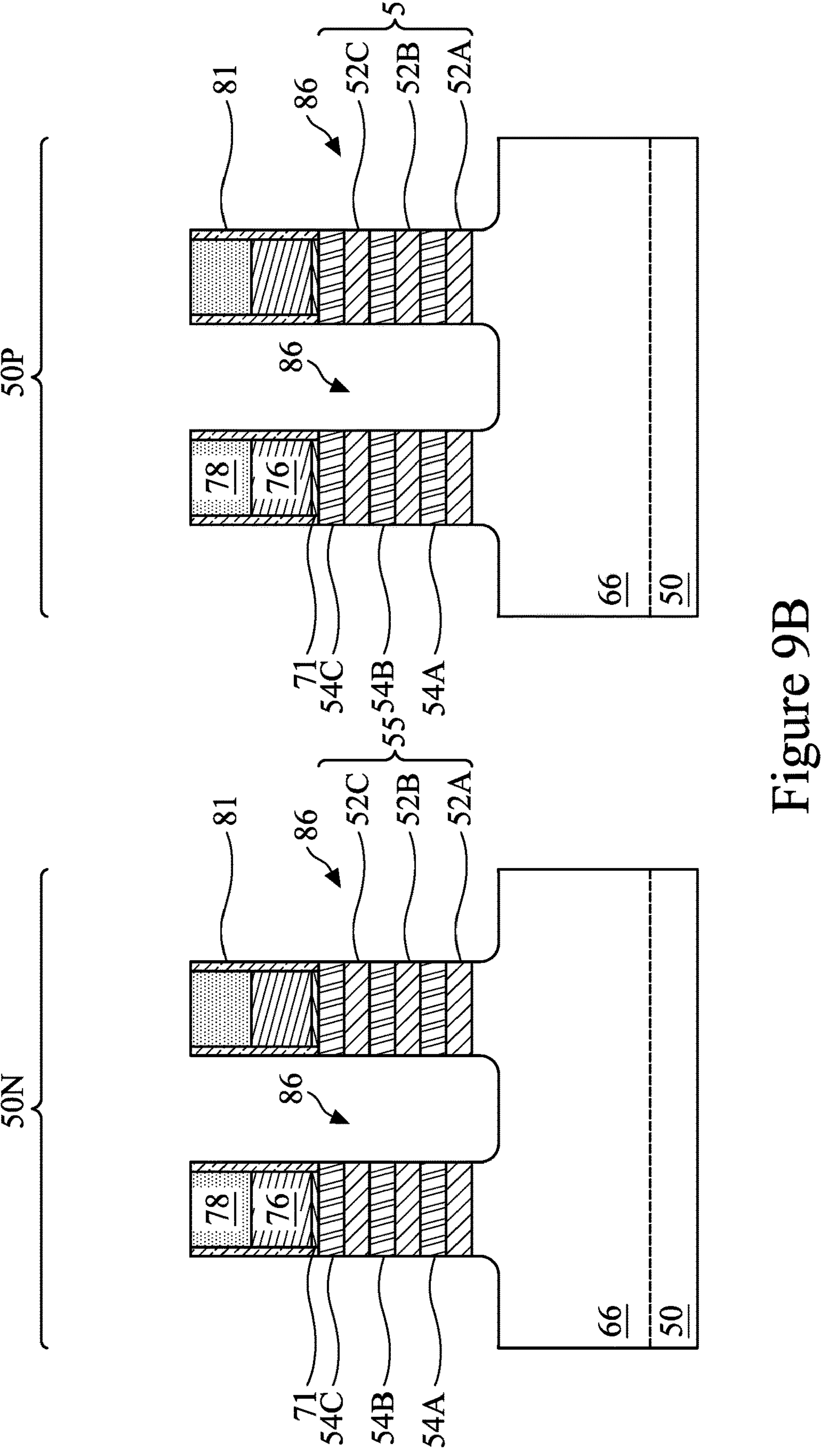
Figure 9C:
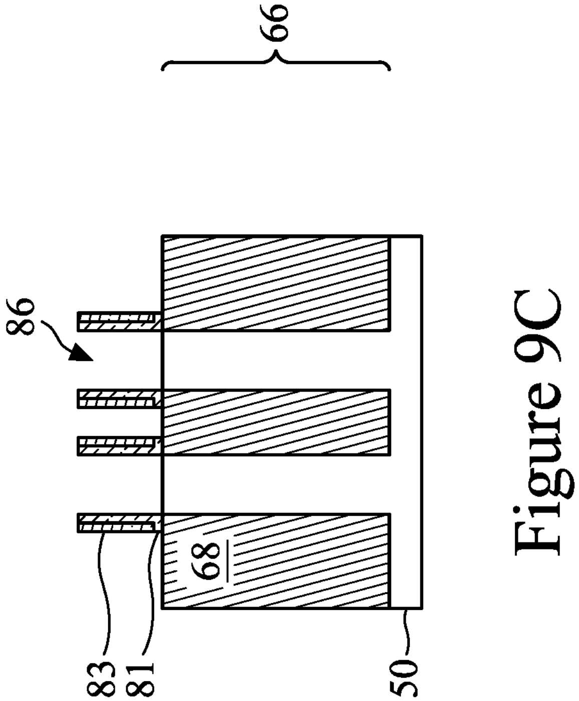

In FIGS. 9A through 9C, first recesses 86 are formed in the nanostructures 55, the fins 66, and the substrate 50. Epitaxial source/drain regions will be subsequently formed in the first recesses 86. The first recesses 86 may extend through the first nanostructures 52, the second nanostructures 54, and into the substrate 50. As illustrated in FIG. 9C, top surfaces of the STI regions 68 may be level with bottom surfaces of the first recesses 86. In various embodiments, the fins 66 may be etched such that bottom surfaces of the first recesses 86 are disposed above the top surfaces of the STI regions 68, below the top surfaces of the STI regions 68, or the like. The first recesses 86 may be formed by etching the nanostructures 55, the fins 66, and the substrate 50 using an anisotropic etch processes, such as RIE, NBE, or the like. The first spacers 81, the second spacers 83, and the masks 78 mask portions of the nanostructures 55, the fins 66, and the substrate 50 during the etch processes used to form the first recesses 86. A single etch process or multiple etch processes may be used to etch each layer of the nanostructures 55, the fins 66, and/or the substrate 50. Timed etch processes may be used to stop the etching of the first recesses 86 after the first recesses 86 reach a desired depth.

Figure 10A:
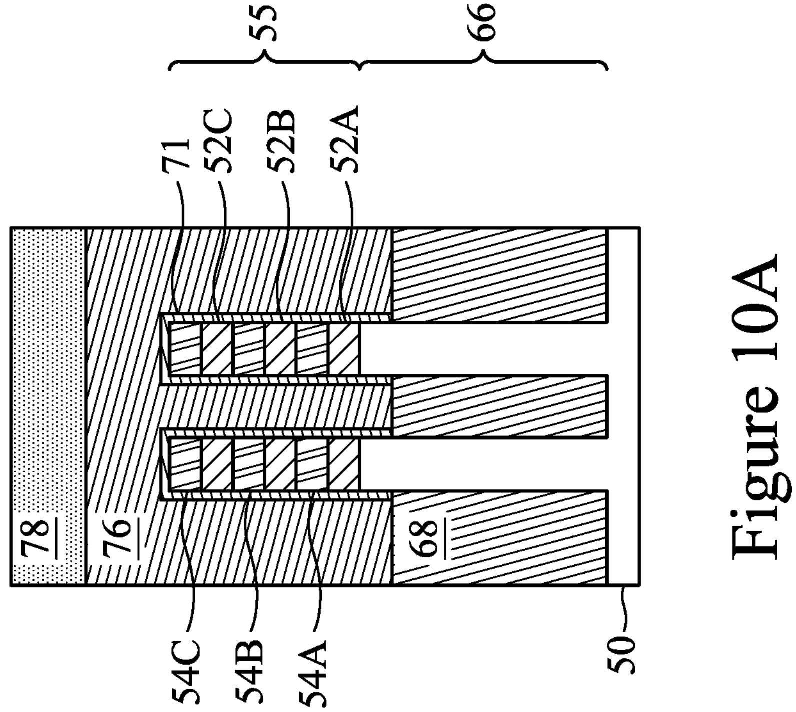
Figure 10B:
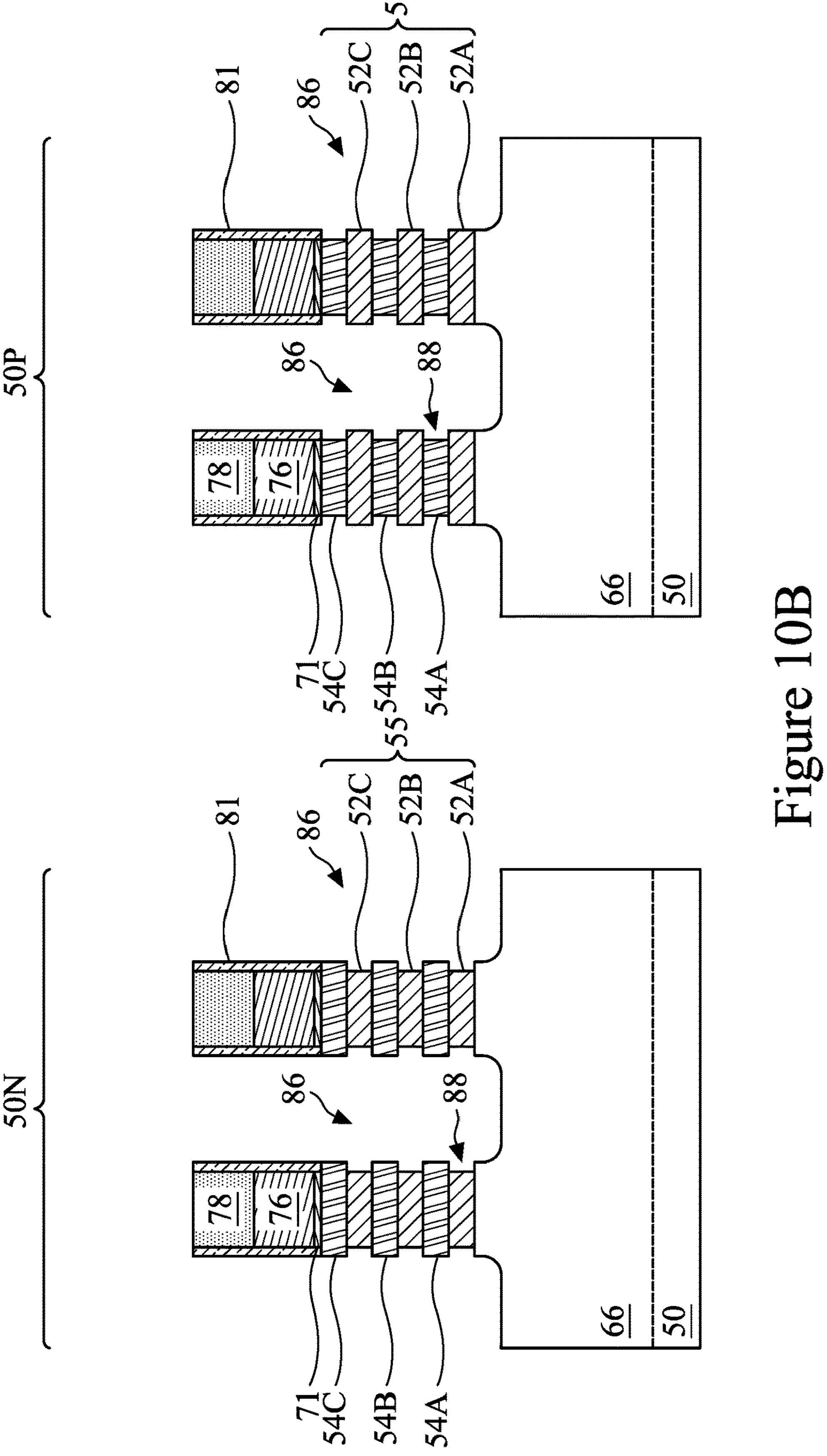
Figure 10C:
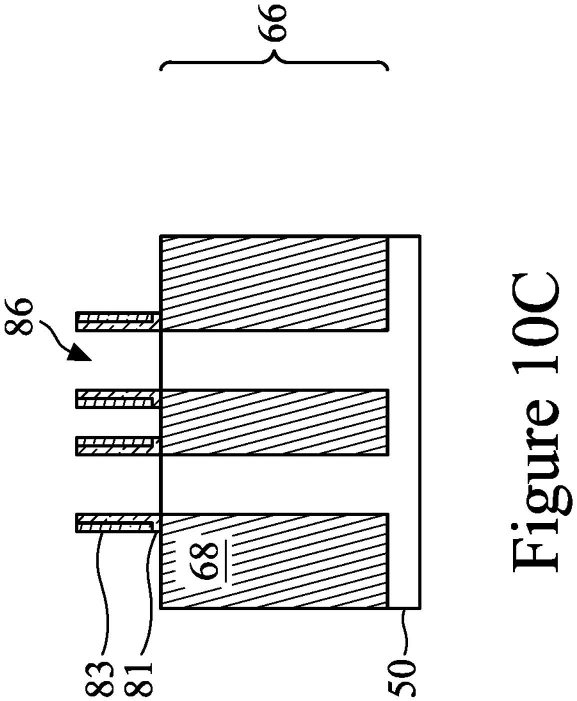

In FIGS. 10A through 10C, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 adjacent the sidewall recesses 88 are illustrated as being straight in FIG. 10B, the sidewalls may be concave or convex. The sidewalls may be etched using isotropic etch processes, such as a wet etch or the like. The p-type region 50P may be protected using a mask (not separately illustrated), while etchants selective to the first semiconductor materials are used to etch the first nanostructures 52. As such, the second nanostructures 54 and the substrate 50 in the n-type region 50N remain relatively un-etched as compared to the first nanostructures 52. Similarly, the n-type region 50N may be protected using a mask (not separately illustrated), while etchants selective to the second semiconductor materials are used to etch the second nanostructures 54. As such, the first nanostructures 52 and the substrate 50 in the p-type region 50P remain relatively un-etched as compared to the second nanostructures 54. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N. A wet or dry etch process with hydrogen fluoride, another fluorine-based etchant, or the like may be used to etch sidewalls of the second nanostructures 54 in the p-type region 50P.

In FIGS. 11A through 11D, first inner spacers 90 are formed in the sidewall recesses 88. The first inner spacers 90 may be formed by depositing an inner spacer layer (not separately illustrated) over the structures illustrated in FIGS. 10A through 10C. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may be anisotropically etched to form the first inner spacers 90, using a process such as RIE, NBE, or the like.

Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52. Moreover, although the outer sidewalls of the first inner spacers 90 are illustrated as being straight in FIG. 11B, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Further in FIG. 11D, sidewalls of the second nanostructures 54 are concave, outer sidewalls of the first inner spacers 90 are concave, and the first inner spacers 90 are recessed from sidewalls of the first nanostructures 52 in the p-type region 50P.

The first inner spacers 90 act as isolation features between subsequently formed source/drain regions (such as the epitaxial source/drain regions 92, discussed below with respect to FIGS. 12A through 12E) and gate structures (such as the gate structures including the gate dielectric layers 100 and the gate electrodes 102, discussed below with respect to FIGS. 17A and 17B). The first inner spacers 90 may be also prevent damage to the epitaxial source/drain regions 92 by subsequent etching processes, such as etching processes used to form the gate structures including the gate dielectric layers 100 and the gate electrodes 102.

Figure 11A:
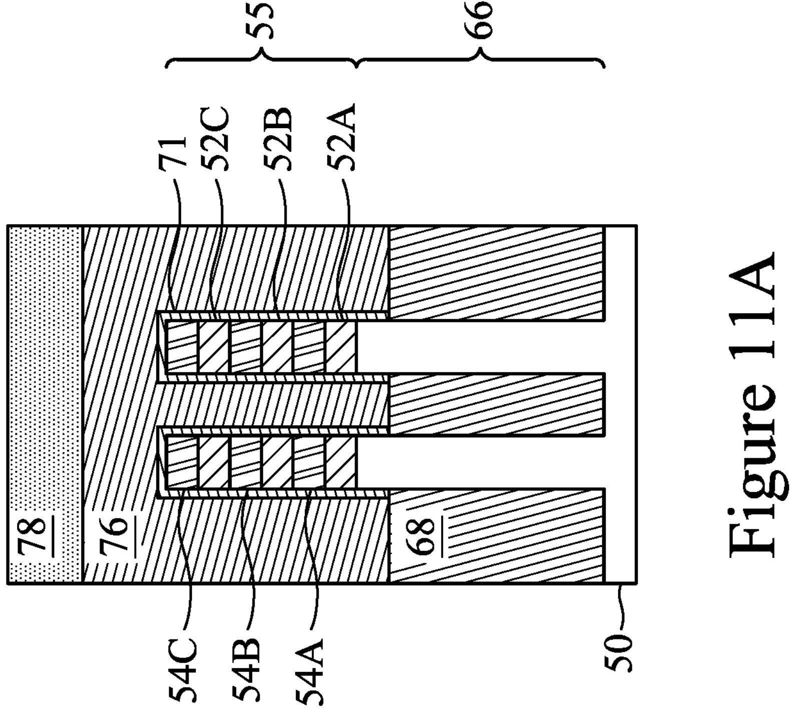
Figure 11B:
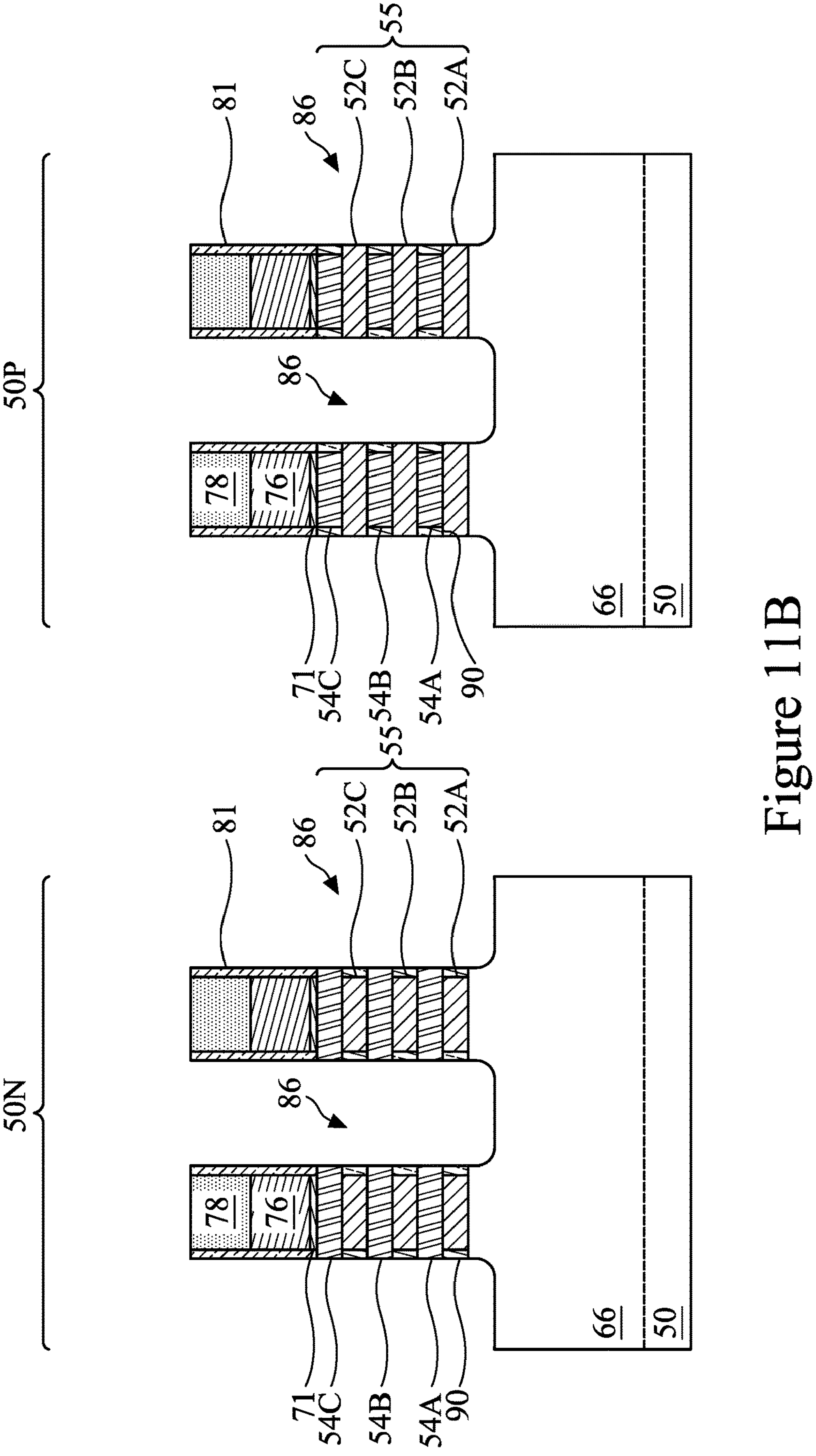
Figure 11C:
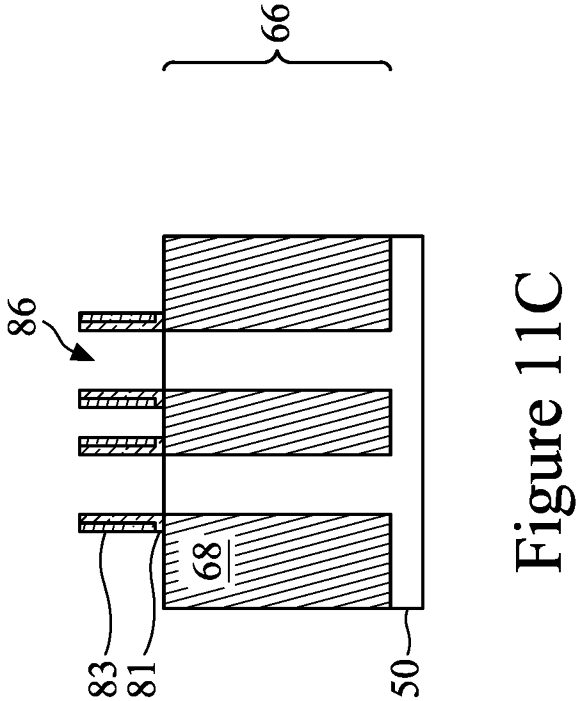
Figure 11D:
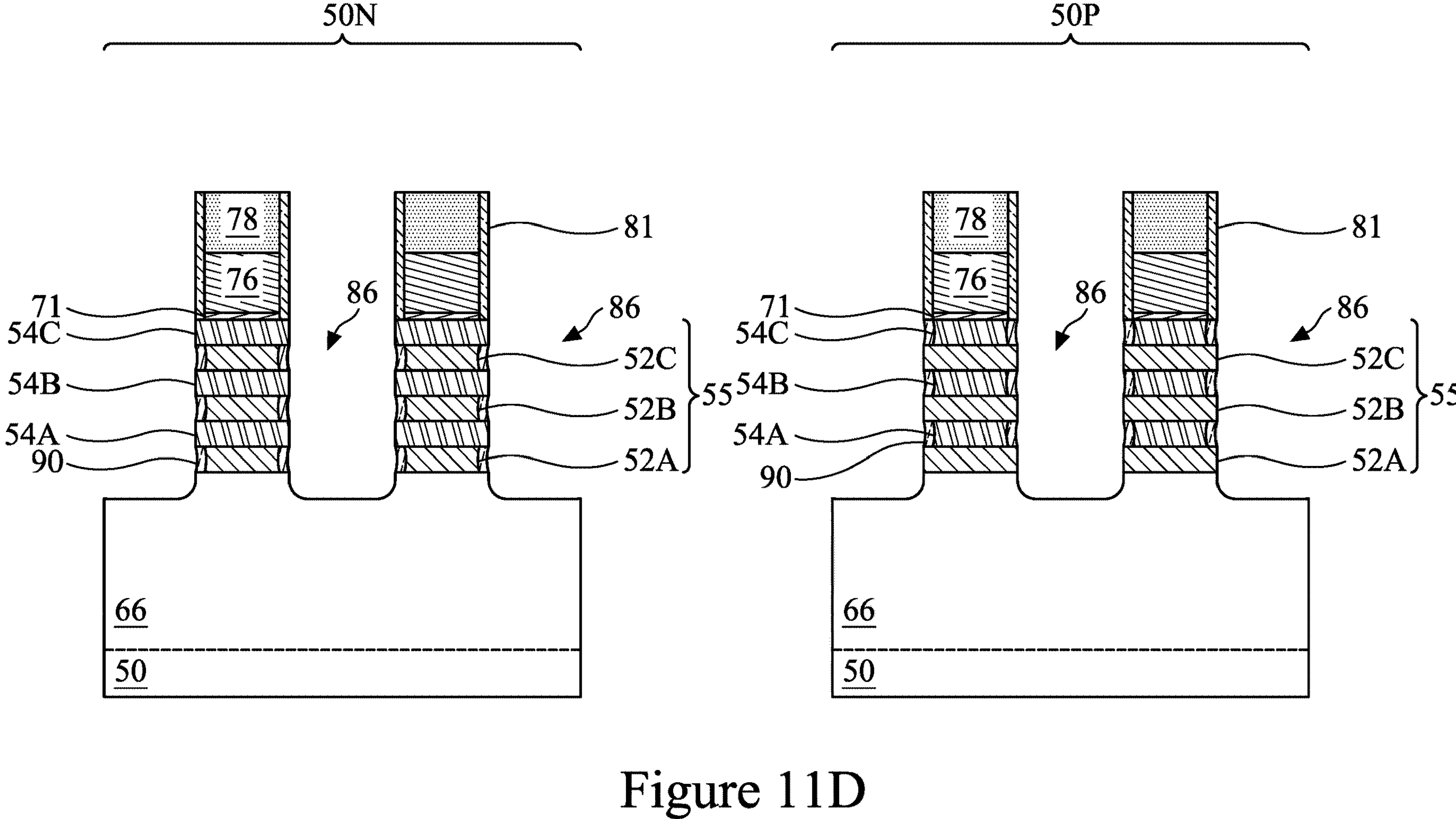
Figure 12A:
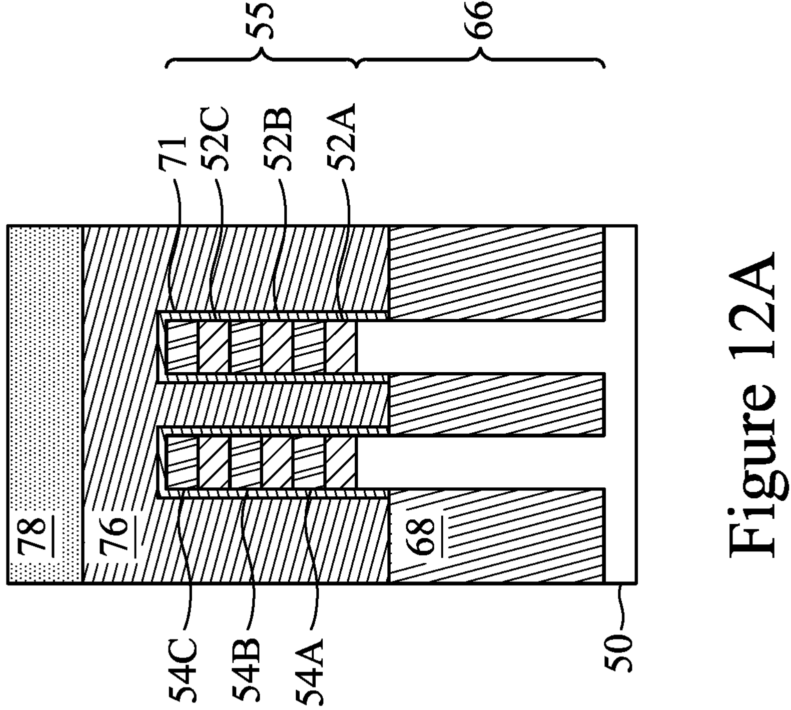
Figure 12B:
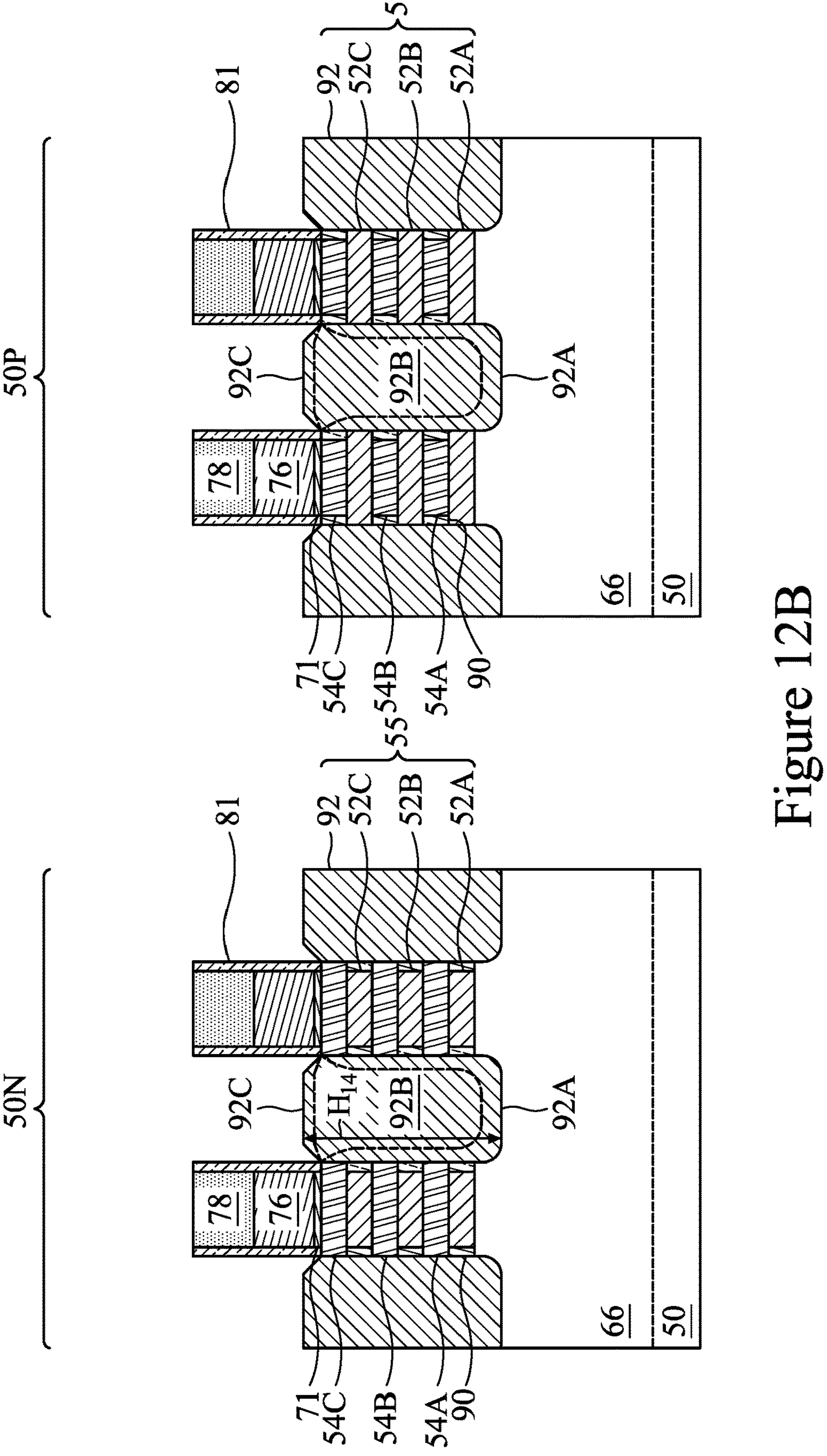

In FIGS. 12A through 12E, epitaxial source/drain regions 92 (which may include a first semiconductor material layer 92A, a second semiconductor material layer 92B, and a third semiconductor material layer 92C) are formed in the first recesses 86 (illustrated in FIGS. 11B through 11D). In some embodiments, the epitaxial source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each of the dummy gates 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by appropriate lateral distances to prevent shorts between the epitaxial source/drain regions 92 and subsequently formed gate structures (such as the gate structures including the gate dielectric layers 100 and the gate electrodes 102, discussed below with respect to FIGS. 17A and 17B). In some embodiments, the epitaxial source/drain regions 92 may have heights $H_{14}$ ranging from about 20 nm to about 70 nm.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nanostructure FETs. For example, in embodiments in which the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nanostructure FETs. For example, in embodiments in which the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92, the nanostructures 55, the fins 66, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/$cm^3$ and about $1\times10^{21}$ atoms/$cm^3$. The n-type and/or p-type impurities for the source/drain regions may be any of the impurities previously discussed. In some embodiments, the epitaxial source/drain regions 92 may be in situ doped during growth.

Figure 12C:
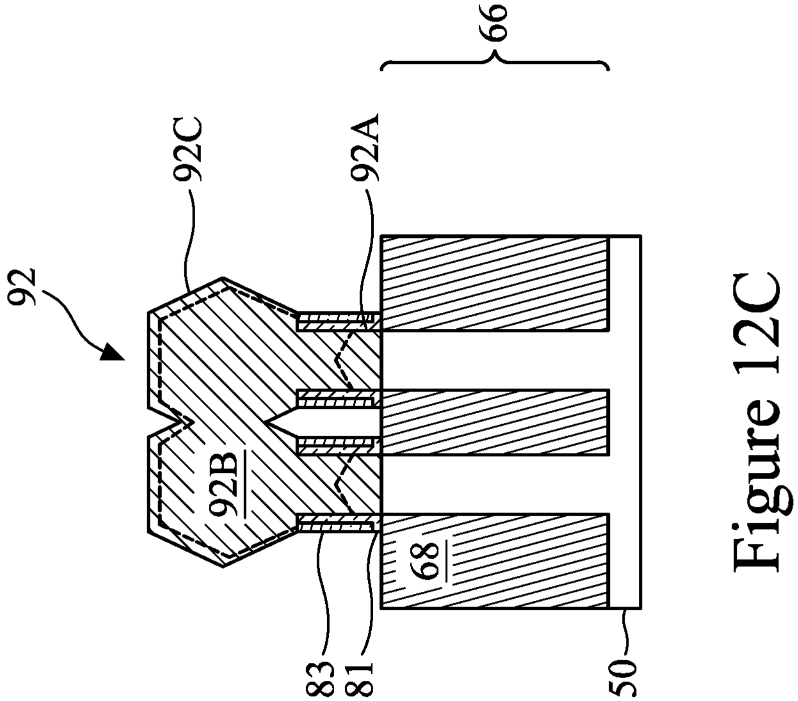

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nanostructure FET to merge, as illustrated by FIG. 12C. In other embodiments, adjacent epitaxial source/drain regions 92 remain separated after the epitaxy process is completed, as illustrated by FIG. 12E. In the embodiments illustrated in FIGS. 12C and 12E, the first spacers 81 may be formed extending to top surfaces of the STI regions 68, thereby blocking the epitaxial growth. In some embodiments, the first spacers 81 may cover portions of the sidewalls of the nanostructures 55, further blocking the epitaxial growth. In some embodiments, the spacer etch used to form the first spacers 81 may be adjusted to remove the spacer material, allowing the epitaxial source/drain regions 92 to extend to the surfaces of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
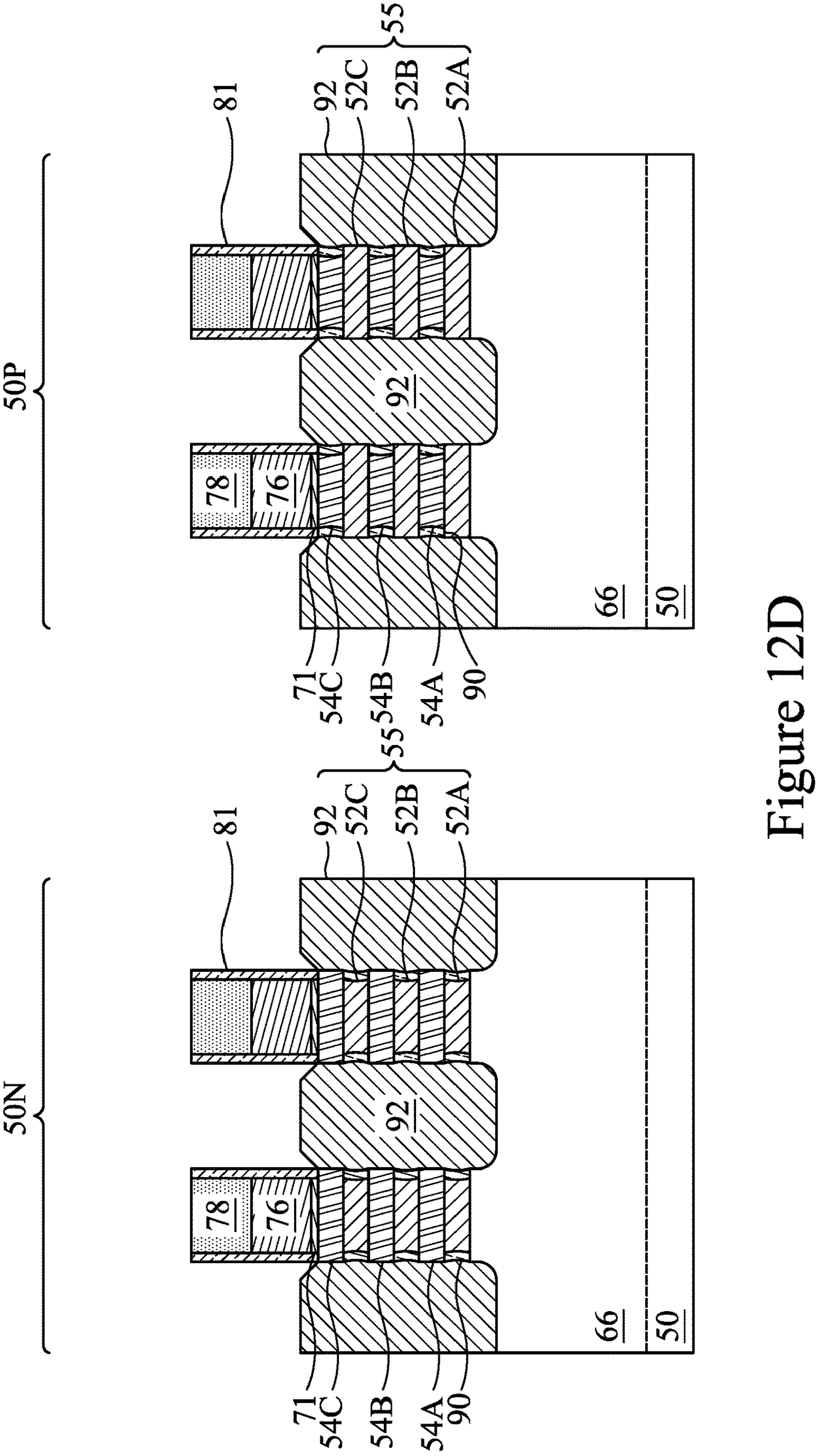
Figure 12E:
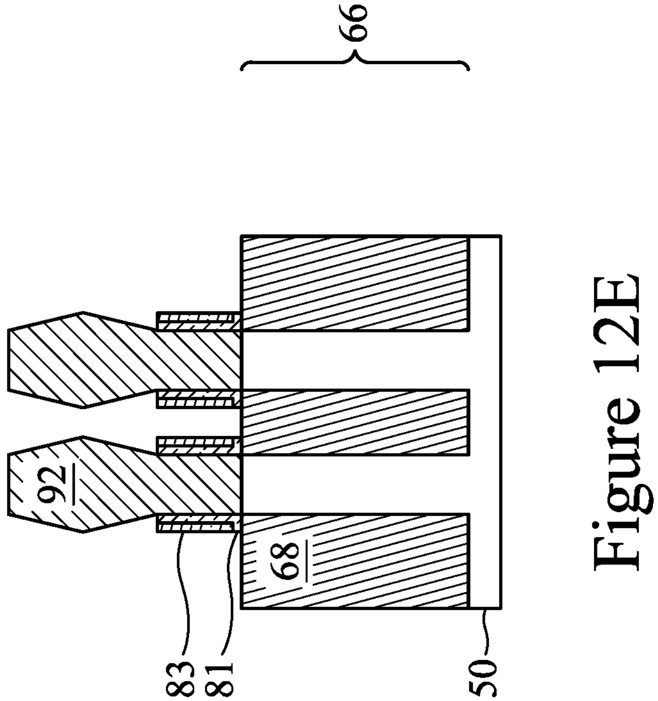

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13A:
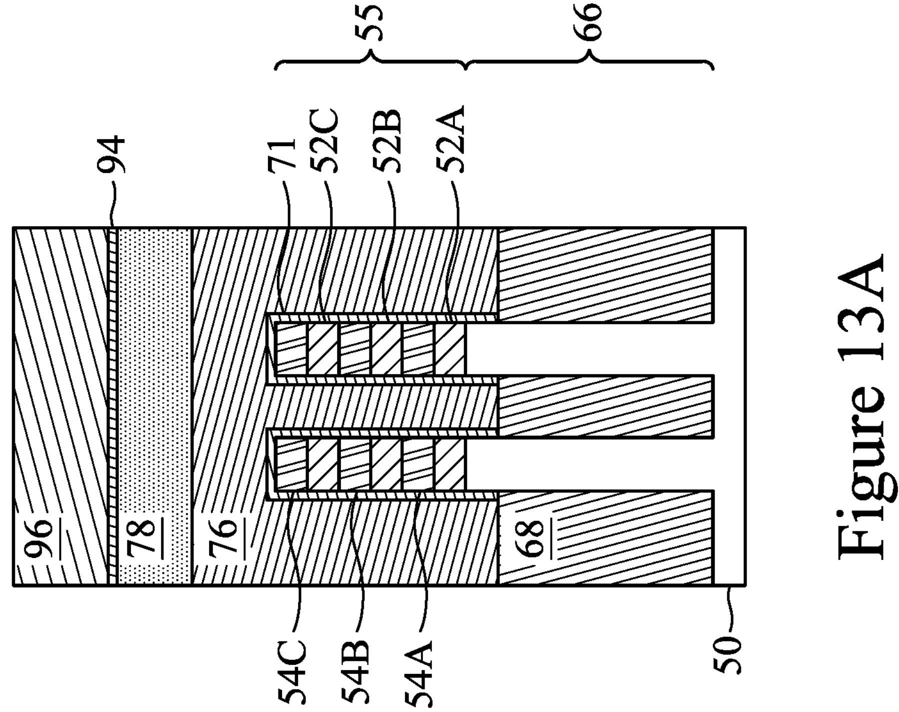
Figure 13B:
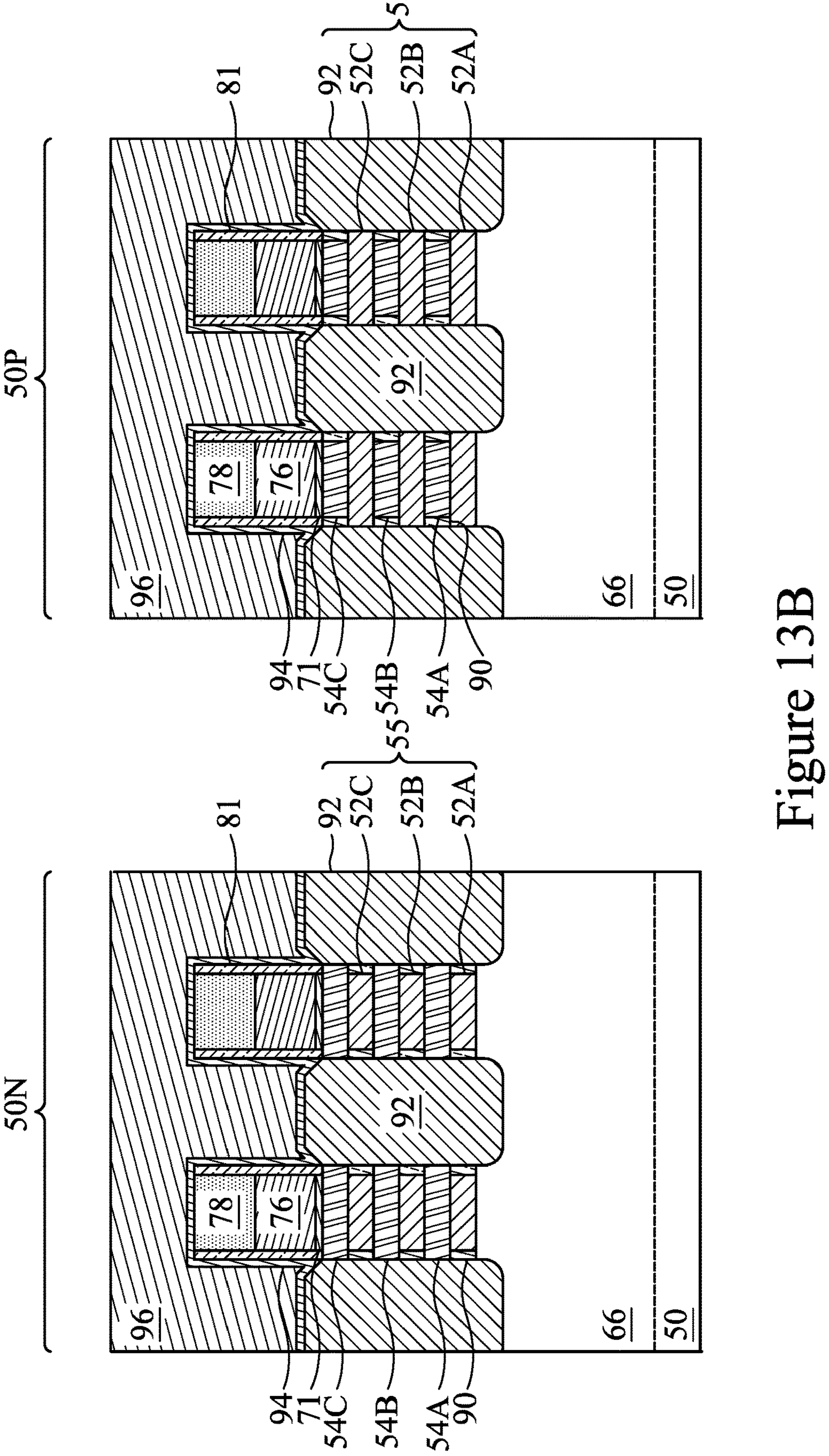

In FIGS. 13A and 13B, a contact etch stop layer (CESL) 94 and a first interlayer dielectric (ILD) 96 are deposited over the epitaxial source/drain regions 92, the dummy gate structures, and the first spacers 81. The CESL 94 may comprise a dielectric material, such as, silicon nitride, silicon oxide, silicon oxynitride, or the like, having a different etch rate than the material of the overlying first ILD 96. The CESL 94 may be deposited by ALD, CVD, or the like. The CESL 94 may be optional and may be omitted in some embodiments. The first ILD 96 may be formed of a dielectric material, and may be deposited by any suitable method, such as CVD, plasma-enhanced CVD (PECVD), or FCVD. Suitable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Figure 14A:
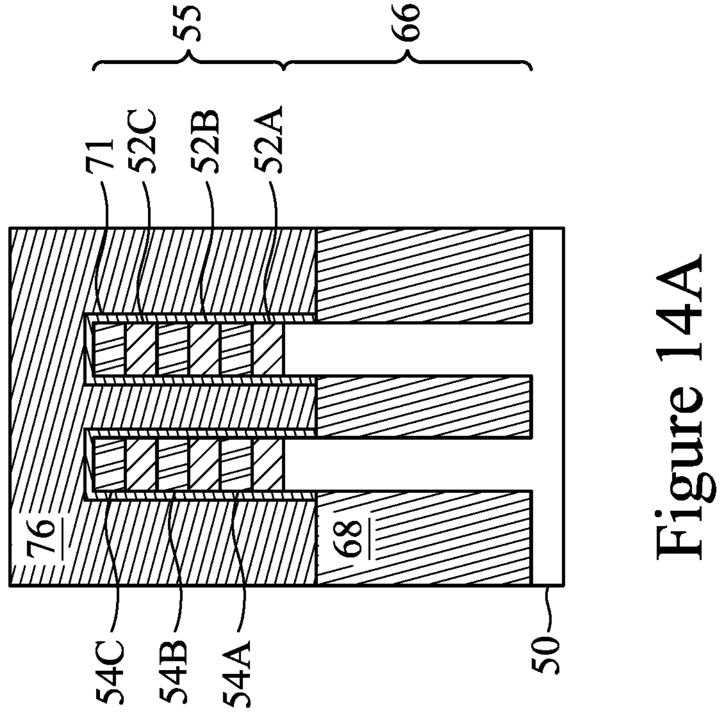
Figure 14B:
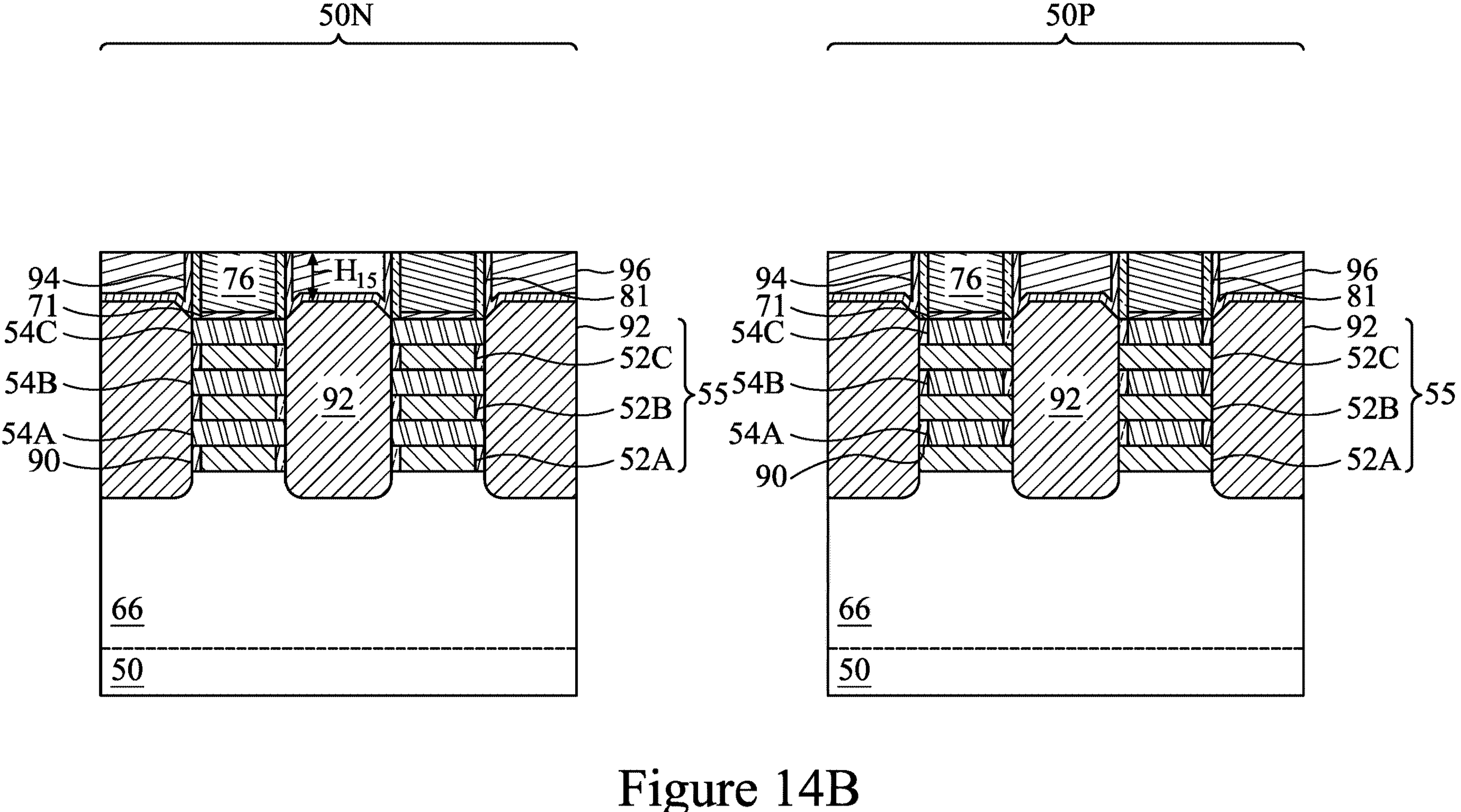

In FIGS. 14A and 14B, a planarization process, such as a CMP, is performed to level top surfaces of the first ILD 96 with top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, the CESL 94, and the first ILD 96 are level with one another (within process variations). Accordingly, the top surfaces of the dummy gates 76 are exposed through the first ILD 96 and the CESL 94. In some embodiments, the masks 78 may remain, in which case the planarization process levels the top surfaces of the first ILD 96 and the CESL 94 with top surfaces of the masks 78 and the first spacers 81. Following the planarization process, the first ILD 96 may have a height $H_{15}$ above top surfaces of the epitaxial source/drain regions 92 ranging from about 10 nm to about 60 nm.

Figure 15A:
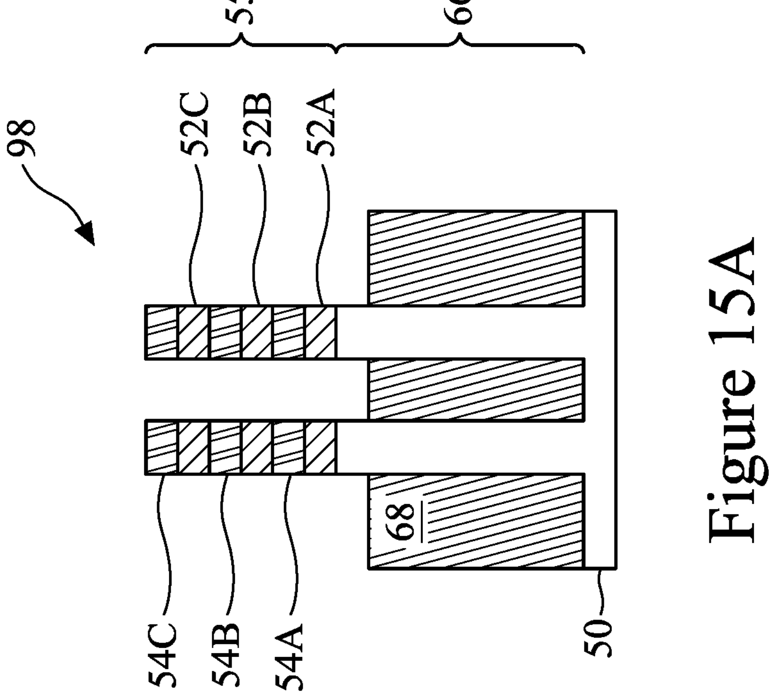
Figure 15B:
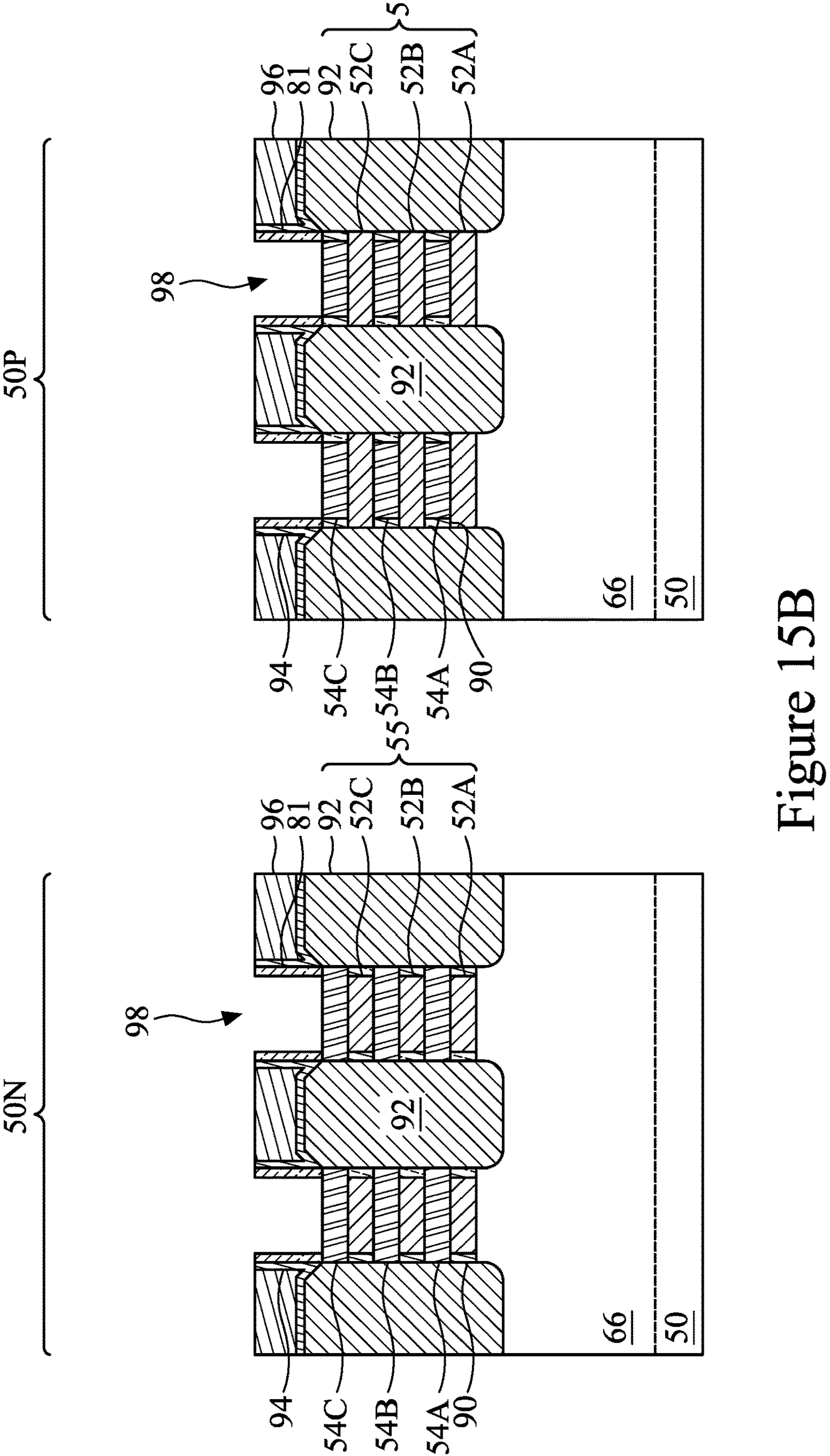

In FIGS. 15A and 15B, the dummy gates 76, the dummy gate dielectrics 71, and the masks 78, if present, are removed, forming second recesses 98. In some embodiments, the dummy gates 76 and the dummy gate dielectrics 71 are removed by one or more etch processes, such as anisotropic dry etch processes. The etch processes may include a dry etch process using reaction gas(es) that selectively etch the dummy gates 76 (at a faster rate than the first ILD 96, the CESL 94, or the first spacers 81). Each of the second recess 98 exposes and/or overlies portions of nanostructures 55, which act as channel regions in subsequently completed nanostructure FETs. The portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16A:
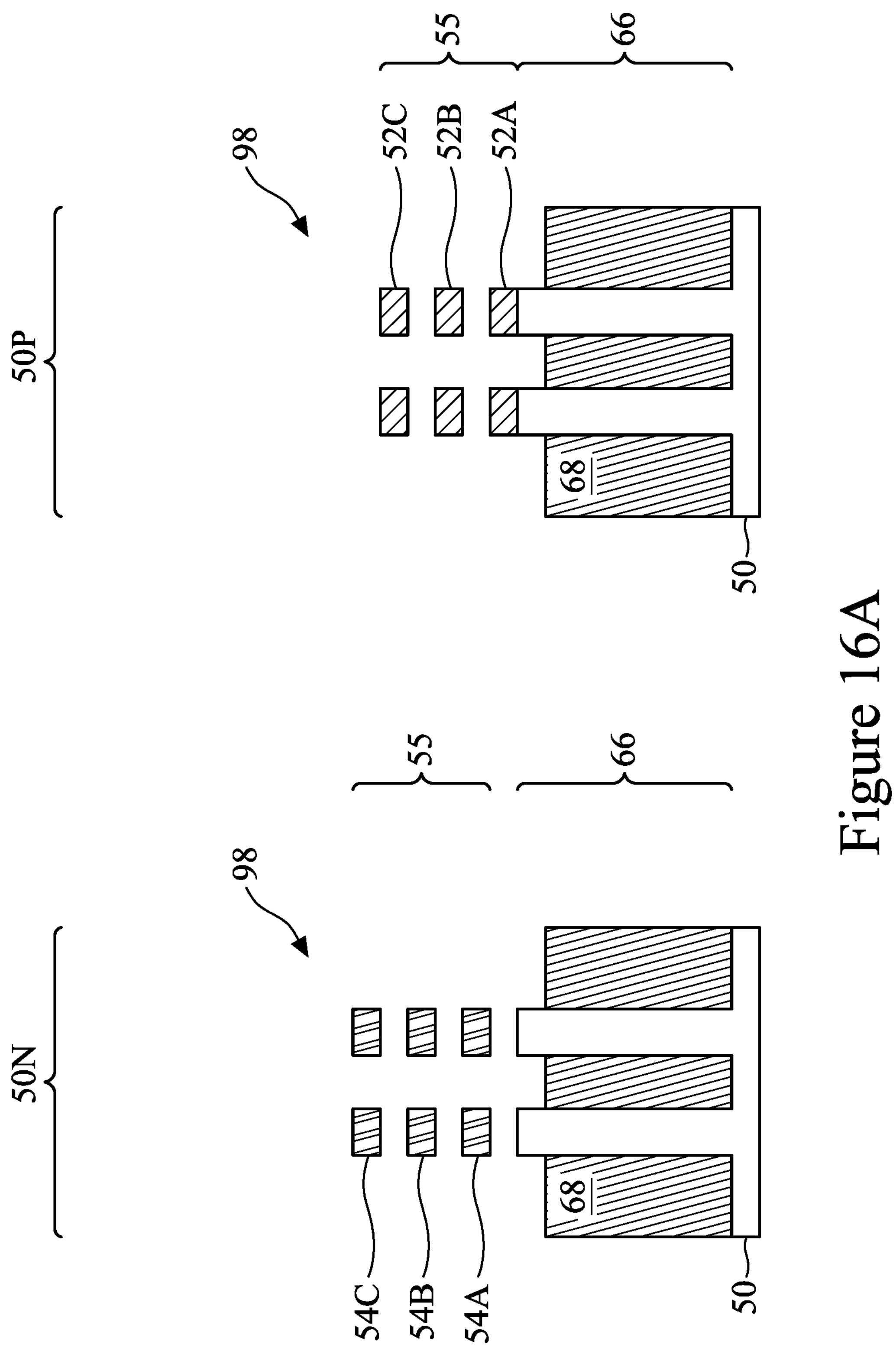
Figure 16B:
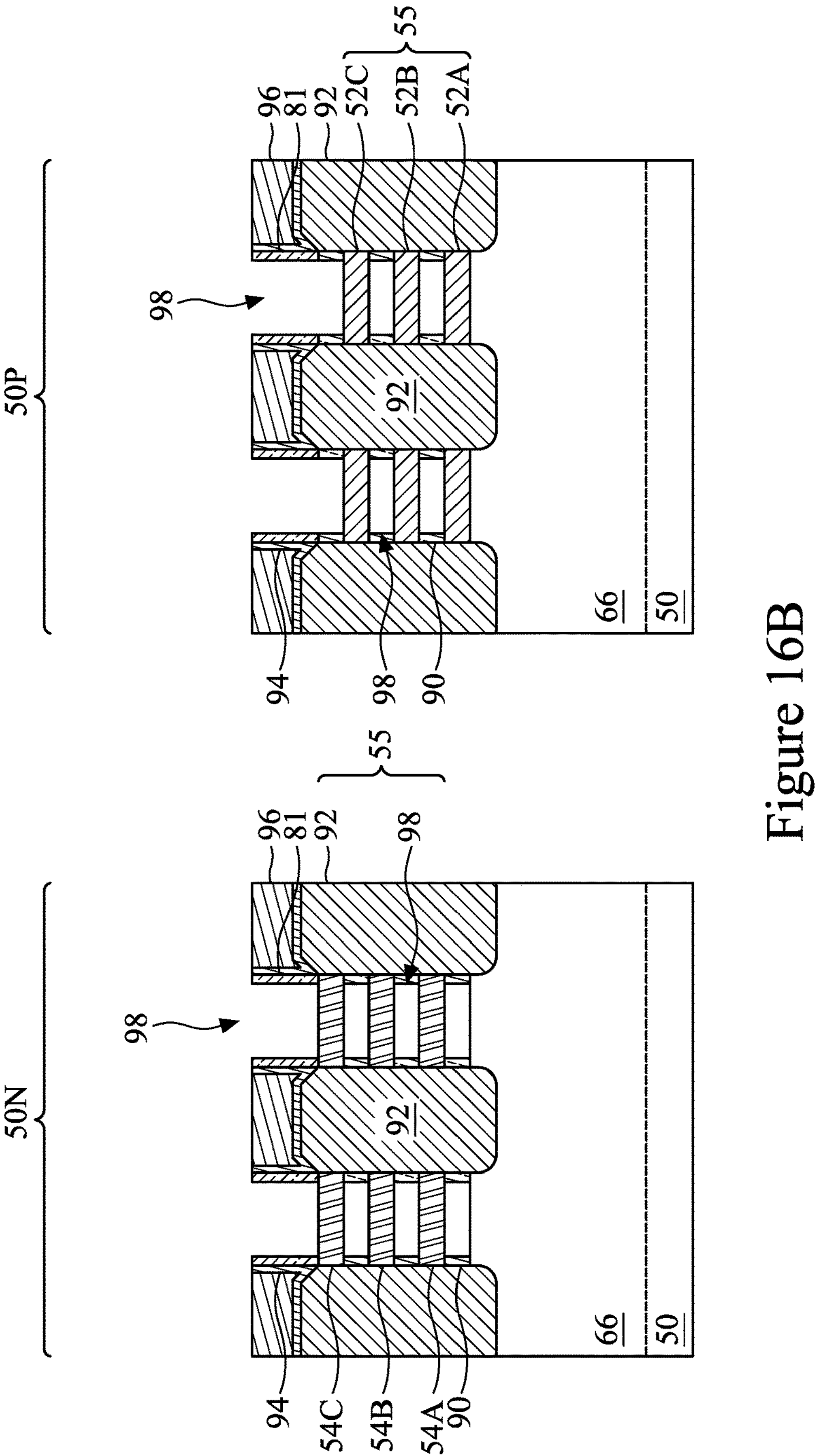

In FIGS. 16A and 16B, the first nanostructures 52 in the n-type region 50N and the second nanostructures 54 in the p-type region 50P are removed extending the second recesses 98. The first nanostructures 52 may be removed by forming a mask (not separately illustrated) over the p-type region 50P and performing an isotropic etching process, such as wet etching or the like, using etchants which are selective to the materials of the first nanostructures 52. The second nanostructures 54, the fins 66, the substrate 50, the STI regions 68, the first ILD 96, and the CESL 94 remain relatively un-etched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not separately illustrated) over the n-type region 50N and performing an isotropic etching process such as wet etching or the like using etchants which are selective to the materials of the second nanostructures 54. The first nanostructures 52, the fins 66, the substrate 50, the STI regions 68, the first ILD 96, and the CESL 94 remain relatively un-etched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously. For example, the first nanostructures 52 in both the n-type region 50N and the p-type region 50P may be removed, or the second nanostructures 54 in both the n-type region 50N and the p-type region 50P may be removed. In such embodiments, channel regions of n-type nanostructure FETs and p-type nanostructure FETS may have a same material composition, such as silicon, silicon germanium, or the like.

Figure 17A:
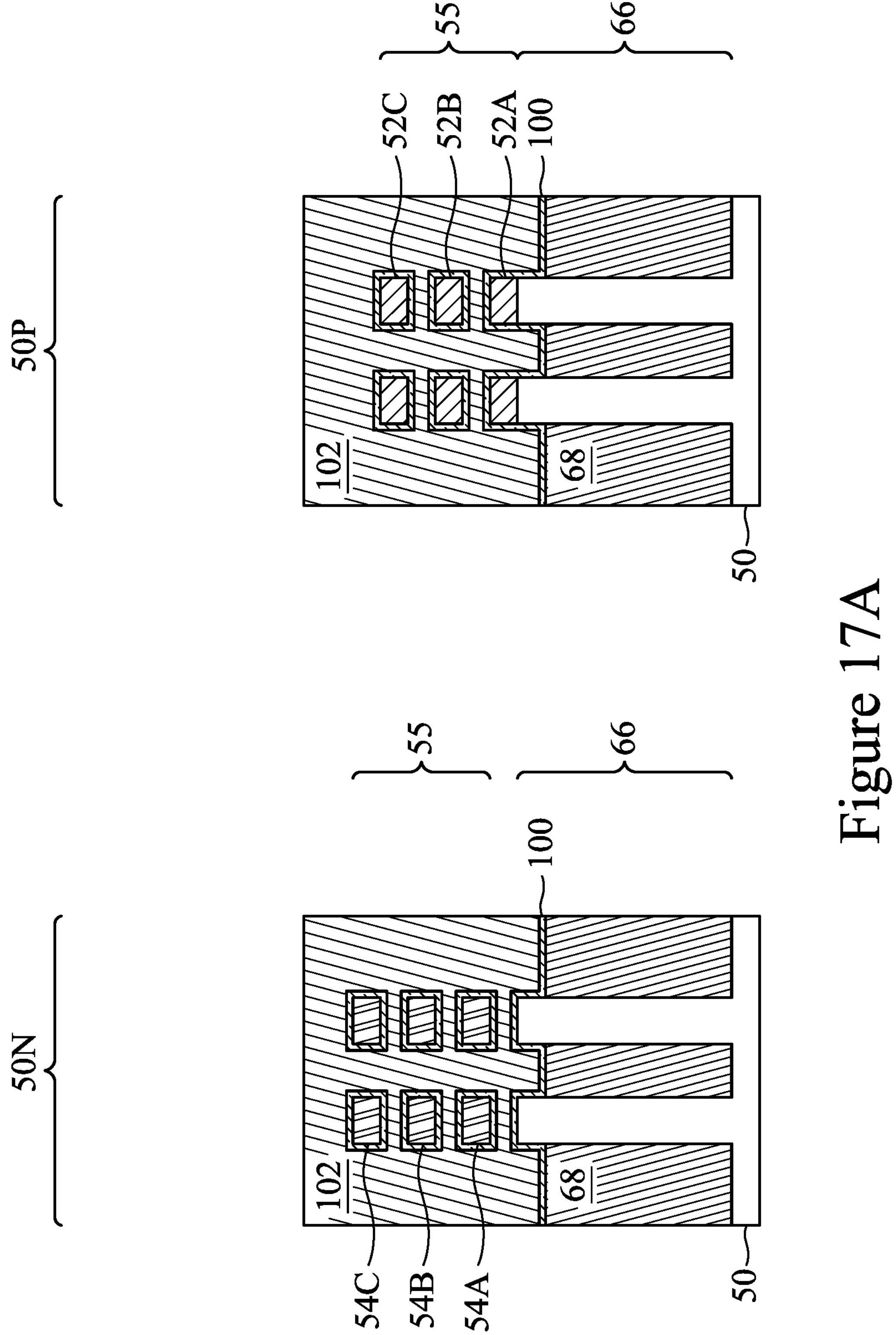
Figure 17B:
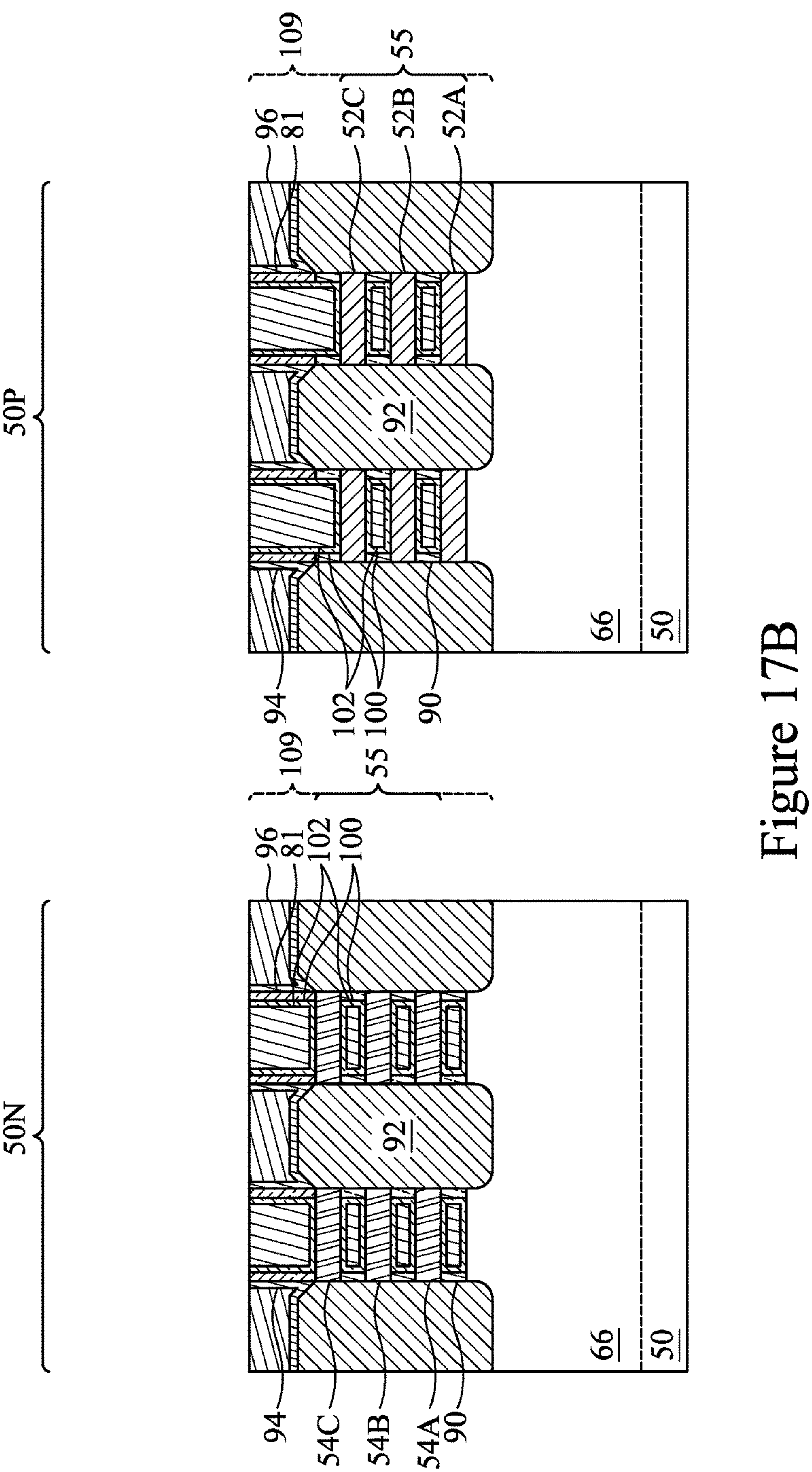

In FIGS. 17A and 17B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the fins 66 and on top surfaces, sidewalls, and bottom surfaces of the second nanostructures 54. In the p-type region 50P, the gate dielectric layers 100 may be formed on top surfaces and sidewalls of the fins 66, on top surfaces and sidewalls of the first nanostructures 52A, and on top surfaces, sidewalls, and bottom surfaces of the first nanostructures 52B and 52C. The gate dielectric layers 100 may also be deposited on top surfaces of the first ILD 96, the CESL 94, and the STI regions 68; on top surfaces and sidewalls of the first spacers 81; and on sidewalls of the first inner spacers 90.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k-value greater than about 7.0. The gate dielectric layers 100 may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. Although single layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructures 54A and the fins 66. Further, any combination of the layers which make up the gate electrodes 102 may be deposited in the p-type region 50P between adjacent ones of the first nanostructures 52.

The formation of the gate dielectric layers 100 in the n-type region 50N and the p-type region 50P may occur simultaneously, such that the gate dielectric layers 100 in each region are formed from the same materials. In some embodiments, the gate dielectric layers 100 in each region may be formed by distinct processes, such that the gate dielectric layers 100 may be different materials and/or have a different number of layers. The formation of the gate electrodes 102 in the n-type region 50N and the p-type region 50P may occur simultaneously such that the gate electrodes 102 in each region are formed from the same materials. The gate electrodes 102 in each region may be formed by distinct processes, such that the gate electrodes 102 may be different materials and/or have a different number of layers. Various masking steps may be used to mask and expose appropriate regions when using distinct processes.

After the second recesses 98 are filled, a planarization process, such as a CMP, may be performed to remove excess portions of the gate dielectric layers 100 and the material of the gate electrodes 102, which excess portions are over top surfaces of the first ILD 96, the CESL 94, and the first spacers 81. The remaining portions of material of the gate electrodes 102 and the gate dielectric layers 100 form replacement gate structures of the resulting nanostructure FETs. The gate electrodes 102 and the gate dielectric layers 100 may be collectively referred to as "gate structures." The epitaxial source/drain regions 92, the first nanostructures 52 or second nanostructures 54, and the gate structures (including the gate dielectric layers 100 and the gate electrodes 102) may collectively be referred to as transistor structures 109.

Figure 18A:
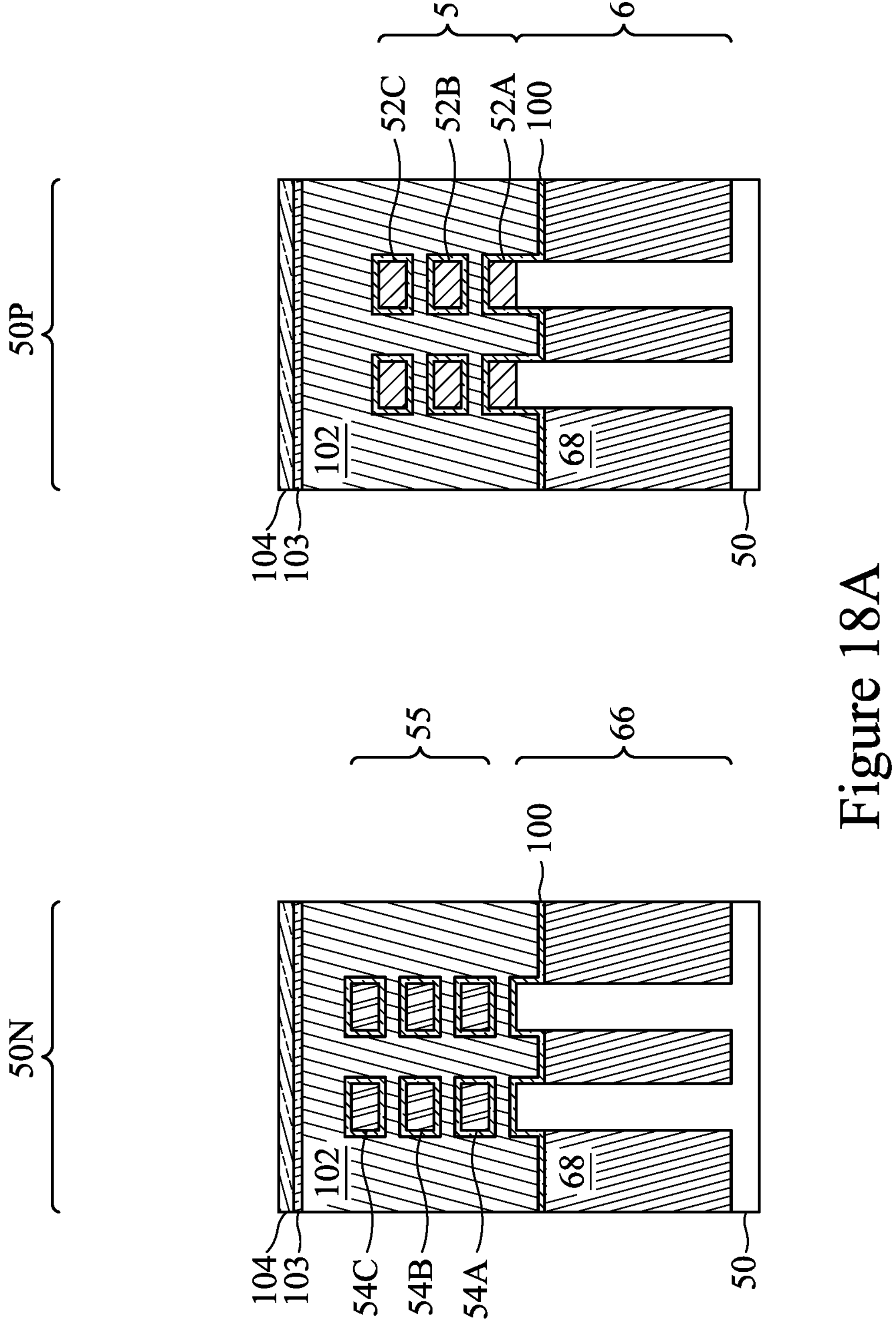
Figure 18B:
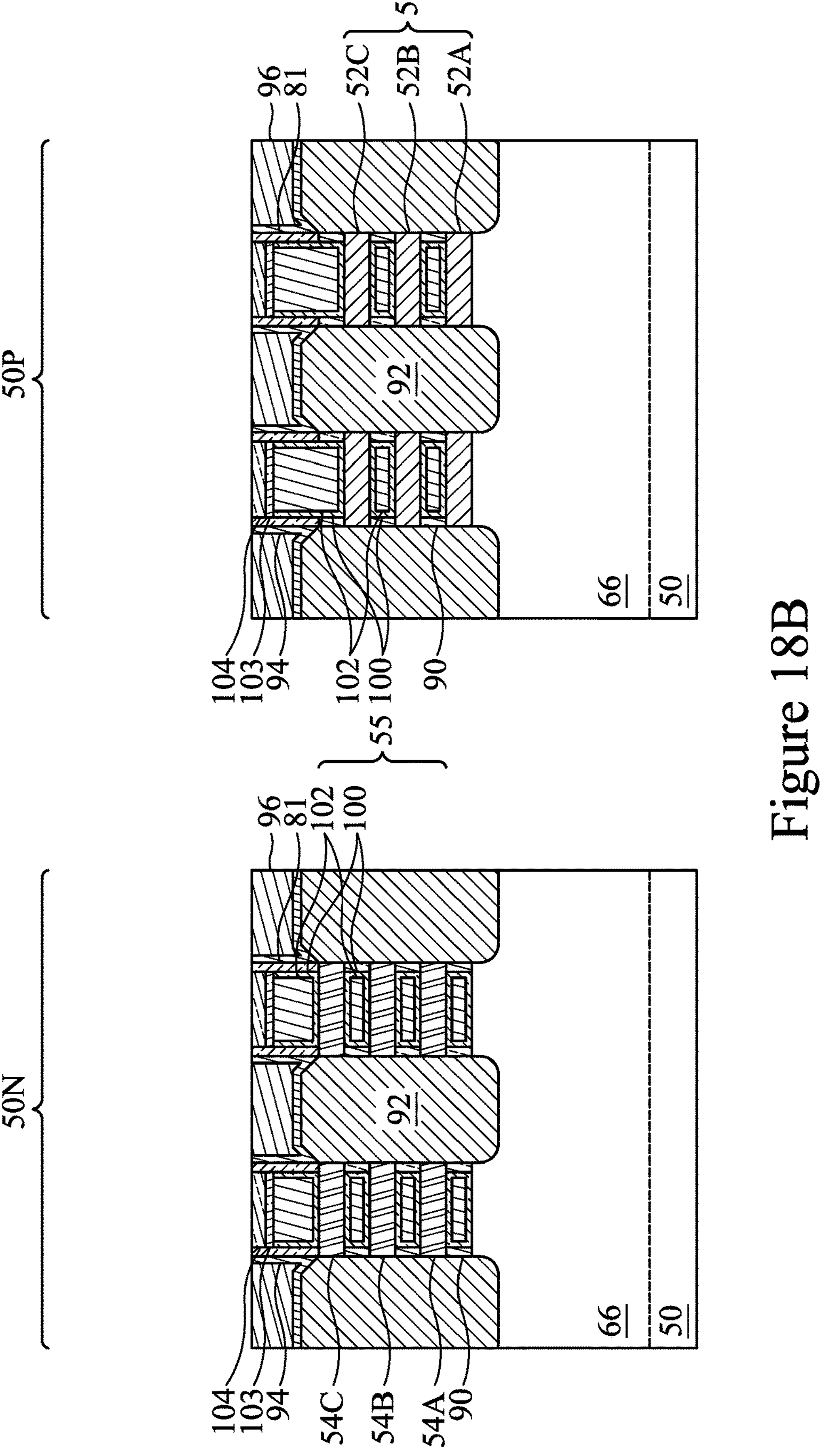

In FIGS. 18A and 18B, the gate structures (including the gate dielectric layers 100 and the corresponding overlying gate electrodes 102) are recessed, so that recesses are formed directly over the gate structures and between opposing portions of first spacers 81. An etch stop layer 103 may be deposited over the recessed gate structures. The etch stop layer 103 may include a conductive material, such as tungsten, ruthenium, cobalt, copper, molybdenum, nickel, combinations thereof, or the like. The etch stop layer 103 may have an etch rate different from that of a subsequently formed gate mask. The etch stop layer 103 may be deposited by ALD, CVD, PVD, or the like. In some embodiments, the etch stop layer 103 is formed of tungsten, such as fluorine-free tungsten (FFW), which is deposited by a selective deposition process, such as a selective CVD process. Because the etch stop layer 103 is formed of a conductive material, it can act to stop etching, and can also be used to tune the contact resistance to the gate structures. In some embodiments, the etch stop layer 103 may include a dielectric material, such as silicon nitride, silicon oxide, silicon oxynitride, or the like.

A gate mask 104 comprising one or more layers of dielectric material, such as silicon nitride, silicon oxynitride, or the like, is deposited over the etch stop layer 103 and fills the remainder of the recess. The deposition of the gate mask 104 may be followed by a planarization process to remove excess portions of the dielectric material, such as portions of the gate mask 104 extending over the first ILD 96, the CESL 94, and the first spacers 81. Subsequently formed gate contacts (such as the gate contacts 118 and the butted contacts 120, discussed below with respect to FIGS. 22A through 22C) penetrate through the gate mask 104 to contact top surfaces of the recessed etch stop layer 103.

In FIGS. 19A through 19E, silicide regions 106 and first source/drain contacts 108 are formed through the first ILD 96 and the CESL 94. The first ILD 96 and the CESL 94 may be etched to form recesses exposing surfaces of the epitaxial source/drain regions 92. The recesses may be formed by etching using anisotropic etch processes, such as RIE, NBE, or the like. In some embodiments, the recesses may be etched through the first ILD 96 using a first etch process and may then be etched through the CESL 94 using a second etch process. A mask, such as a photoresist, may be formed and patterned over the first ILD 96 to mask portions of the first ILD 96, the CESL 94, the first spacers 81, and the gate mask 104 from the first etch process and the second etch process. In some embodiments, the etch processes may over-etch, and therefore, the recesses may extend into the epitaxial source/drain regions 92. Bottom surfaces of the recesses may be level with (e.g., at a same level, or having a same distance from the substrate 50), or lower than (e.g., closer to the substrate 50) top surfaces of the epitaxial source/drain regions 92.

After the recesses are formed, the silicide regions 106 may be formed over the epitaxial source/drain regions 92. In some embodiments, the silicide regions 106 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions, such as nickel, cobalt, titanium, tantalum, platinum, tungsten, other noble metals, other refractory metals, rare earth metals or their alloys, over the exposed portions of the epitaxial source/drain regions 92. A thermal anneal process may then be performed to form the silicide regions 106. Un-reacted portions of the deposited metal are removed by an etch process. Although referred to as silicide regions, the silicide regions 106 may be replaced by germanide regions, silicon germanide regions (e.g., regions comprising silicide and germanide), or the like. In an embodiment, the silicide regions 106 comprise TiSi, and have a thickness ranging from about 2 nm to about 10 nm.

The first source/drain contacts 108 are then formed over the silicide regions 106 and filling the recesses. The first source/drain contacts 108 may each comprise one or more layers, such as barrier layers, diffusion layers, and fill materials. For example, in some embodiments, the first source/drain contacts 108 each include a barrier layer and a conductive material over the barrier layer. The conductive material of each of the first source/drain contacts 108 may be electrically coupled to the underlying epitaxial source/drain regions 92 through the silicide regions 106. The barrier layer may include titanium, titanium nitride, tantalum, tantalum nitride, or the like. The conductive material may be cobalt (Co), ruthenium (Ru), titanium (Ti), tungsten (W), copper (Cu), a copper alloy, silver (Ag), gold (Au), aluminum (Al), nickel (Ni), or the like. After the first source/drain contacts 108 are formed, a planarization process, such as a CMP, may be performed to remove excess material from surfaces of the first ILD 96, the CESL 94, the first spacers 81, and the gate mask 104.

Figure 19A:
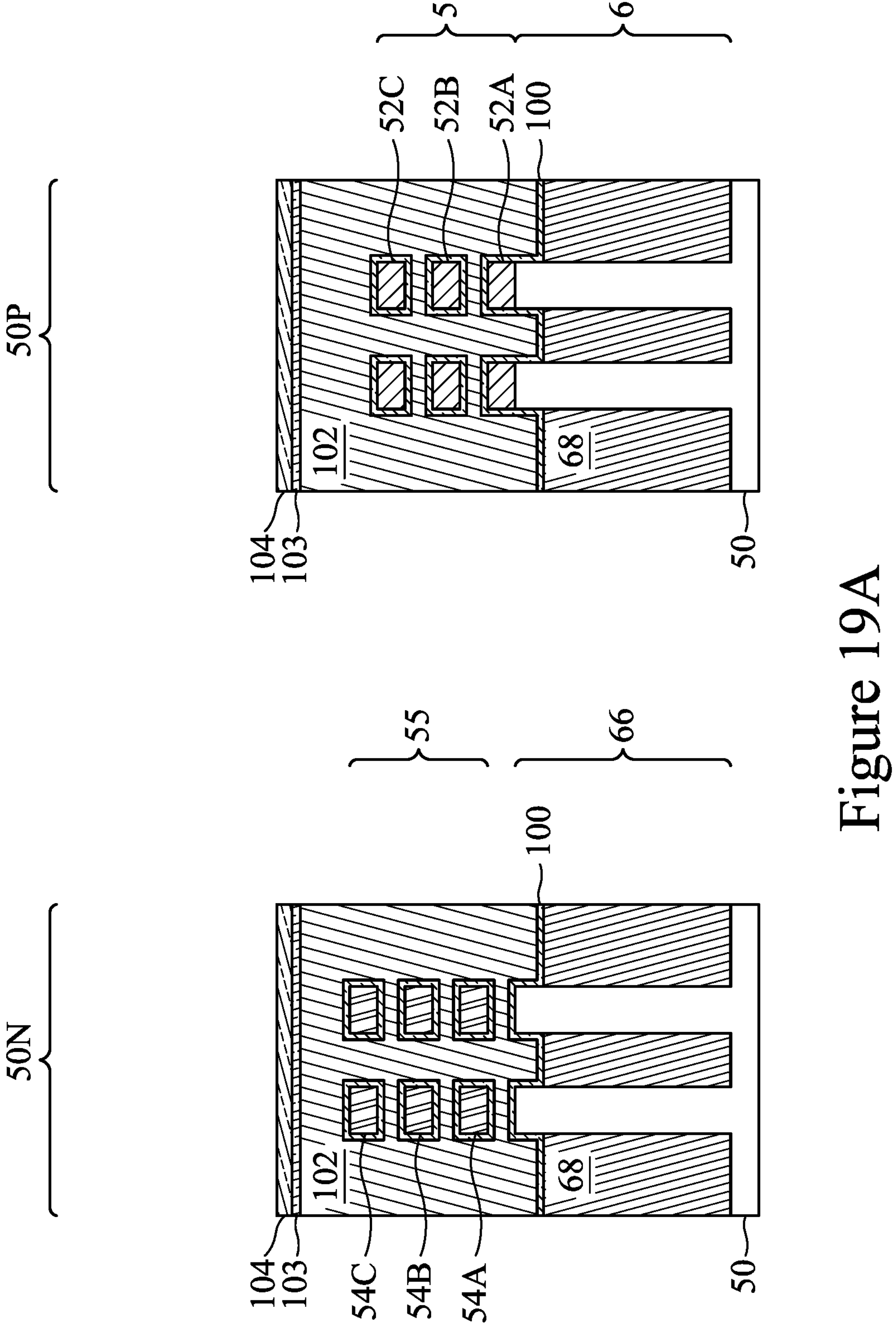
Figure 19B:
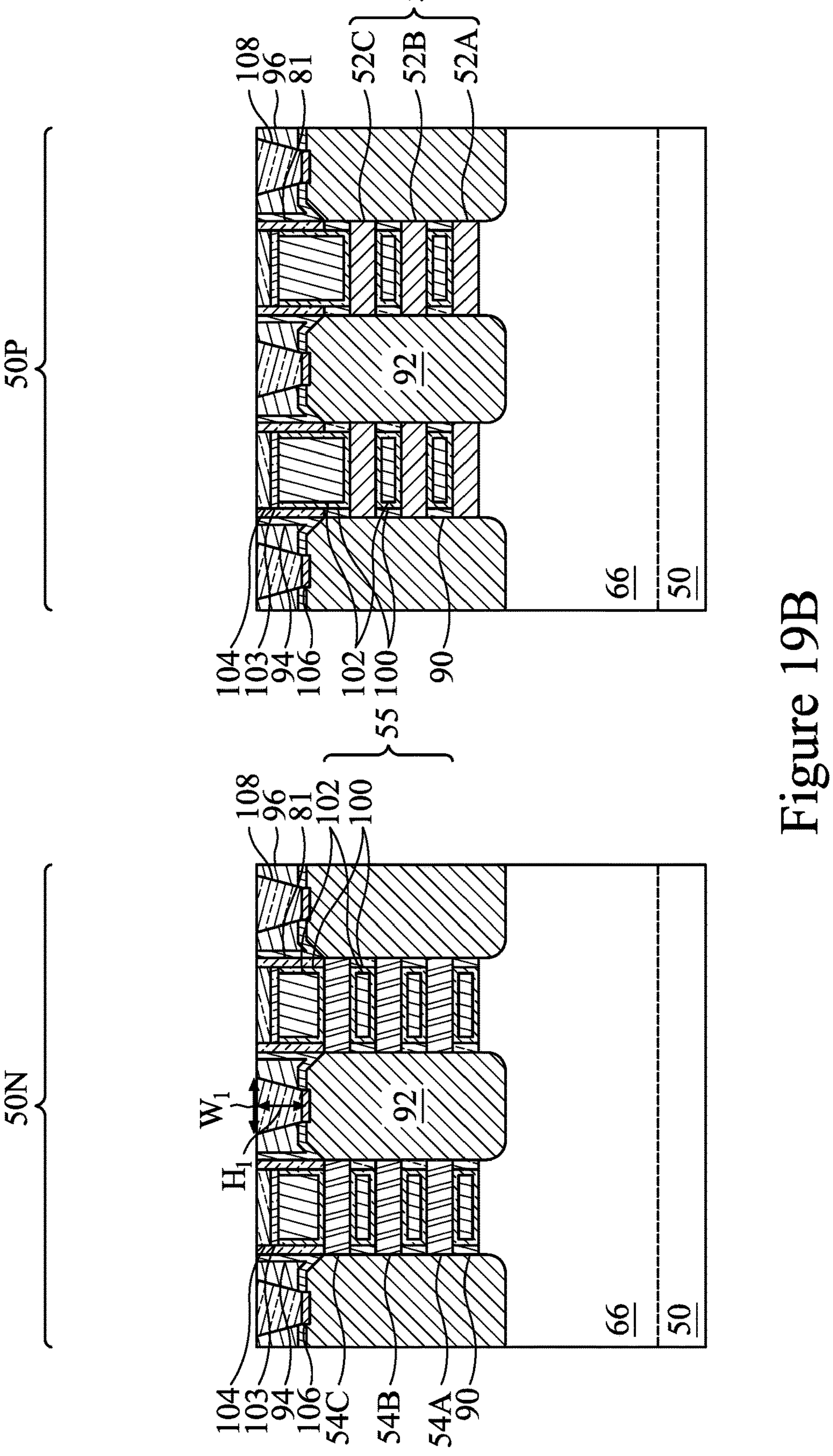

FIGS. 19B through 19E illustrate the first source/drain contacts 108, in accordance with various embodiments. As illustrated in FIG. 19B, following the planarization process, top surfaces of the first source/drain contacts 108 may be level with top surfaces of the first ILD 96, the CESL 94, the first spacers 81, and the gate mask 104. In the embodiment illustrated in FIG. 19B, the first source/drain contacts 108 may have heights $H_1$ ranging from about 28 nm to about 33 nm and widths $W_1$ ranging from about 14 nm to about 16 nm. A ratio of the heights $H_1$ of the first source/drain contacts 108 to the heights $H_{14}$ of the epitaxial source/drain regions 92 may range from about 0.2 to about 2 or from about 0.2 to about 5.

Figure 19C:
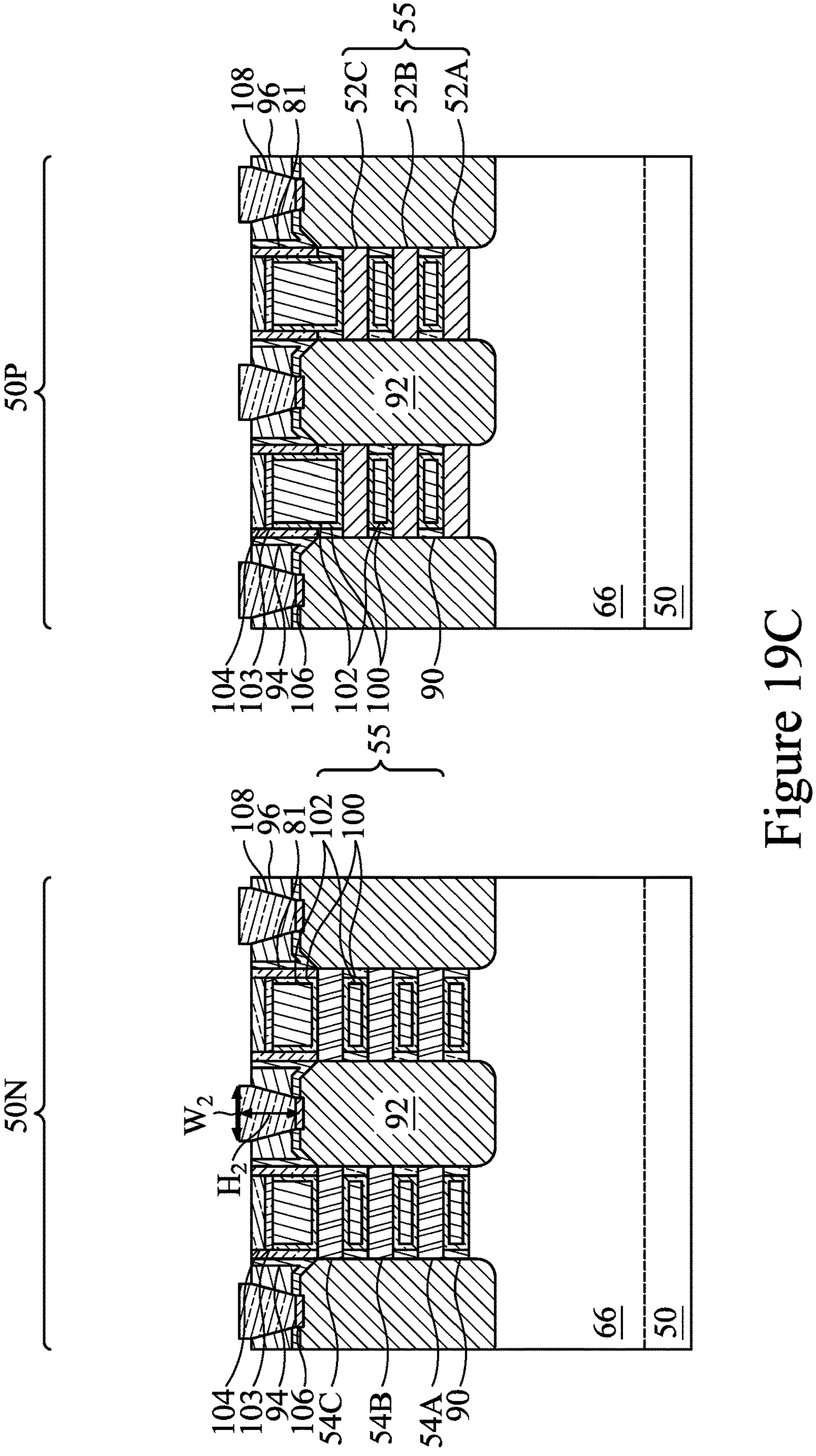
Figure 19D:
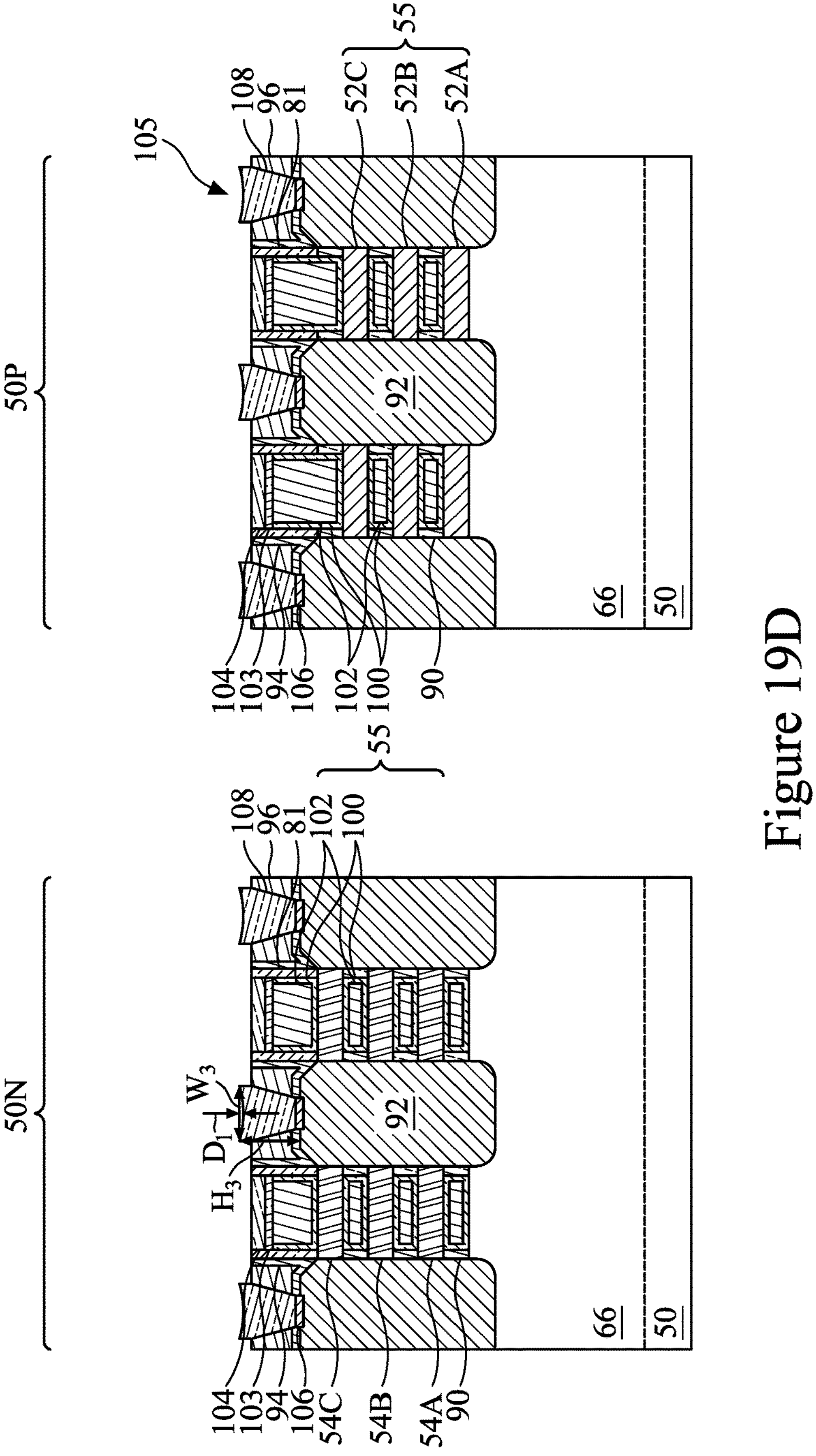
Figure 19E:
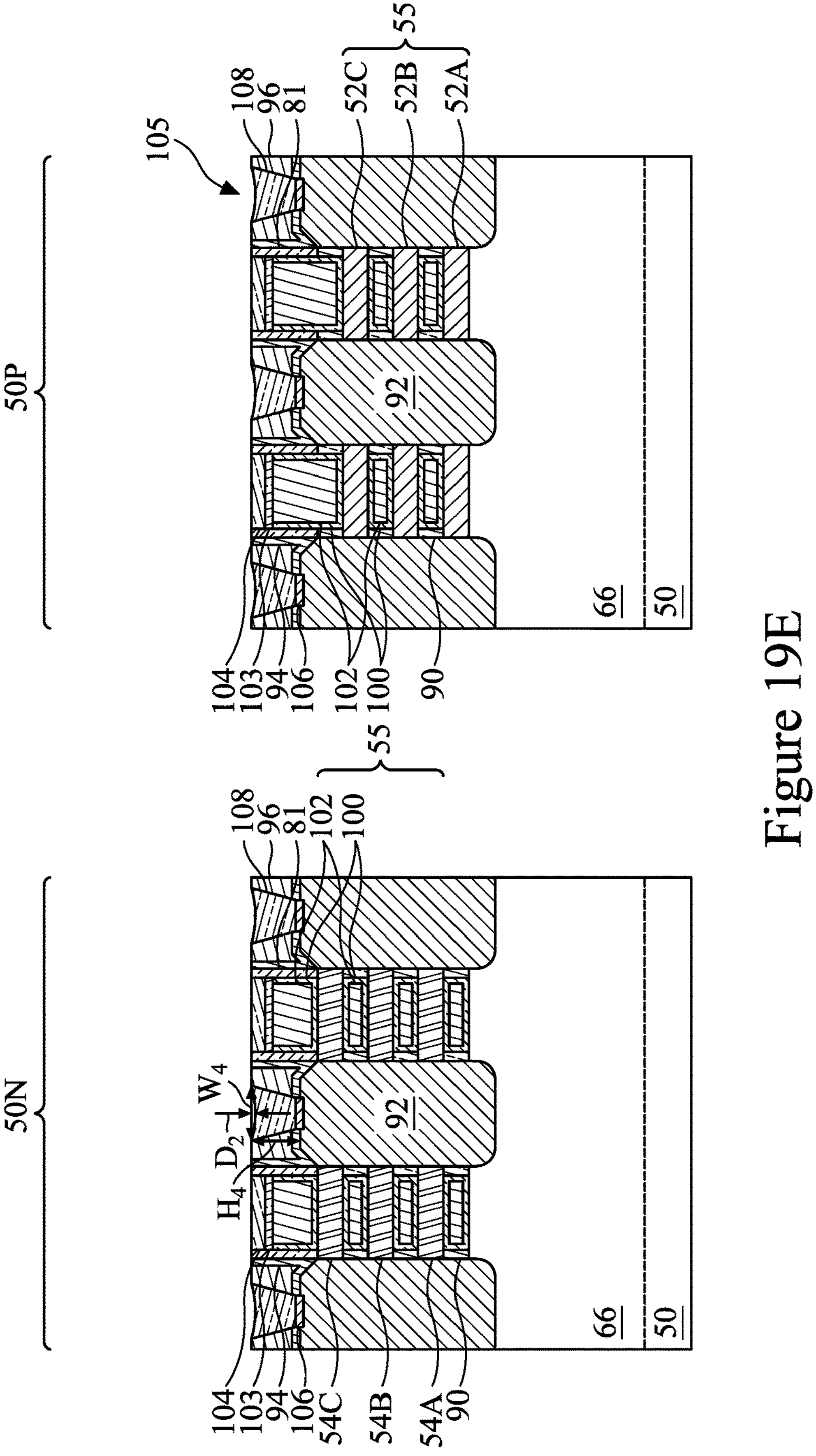

As illustrated in FIGS. 19C through 19E, a collective top surface of the first source/drain contacts 108, the first ILD 96, the CESL 94, the first spacers 81, and the gate mask 104 may be non-planar following the planarization process. For example, due to various process factors between the first source/drain contacts 108, the first ILD 96, the CESL 94, the first spacers 81, and the gate mask 104, such as a pattern-loading effect, differences between etching rates, differences between mechanical polishing rates, differences in reactions to a slurry, and the like, the planarization process may generate a non-planar top surface, as illustrated in FIGS. 19C through 19E. FIG. 19C illustrates an embodiment in which top surfaces of the first source/drain contacts 108 are disposed above top surfaces of the first ILD 96, the CESL 94, the first spacers 81, and the gate mask 104. In the embodiment illustrated in FIG. 19C, the first source/drain contacts 108 may have heights $H_2$ ranging from about 31 nm to about 36 nm and widths $W_2$ ranging from about 14 nm to about 16 nm. A ratio of the heights $H_2$ of the first source/drain contacts 108 to the heights $H_{14}$ of the epitaxial source/drain regions 92 may range from about 0.25 to about 2.

A dishing effect may also occur during the planarization process, resulting in depressions 105 being formed in the top surfaces of the first source/drain contacts 108, as illustrated in FIGS. 19D and 19E. FIG. 19D illustrates an embodiment in which top surfaces of the first source/drain contacts 108 are disposed above top surfaces of the first ILD 96, the CESL 94, the first spacers 81, and the gate mask 104 and the dishing effect occurs such that depressions 105 are formed in the top surfaces of the first source/drain contacts 108. In the embodiment illustrated in FIG. 19D, the first source/drain contacts 108 may have heights $H_3$ ranging from about 31 nm to about 33 nm, widths $W_3$ ranging from about 14 nm to about 16 nm, and the depressions 105 may have depths $D_1$ ranging from about 0 nm to about 2 nm. A ratio of the heights $H_3$ of the first source/drain contacts 108 to the heights $H_{14}$ of the epitaxial source/drain regions 92 may range from about 0.2 to about 2. FIG. 19E illustrates an embodiment in which portions of top surfaces of the first source/drain contacts 108 are disposed at the same level as top surfaces of the first ILD 96, the CESL 94, the first spacers 81, and the gate mask 104 and the dishing effect occurs such that depressions 105 are formed in the top surfaces of the first source/drain contacts 108. In the embodiment illustrated in FIG. 19E, the first source/drain contacts 108 may have heights $H_4$ ranging from about 30 nm to about 33 nm, widths $W_4$ ranging from about 14 nm to about 16 nm, and the depressions 105 may have depths $D_2$ ranging from about 0 nm to about 2 nm. A ratio of the heights $H_4$ of the first source/drain contacts 108 to the heights $H_{14}$ of the epitaxial source/drain regions 92 may range from about ⅙ to about 2.

In FIGS. 20A through 20E, an anneal process is performed on the first source/drain contacts 108. The anneal process may be performed at a temperature greater than about 100° C., a temperature ranging from about 20° C. to about 500° C., or the like; a pressure ranging from about 1 Torr to about 50 Torr; and for a duration ranging from about 10 seconds to about 100 seconds. In some embodiments, the anneal process may be performed in an atmosphere which may include a reducing agent and inert gases. For example, the anneal process may be performed in an atmosphere, which may include hydrogen ($H_2$), a mixture of hydrogen and argon (Ar), a mixture of nitrogen ($N_2$) and hydrogen, argon, a mixture of hydrogen and helium (He), air, a vacuum, combinations thereof, or the like. In some embodiments, hydrogen gas may be supplied to a chamber in which the anneal process is performed at a flowrate ranging from about 500 sccm to about 5,000 sccm. The anneal process may be performed in situ (e.g., in a process chamber used to form the first source/drain contacts 108) or ex situ (e.g., in a process chamber separate from the process chamber used to form the first source/drain contacts 108).

Figure 20A:
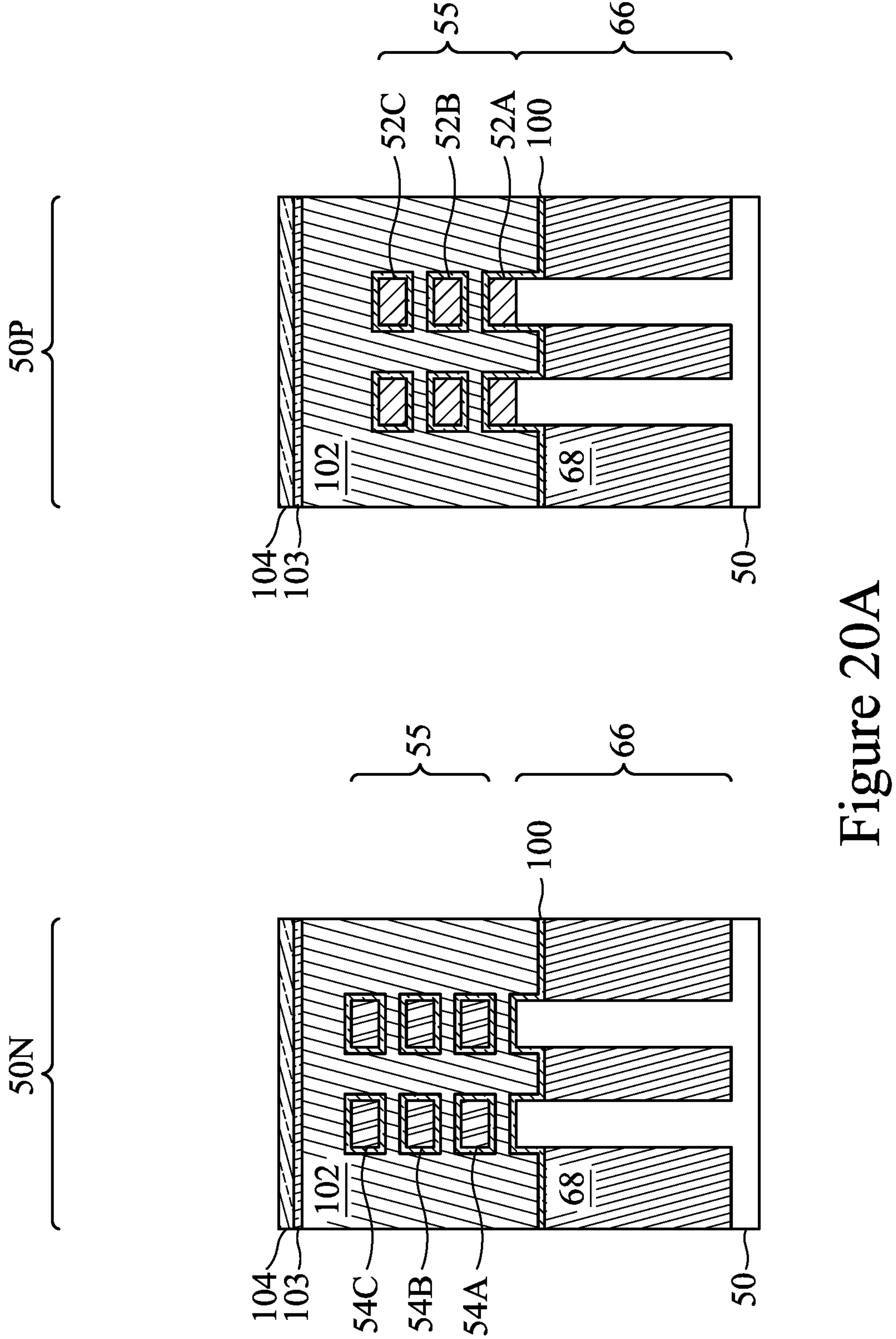
Figure 20B:
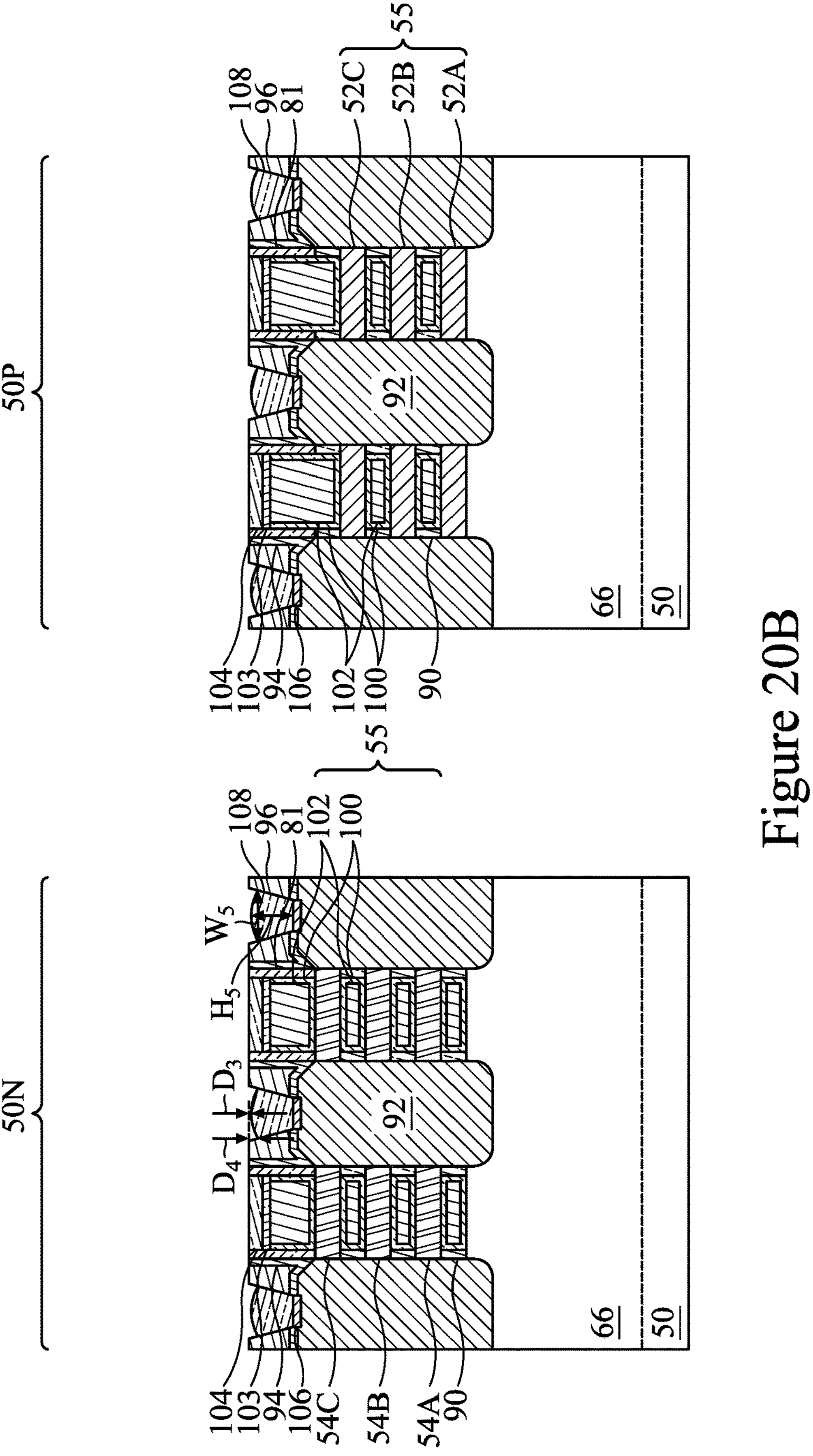
Figure 20C:
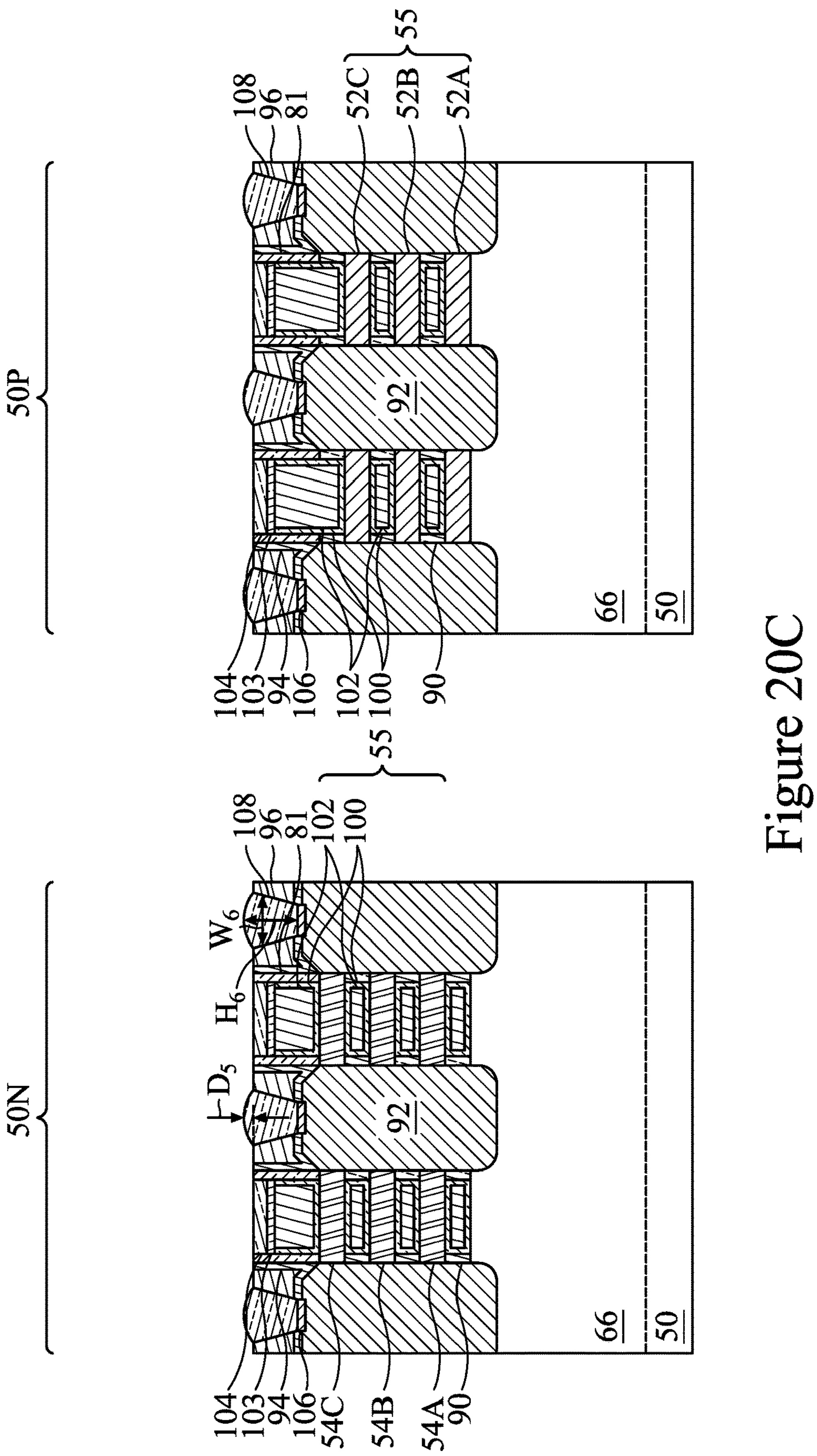

The anneal process may restructure the first source/drain contacts 108. More specifically, the anneal process may cause a recrystallization in the first source/drain contacts 108, which may reduce the resistance of the first source/drain contacts 108 and improve device performance. The recrystallization of the first source/drain contacts 108 may cause the volume of the first source/drain contacts 108 to shrink, and may also result in the first source/drain contacts 108 having convex top surfaces, as illustrated in FIGS. 20B and 20C. The convex shape of the top surfaces of the first source/drain contacts 108 may be a result of cohesion within the materials of the first source/drain contacts 108. Forming the first source/drain contacts 108 with convex surfaces may increase a contact area between the first source/drain contacts 108 and subsequently formed source/drain contacts (such as the second source/drain contacts 116 and the butted contacts 120, discussed below with respect to FIGS. 22A through 22C), which further reduces contact resistance and improves device performance. In some embodiments, performing the anneal process on the first source/drain contacts 108 may reduce heights of the first source/drain contacts 108 from about 1% to about 60% or from about 1% to about 30% compared to heights of the first source/drain contacts 108 prior to performing the anneal process.

FIG. 20B illustrates the first source/drain contacts 108 of FIG. 19B after performing the anneal process. As illustrated in FIG. 20B, following the anneal process, top extents of top surfaces of the first source/drain contacts 108 may be disposed a distance $D_3$ below top surfaces of the first ILD 96, the CESL 94, the first spacers 81, and the gate mask 104 ranging from about 2 nm to about 3 nm; bottom extents of the top surfaces of the first source/drain contacts 108 may be disposed a distance $D_4$ below top surfaces of the first ILD 96, the CESL 94, the first spacers 81, and the gate mask 104 ranging from about 3 nm to about 6 nm; the first source/drain contacts 108 may have heights $H_5$ ranging from about 25 nm to about 30 nm, and the first source/drain contacts 108 may have widths $W_5$ ranging from about 14 nm to about 16 nm. A ratio of the heights $H_5$ of the first source/drain contacts 108 to the heights $H_{14}$ of the epitaxial source/drain regions 92 may range from about 0.2 to about 2. A ratio of the heights $H_5$ of the first source/drain contacts 108 to the heights $H_{15}$ of the first ILD 96 may range from about 0.5 to about 1.5. FIG. 20C illustrates the first source/drain contacts

108 of FIG. 19C after performing the anneal process. As illustrated in FIG. 20C, following the anneal process, top extents of top surfaces of the first source/drain contacts 108 may be disposed a distance $D_5$ above top surfaces of the first ILD 96, the CESL 94, the first spacers 81, and the gate mask 104 ranging from about 10 nm to about 25 nm; bottom extents of the top surfaces of the first source/drain contacts 108 may be level with top surfaces of the first ILD 96, the CESL 94, the first spacers 81, and the gate mask 104; the first source/drain contacts 108 may have heights $H_6$ ranging from about 28 nm to about 33 nm, and the first source/drain contacts 108 may have widths $W_6$ ranging from about 14 nm to about 16 nm. A ratio of the heights $H_6$ of the first source/drain contacts 108 to the heights $H_{14}$ of the epitaxial source/drain regions 92 may range from about 0.25 to about 2. A ratio of the heights $H_6$ of the first source/drain contacts 108 to the heights $H_{15}$ of the first ILD 96 may range from about 1 to about 1.5.

Figure 20D:
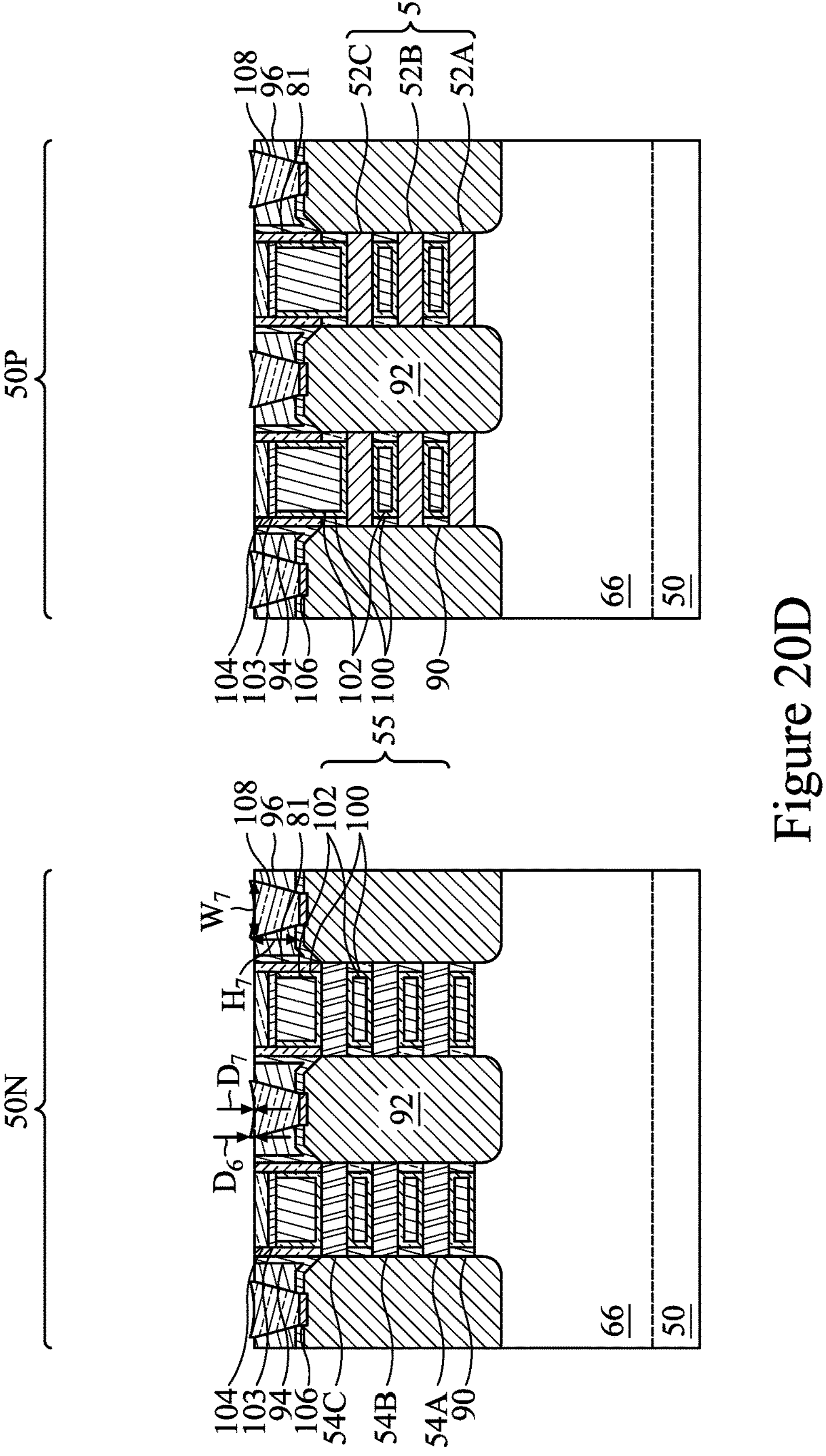
Figure 20E:
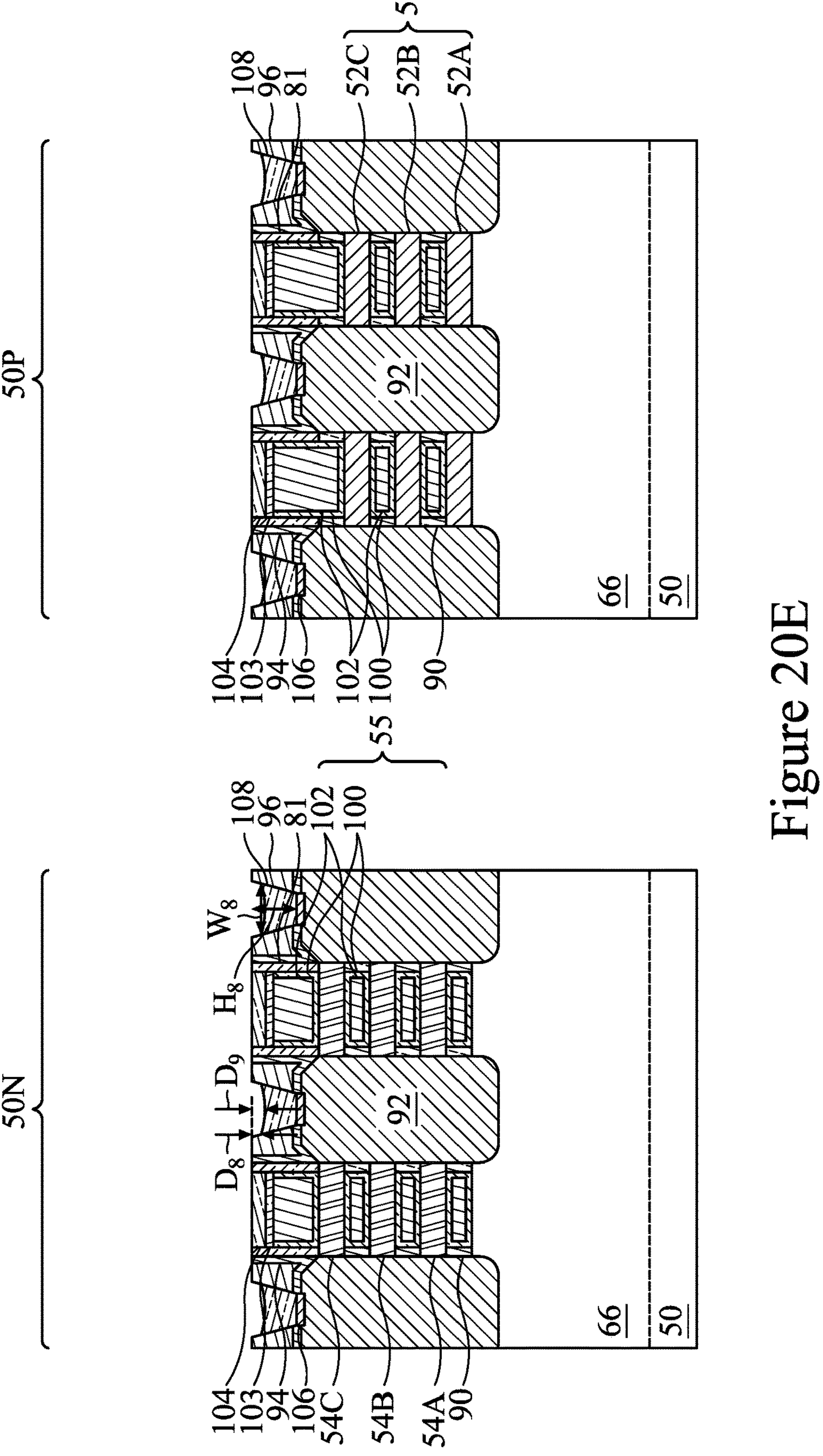
Figure 21A:
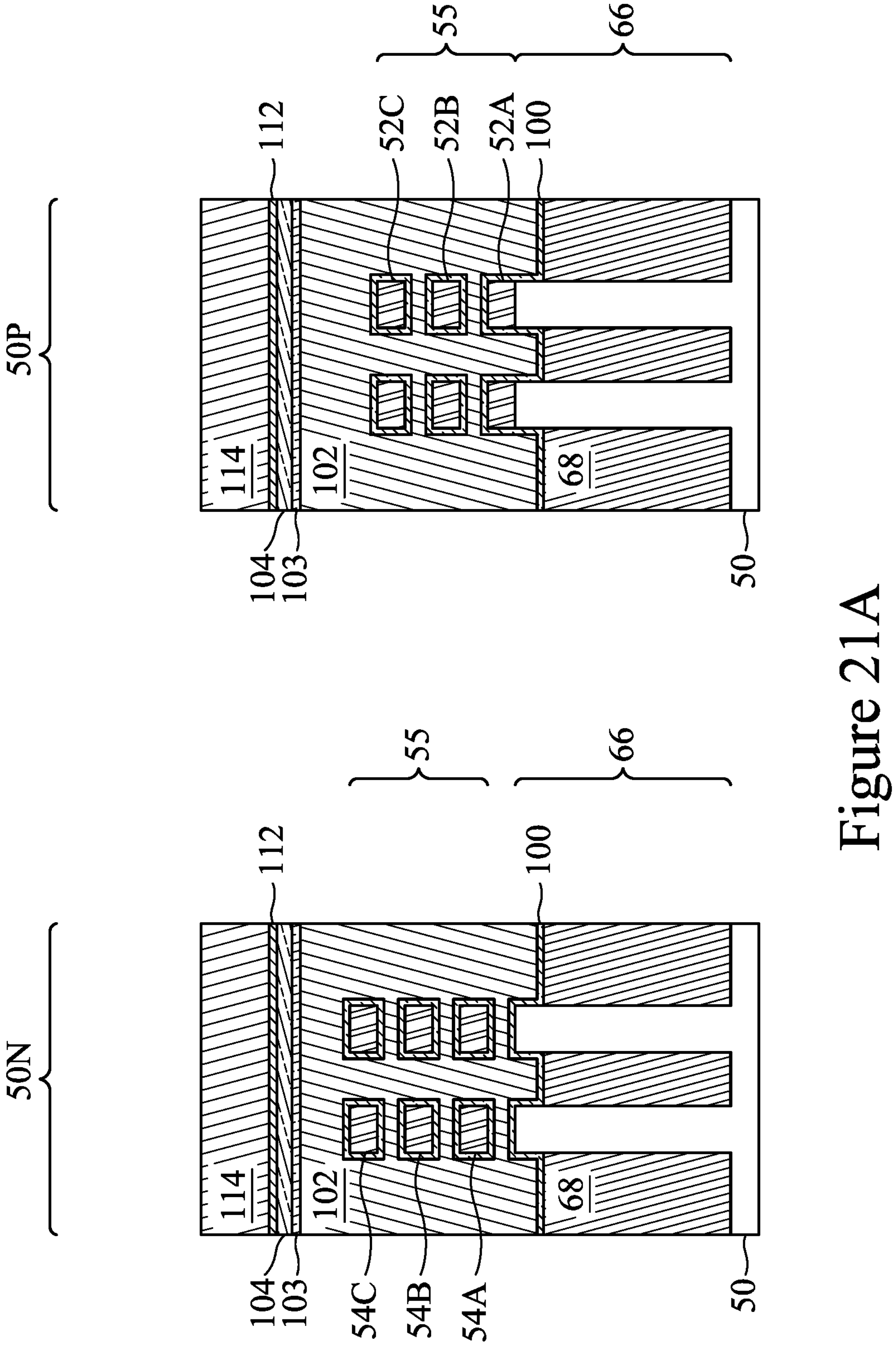
Figure 21B:
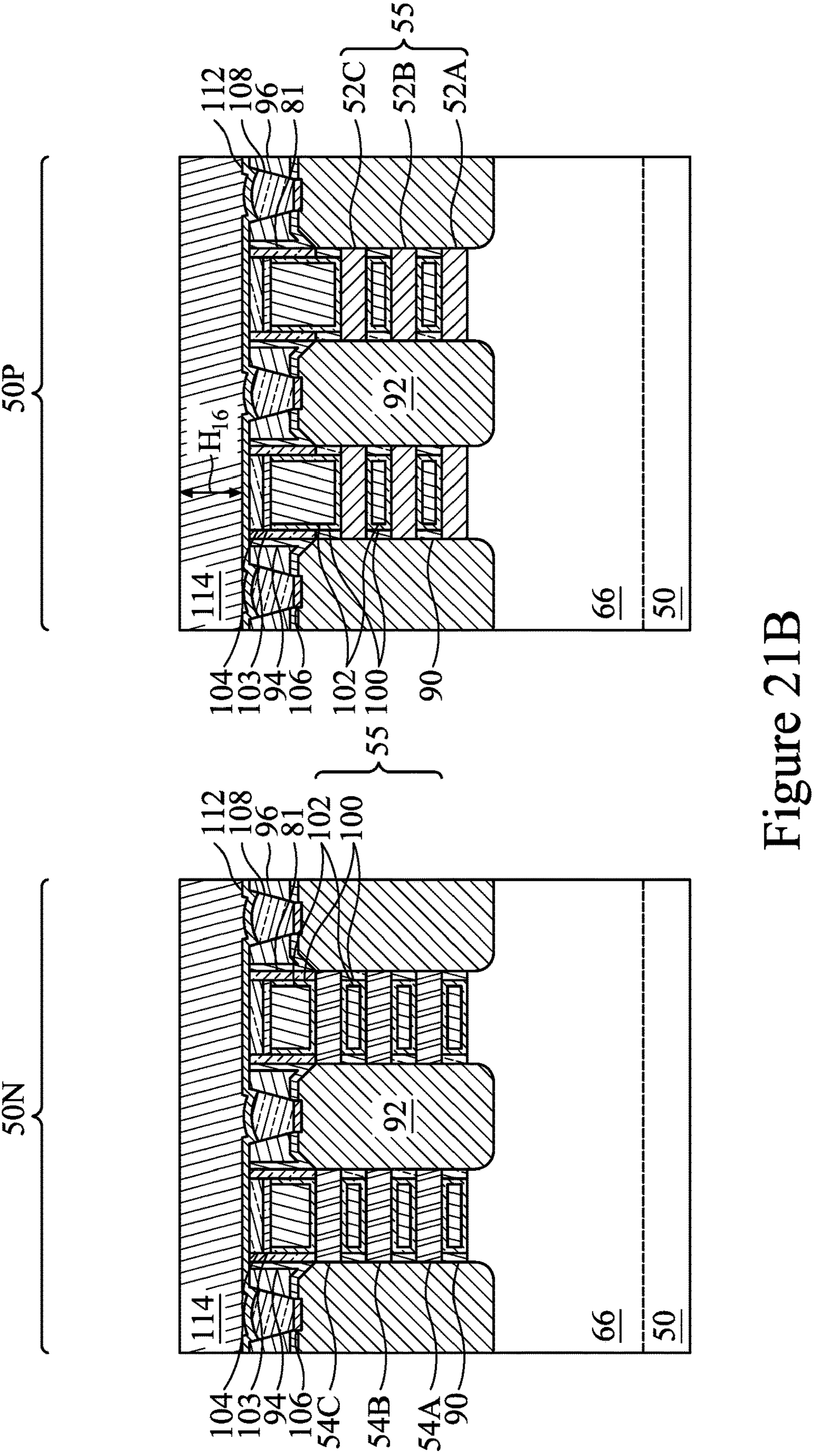
Figure 21C:
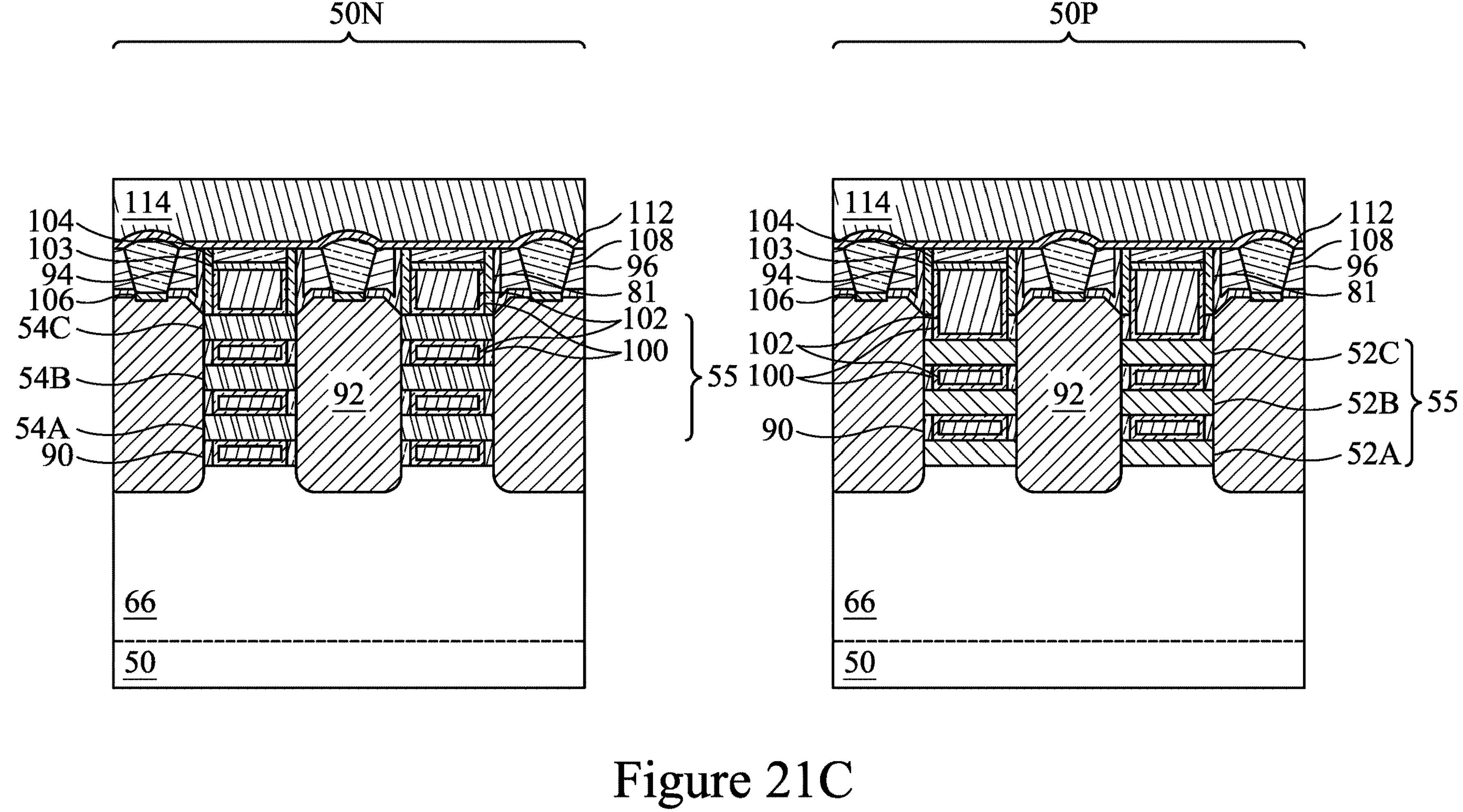
Figure 21D:
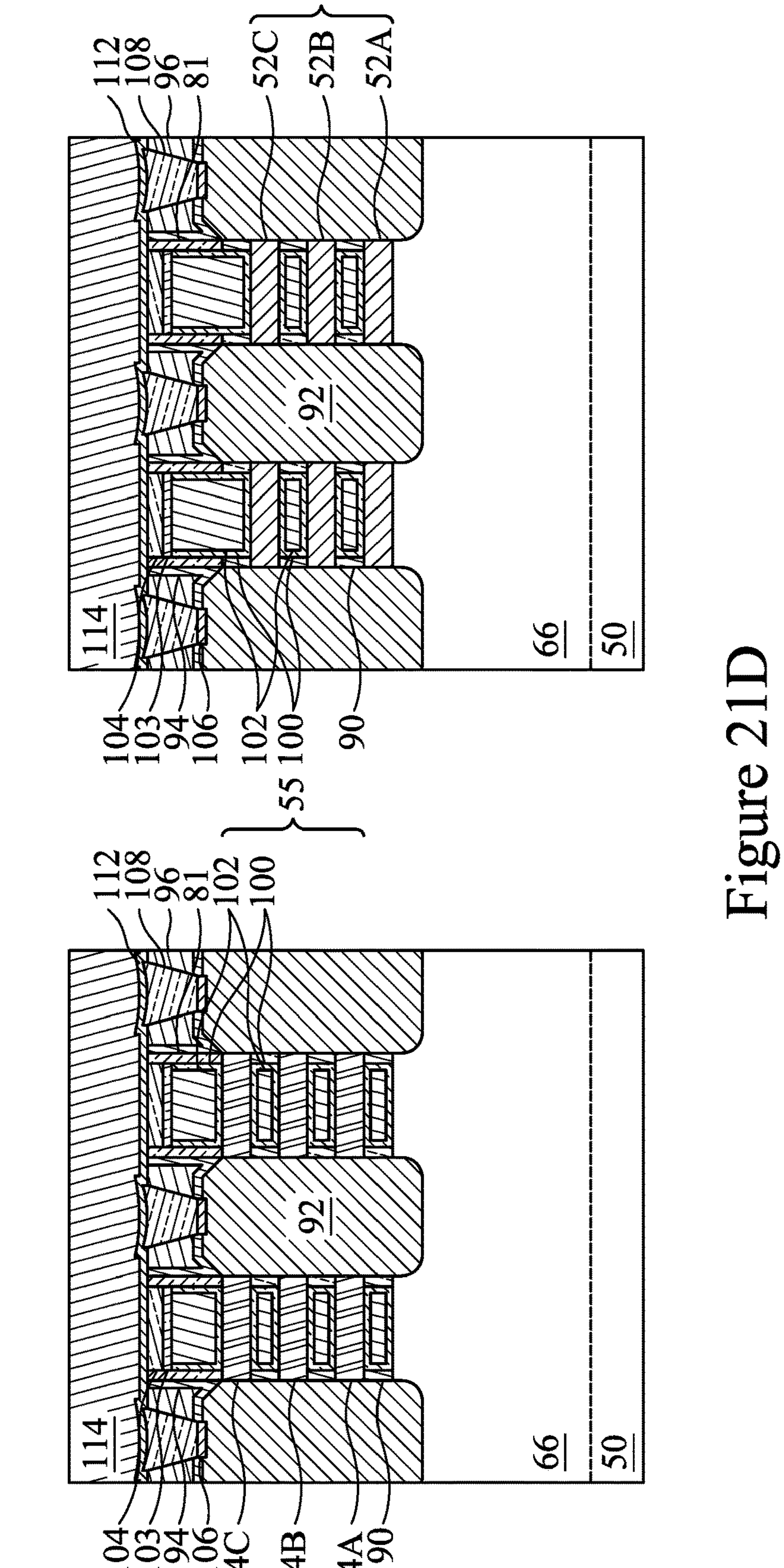
Figure 21E:
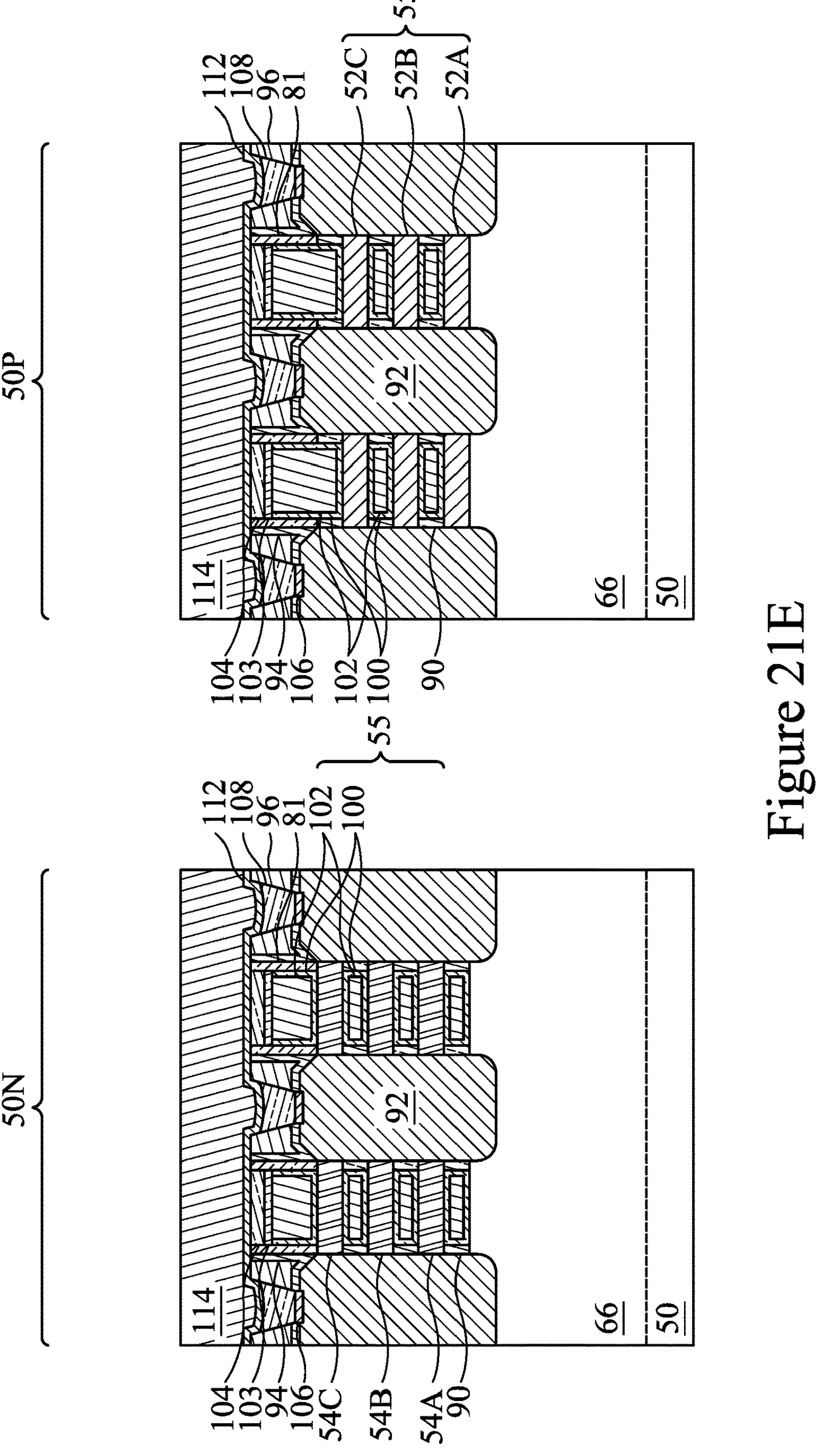

In some embodiments, the recrystallization of the first source/drain contacts may result in the first source/drain contacts 108 having concave top surfaces, as illustrated in FIGS. 20D and 20E, flat surfaces, or the like. The concavity or convexity of the top surfaces of the first source/drain contacts 108 may be dependent on the composition of the first source/drain contacts 108 as well as the conditions of the anneal process performed on the first source/drain contacts 108. FIG. 20D illustrates the first source/drain contacts 108 of FIG. 19D after performing the anneal process. As illustrated in FIG. 20D, following the anneal process, top extents of top surfaces of the first source/drain contacts 108 may be disposed a distance $D_6$ above top surfaces of the first ILD 96, the CESL 94, the first spacers 81, and the gate mask 104 ranging from about 10 nm to about 25 nm; bottom extents of the top surfaces of the first source/drain contacts 108 may be disposed a distance $D_7$ above or below top surfaces of the first ILD 96, the CESL 94, the first spacers 81, and the gate mask 104 ranging from about 10 nm to about 25 nm; the first source/drain contacts 108 may have heights $H_7$ ranging from about 26 nm to about 30 nm, and the first source/drain contacts 108 may have widths $W_7$ ranging from about 14 nm to about 16 nm. A ratio of the heights $H_7$ of the first source/drain contacts 108 to the heights $H_{14}$ of the epitaxial source/drain regions 92 may range from about 0.2 to about 2. A ratio of the heights $H_7$ of the first source/drain contacts 108 to the heights $H_{15}$ of the first ILD 96 may range from about 0.5 to about 1.5. FIG. 20E illustrates the first source/drain contacts 108 of FIG. 19E after performing the anneal process. As illustrated in FIG. 20E, following the anneal process, top extents of top surfaces of the first source/drain contacts 108 may be disposed a distance $D_8$ below top surfaces of the first ILD 96, the CESL 94, the first spacers 81, and the gate mask 104 ranging from about 10 nm to about 25 nm; bottom extents of the top surfaces of the first source/drain contacts 108 may be disposed a distance Do below top surfaces of the first ILD 96, the CESL 94, the first spacers 81, and the gate mask 104 ranging from about 10 nm to about 25 nm; the first source/drain contacts 108 may have heights $H_8$ ranging from about 27 nm to about 30 nm, and the first source/drain contacts 108 may have widths $W_8$ ranging from about 14 nm to about 16 nm. A ratio of the heights $H_8$ of the first source/drain contacts 108 to the heights $H_{14}$ of the epitaxial source/drain regions 92 may range from about ⅙ to about 2. A ratio of the heights $H_8$ of the first source/drain contacts 108 to the heights $H_{15}$ of the first ILD 96 may range from about ⅓ to about 1.

The anneal process may further reduce metal oxides at the surface of the first source/drain contacts 108. For example, in embodiments in which the anneal process is performed in a hydrogen-containing atmosphere, the hydrogen may reduce any metal oxides at the surface of the first source/drain contacts 108. This further reduces the contact resistance of the first source/drain contacts 108 and improves device performance. In an embodiment in which the first source/drain contacts 108 include cobalt, metal oxides in the first source/drain contacts 108 may be reduced according to any of the following reactions:

$$Co_3O_4 + H_2 \rightarrow 3CoO + H_2O$$

$$CoO + H_2 \rightarrow Co + H_2O$$

$$Co_3O_4 + 4H_2 \rightarrow 3Co + 4H_2O$$

In FIGS. 21A through 21E, a second CESL 112 and a second ILD 114 are formed over the structures illustrated in FIGS. 20A through 20E, respectively. The second CESL 112 may comprise a dielectric material, such as, silicon nitride, silicon oxide, silicon oxynitride, or the like, having a different etch rate than the material of the overlying second ILD 114. The second CESL 112 may be deposited by a conformal deposition process, such as ALD, CVD, or the like. As such, a top surface of the second CESL 112 may have a profile the same as or similar to top surfaces of the underlying first source/drain contacts 108, the first ILD 96, the CESL 94, the first spacers 81, and the gate mask 104. In the embodiment illustrated in FIG. 21B, at least portions of the top surface of the second CESL 112 may be disposed below a top surface of the first ILD 96. The second CESL 112 may include depressions over the first source/drain contacts 108, which have convex top surfaces. In the embodiment illustrated in FIG. 21C, portions of the second CESL 112 over the first source/drain contacts 108 may extend above portions of the second CESL 112 over the first ILD 96, the CESL 94, the first spacers 81, and the gate mask 104. The portions of the second CESL 112 over the first source/drain contacts 108 may have convex top surfaces. In the embodiment illustrated in FIG. 21D, portions of the second CESL 112 over the first source/drain contacts 108 may extend above portions of the second CESL 112 over the first ILD 96, the CESL 94, the first spacers 81, and the gate mask 104. The portions of the second CESL 112 over the first source/drain contacts 108 may have concave top surfaces. In the embodiment illustrated in FIG. 21E, at least portions of the top surface of the second CESL 112 may be disposed below a top surface of the first ILD 96. The second CESL 112 may include depressions over the first source/drain contacts 108, which have concave top surfaces. The second CESL 112 may be optional and may be omitted in some embodiments. In some embodiments, the second ILD 114 may have a height $H_{16}$ over the second CESL 112 ranging from about 10 nm to about 70 nm.

The second ILD 114 may be formed of a dielectric material, and may be deposited by any suitable method, such as CVD, PECVD, or FCVD. Suitable dielectric materials may include PSG, BSG, BPSG, USG, or the like. Other insulation materials formed by any acceptable process may be used. After the second ILD 114 is deposited, a planarization process, such as a CMP, may be performed to planarize a top surface of the second ILD 114. In the embodiments illustrated in FIGS. 21B and 21E, the second ILD 114 may extend below a top surface of the first ILD 96.

Figure 22A:
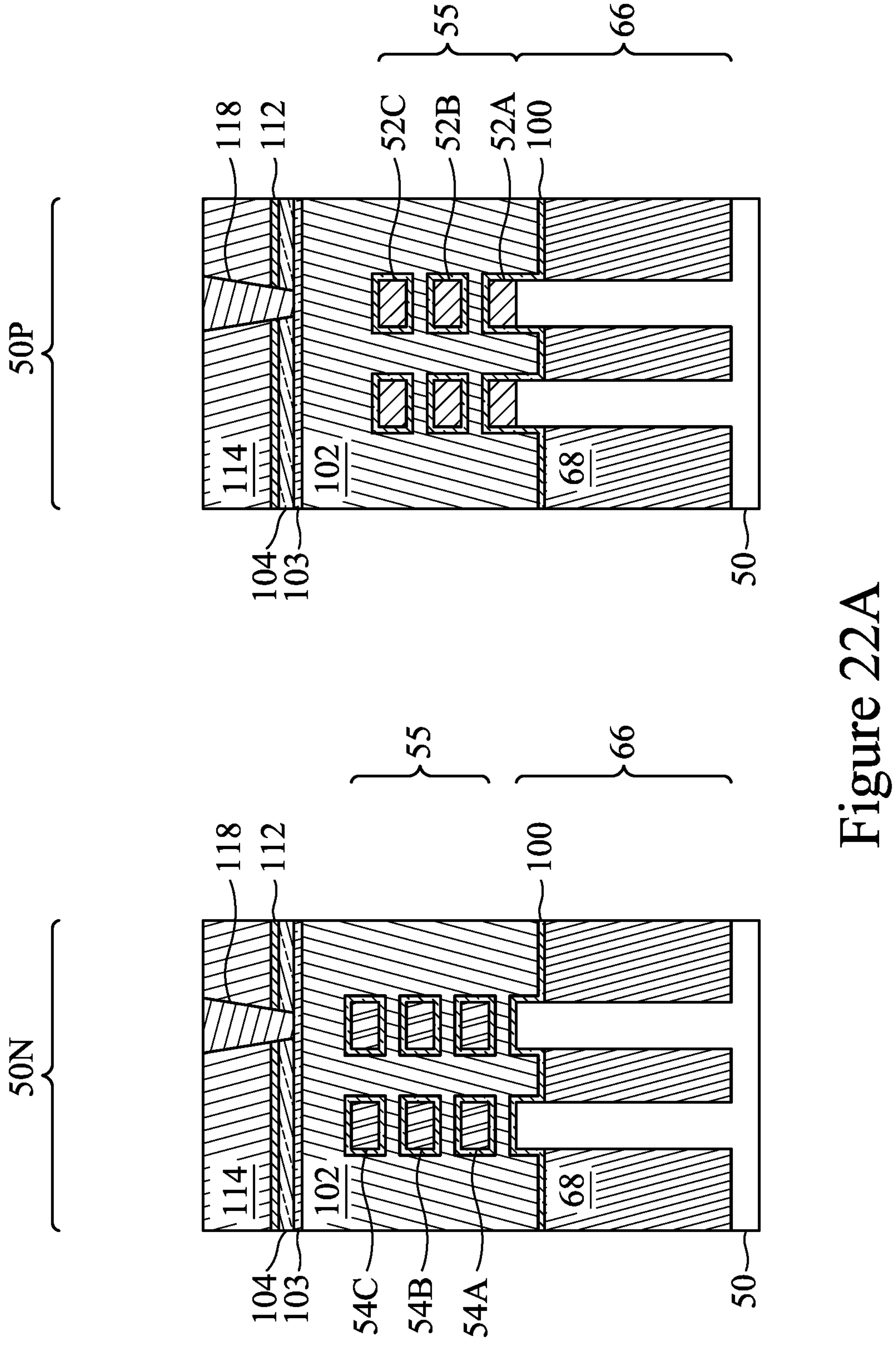
Figure 22B:
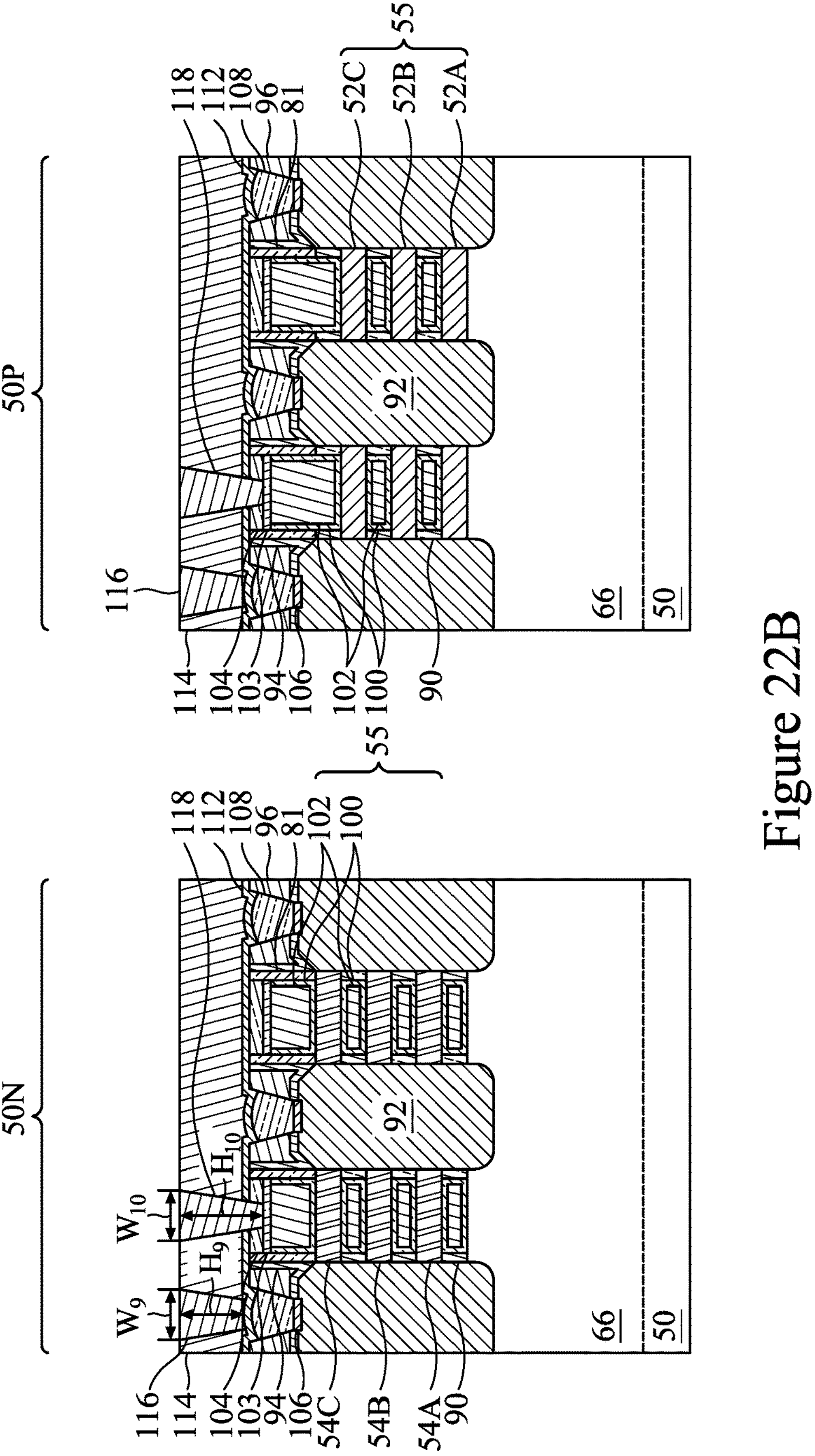
Figure 22C:
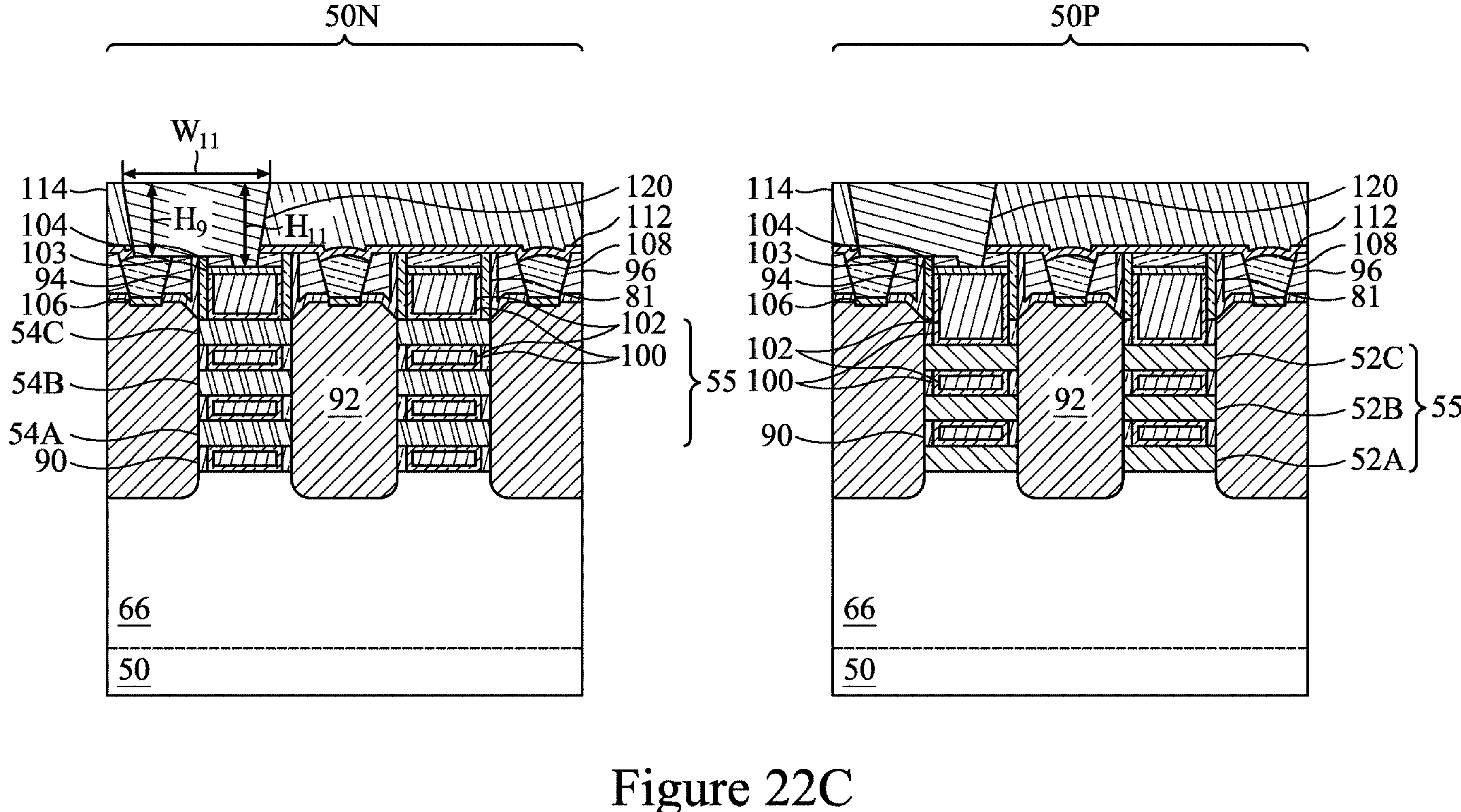

In FIGS. 22A through 22C, second source/drain contacts 116, gate contacts 118, and/or butted contacts 120 (each of which may also be referred to as contact plugs) are formed extending through the second ILD 114 and the second CESL 112. Openings for the second source/drain contacts 116 are formed through the second ILD 114 and the second CESL 112. Openings for the gate contacts 118 are formed through the second ILD 114, the second CESL 112, and the gate mask 104. Openings for the butted contacts 120 are formed through the second ILD 114, the second CESL 112, and the gate mask 104. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 114. The remaining liner and conductive material form the second source/drain contacts 116, the gate contacts 118, and the butted contacts 120 in the openings. The butted contacts 120 may be useful for forming circuitry in the various regions, such as in an SRAM cell.

The second source/drain contacts 116 are electrically coupled to the epitaxial source/drain regions 92 through the first source/drain contacts 108 and the silicide regions 106. The gate contacts 118 are electrically coupled to the gate electrodes 102 through the etch stop layer 103. The butted contacts 120 are electrically coupled to the epitaxial source/drain regions 92 through the first source/drain contacts 108 and the silicide regions 106 and to the gate electrodes 102 through the etch stop layer 103. The second source/drain contacts 116, the gate contacts 118, and the butted contacts 120 may be formed in different processes, or may be formed in the same process. Although shown as being formed in the same cross-sections, it should be appreciated that each of the second source/drain contacts 116 and the gate contacts 118 may be formed in different cross-sections, which may avoid shorting of the contacts.

As illustrated in FIG. 22B, the second source/drain contacts 116 may have heights $H_9$ ranging from about 15 nm to about 60 nm and widths $W_9$ ranging from about 5 nm to about 17 nm. The gate contacts 118 may have heights $H_{10}$ ranging from about 20 nm to about 85 nm and widths $W_{10}$ ranging from about 3 nm to about 17 nm. As illustrated in FIG. 22C, the butted contacts 120 may have widths $W_{11}$ ranging from about 28 nm to about 50 nm, the portions of the butted contacts 120 physically contacting the first source/drain contacts 108 may have the heights $H_9$ ranging from about 15 nm to about 60 nm, and the portions of the butted contacts 120 physically contacting the etch stop layer 103 may have the heights $H_{10}$ ranging from about 20 nm to about 85 nm.

In FIGS. 23A through 23D, an anneal process is performed on the second source/drain contacts 116, the gate contacts 118, and the butted contacts 120. The anneal process illustrated in FIGS. 23A through 23D may be performed in addition to or in place of the anneal process illustrated in and discussed with respect to FIGS. 20A through 20E. The anneal process may be performed at a temperature greater than about 100° C., a temperature ranging from about 20° C. to about 500° C., or the like; a pressure ranging from about 1 Torr to about 50 Torr; and for a duration ranging from about 10 seconds to about 100 seconds. In some embodiments, the anneal process may be performed in an atmosphere which may include a reducing agent and inert gases. For example, the anneal process may be performed in an atmosphere, which may include hydrogen, a mixture of hydrogen and argon, a mixture of nitrogen and hydrogen, argon, a mixture of hydrogen and helium, air, a vacuum, combinations thereof, or the like. In some embodiments, hydrogen gas may be supplied to a chamber in which the anneal process is performed at a flowrate ranging from about 500 sccm to about 5,000 sccm. The anneal process may be performed in situ (e.g., in a process chamber used to form the second source/drain contacts 116, the gate contacts 118, and/or the butted contacts 120) or ex situ (e.g., in a process chamber separate from the process chamber used to form the second source/drain contacts 116, the gate contacts 118, and/or the butted contacts 120).

The anneal process may restructure the second source/drain contacts 116, the gate contacts 118, and the butted contacts 120. More specifically, the anneal process may cause a recrystallization in the second source/drain contacts 116, the gate contacts 118, and the butted contacts 120, which may reduce the resistance of the second source/drain contacts 116, the gate contacts 118, and the butted contacts 120 and improve device performance. The recrystallization of the second source/drain contacts 116, the gate contacts 118, and the butted contacts 120 may cause the volume of the second source/drain contacts 116, the gate contacts 118, and the butted contacts 120 to shrink, and may also result in the second source/drain contacts 116, the gate contacts 118, and/or the butted contacts 120 having convex top surfaces, as illustrated in FIGS. 23A through 23D. In some embodiments, top surfaces of the second source/drain contacts 116, the gate contacts 118, and the butted contacts 120 may have any of the profiles discussed above with respect to FIGS. 20A through 20E. In some embodiments, performing the anneal process on the second source/drain contacts 116, the gate contacts 118, and/or the butted contacts 120 may reduce heights of the second source/drain contacts 116, the gate contacts 118, and/or the butted contacts 120 from about 1% to about 60%, or from about 1% to about 30% compared to heights of the second source/drain contacts 116, the gate contacts 118, and the butted contacts 120 prior to performing the anneal process.

Figure 23A:
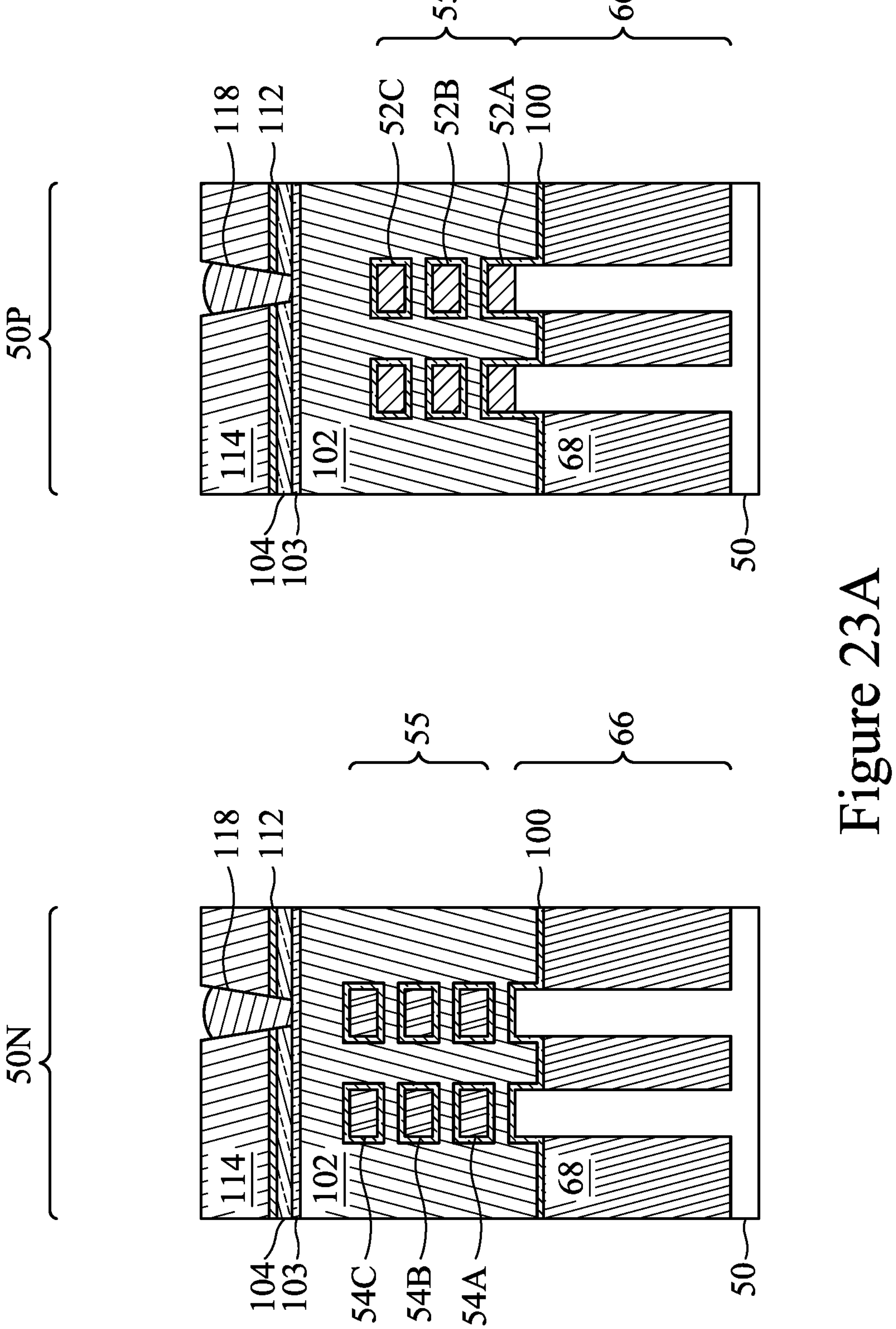
Figure 23B:
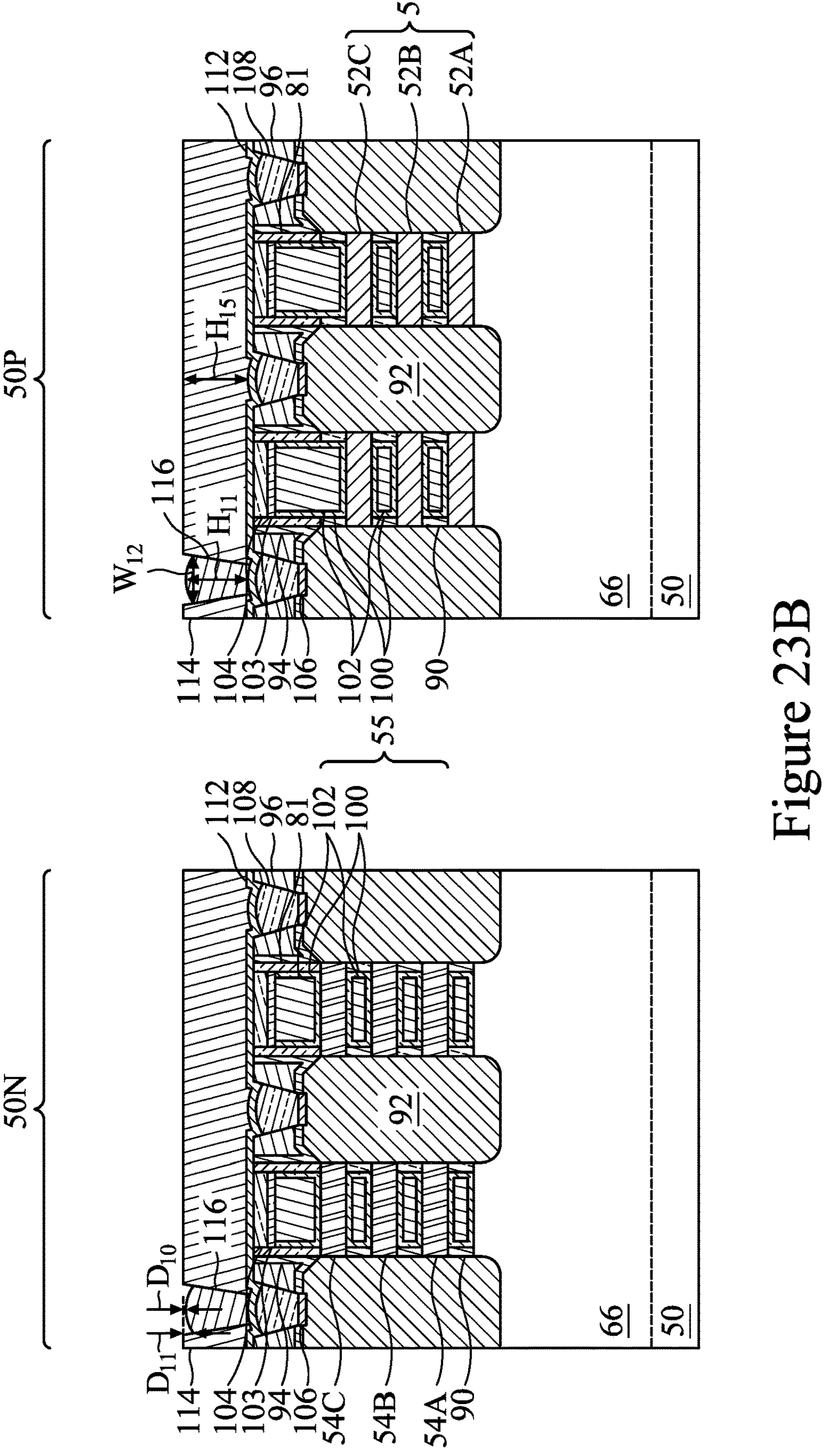
Figure 23C:
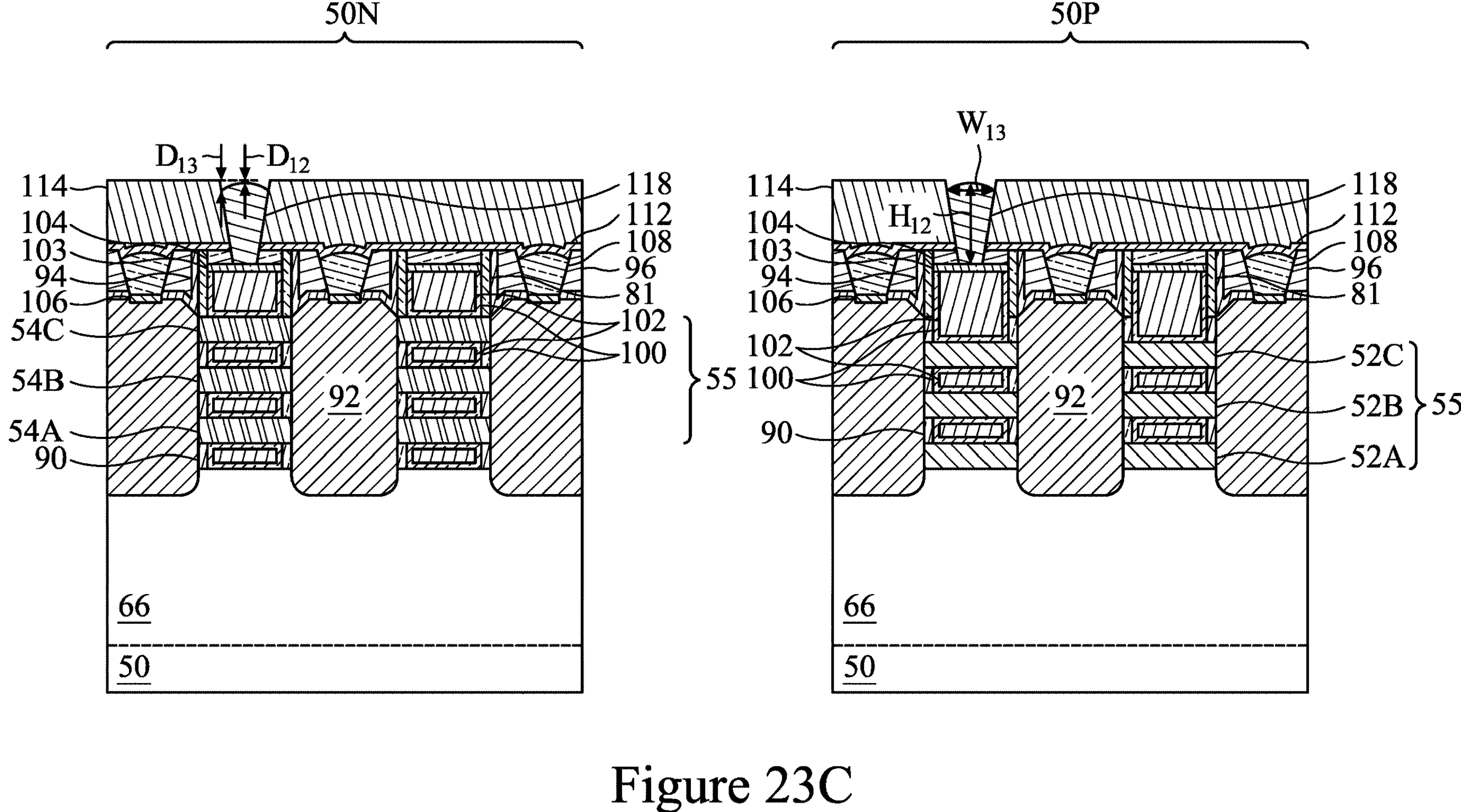
Figure 23D:
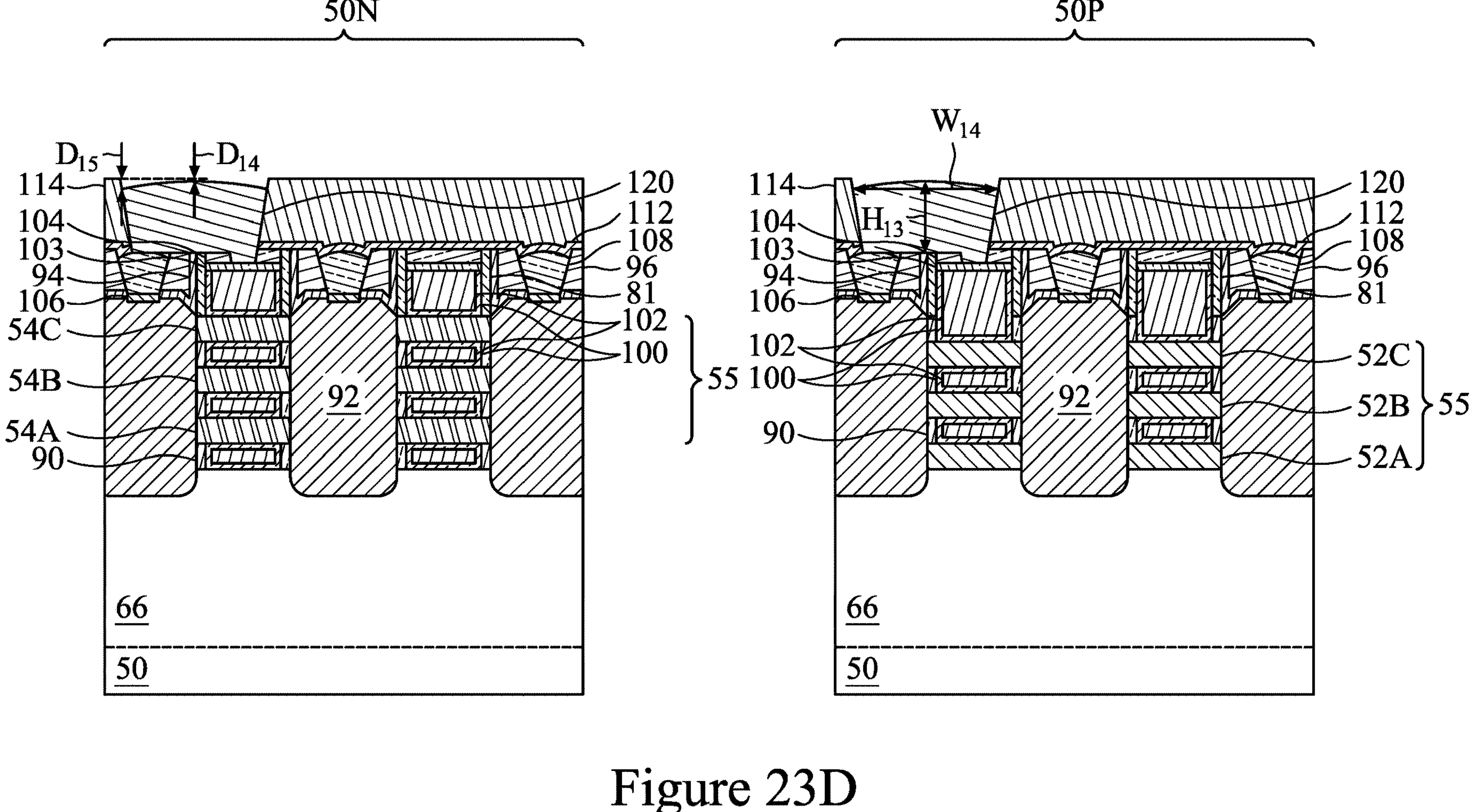

FIGS. 23A and 23C illustrate the gate contacts 118 of FIGS. 22A and 22B after performing the anneal process. As illustrated in FIGS. 23A and 23C, following the anneal process, top extents of top surfaces of the gate contacts 118 may be disposed a distance $D_{12}$ below top surfaces of the second ILD 114 ranging from about 0 nm to about 2 nm; bottom extents of the top surfaces of the gate contacts 118 may be disposed a distance $D_{13}$ below top surfaces of the second ILD 114 ranging from about 0 nm to about 5 nm; the gate contacts 118 may have heights $H_{12}$ ranging from about 17 nm to about 85 nm, and the gate contacts 118 may have widths $W_{13}$ ranging from about 3 nm to about 17 nm. A ratio of the heights $H_{12}$ of the gate contacts 118 to the heights $H_{16}$ of the second ILD 114 may range from about 0.5 to about 1.5. FIG. 23B illustrates the second source/drain contacts 116 after performing the anneal process. As illustrated in FIG. 23B, following the anneal process, top extents of top surfaces of the second source/drain contacts 116 may be disposed a distance $D_{10}$ below top surfaces of the second ILD 114 ranging from about 0 nm to about 2 nm; bottom extents of the top surfaces of the second source/drain contacts 116 may be disposed a distance Du below top surfaces of the second ILD 114 ranging from about 0 nm to about 5 nm; the second source/drain contacts 116 may have heights $H_{11}$ ranging from about 12 nm to about 60 nm, and the second source/drain contacts 116 may have widths $W_{12}$ ranging from about 5 nm to about 17 nm. A ratio of the heights $H_{11}$ of the second source/drain contacts 116 to the heights $H_{16}$ of the second ILD 114 may range from about 0.5 to about 1.5. As illustrated in FIG. 23D, following the anneal process, top extents of top surfaces of the butted contacts 120 may be disposed a distance $D_{14}$ below top surfaces of the second ILD 114 ranging from about 0 nm to about 5 nm; bottom extents of the top surfaces of the butted contacts 120 may be disposed a distance $D_{15}$ below top surfaces of the second ILD 114 ranging from about 0 nm to about 9 nm; the butted contacts 120 may have heights $H_{13}$ ranging from about 7 nm to about 60 nm, and butted contacts 120 may have widths $W_{14}$ ranging from about 28 nm to about 50 nm. A ratio of the heights $H_{13}$ of the butted contacts 120 to the heights $H_{16}$ of the second ILD 114 may range from about 0.5 to about 1.5.

The anneal process may further reduce metal oxides at surfaces of the second source/drain contacts 116, the gate contacts 118, and the butted contacts 120. For example, in embodiments in which the anneal process is performed in a hydrogen-containing atmosphere, the hydrogen may reduce any metal oxides at the surface of the second source/drain contacts 116, the gate contacts 118, and the butted contacts 120. This further reduces the contact resistance of the first source/drain contacts 108 and improves device performance.

Embodiments may achieve advantages. For example, performing the anneal process on any of the first source/drain contacts 108, the second source/drain contacts 116, the gate contacts 118, and the butted contacts 120 may reduce/prevent oxidation of the contacts, which lowers contact resistance, provides a device boost, and improves device performance. Further, the anneal causes top surfaces of the contacts to be reformed to have a surface shape, such as a convex shape, which enlarges a contact area between the contacts and subsequently formed contacts which are connected to the contacts. This further lowers contact resistance, provides a device boost, and improves device performance.

In accordance with an embodiment, a semiconductor device includes a first interlayer dielectric (ILD) layer over a transistor structure; a first contact extending through the first ILD layer, the first contact being electrically coupled with a first source/drain region of the transistor structure, a top surface of the first contact being convex, and the top surface of the first contact being disposed below a top surface of the first ILD layer; a second ILD layer over the first ILD layer and the first contact; and a second contact extending through the second ILD layer, the second contact being electrically coupled with the first contact. In an embodiment, a top surface of the second contact is convex, and the top surface of the second contact is disposed below a top surface of the second ILD layer. In an embodiment, the second contact includes a butted contact, and the second contact is further electrically coupled with a gate electrode of the transistor structure. In an embodiment, the first contact includes cobalt. In an embodiment, the semiconductor device further includes a contact etch stop layer (CESL) over the first ILD layer and the first contact, the second ILD layer being over the CESL, and the CESL having a non-planar top surface. In an embodiment, a top extent of the top surface of the first contact is 2 nm to 3 nm below the top surface of the first ILD layer. In an embodiment, the semiconductor device further includes a third contact extending through the second ILD layer, the third contact being electrically coupled with a gate electrode of the transistor structure, a top surface of the third contact being convex.

In accordance with another embodiment, a semiconductor device includes a first interlayer dielectric (ILD) layer over a transistor structure, the first ILD layer including a planar top surface; and a first contact extending through the first ILD layer, the first contact being electrically coupled with the transistor structure, a top surface of the first contact being non-planar, and the top surface of the first contact being at least partially disposed at a level different from the planar top surface of the first ILD layer. In an embodiment, the top surface of the first contact is convex and disposed below the top surface of the first ILD layer. In an embodiment, the top surface of the first contact is convex and disposed above the top surface of the first ILD layer. In an embodiment, the top surface of the first contact is concave and disposed below the top surface of the first ILD layer. In an embodiment, the top surface of the first contact is concave and disposed above the top surface of the first ILD layer. In an embodiment, the semiconductor device further includes a second ILD layer surrounding a gate electrode of the transistor structure; and a second contact extending through the second ILD layer and electrically coupled to a source/drain region of the transistor structure, the first ILD layer being over the second ILD layer and the second contact, the first contact being electrically coupled to the second contact or the gate electrode. In an embodiment, the first ILD layer surrounds a gate electrode of the transistor structure, and the first contact is electrically coupled to a source/drain region of the transistor structure.

In accordance with yet another embodiment, a method includes forming a first interlayer dielectric (ILD) layer over a transistor structure; etching a first opening extending through the first ILD layer; depositing a first contact in the first opening; planarizing the first ILD layer and the first contact; and annealing the first contact, a top surface of the first contact being non-planar after annealing the first contact. In an embodiment, the first contact is annealed in a hydrogen-containing atmosphere. In an embodiment, the first contact is annealed at a temperature greater than 100° C. In an embodiment, the top surface of the first contact is disposed above a top surface of the first ILD layer after planarizing the first ILD layer and the first contact. In an embodiment, the top surface of the first contact is concave after planarizing the first ILD layer and the first contact, and the top surface of the first contact is concave after annealing the first contact. In an embodiment, the top surface of the first contact is flat after planarizing the first ILD layer and the first contact, and the top surface of the first contact is convex after annealing the first contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a first interlayer dielectric (ILD) layer over a transistor structure;

a first contact extending through the first ILD layer, the first contact being electrically coupled to a first source/drain region of the transistor structure, a top surface of the first contact being convex, the top surface of the first contact being below a top surface of the first ILD layer, the first contact comprising cobalt;

a second ILD layer over the first ILD layer and the first contact; and a second contact extending through the second ILD layer, the second contact being electrically coupled with the first contact, the second contact comprising a butted contact, the second contact being electrically coupled with a gate electrode of the transistor structure.

2. The semiconductor device of claim 1, wherein a top surface of the second contact is convex.

3. The semiconductor device of claim 2, wherein the top surface of the second contact is disposed below a top surface of the second ILD layer.

4. The semiconductor device of claim 2, wherein the top surface of the first contact is 2 nm to 3 nm below the top surface of the first ILD layer.

5. The semiconductor device of claim 1, wherein the first contact is electrically coupled to the first source/drain region through a silicide region.

6. The semiconductor device of claim 5, wherein the silicide region comprises titanium silicide.

7. The semiconductor device of claim 1, further comprising a contact etch stop layer (CESL) between the first ILD layer and the second ILD layer.

8. The semiconductor device of claim 7, wherein the CESL conforms to the convex top surface of the first contact.

9. A method comprising:

forming a first interlayer dielectric (ILD) layer over a transistor structure;

etching a first opening through the first ILD layer;

depositing a first contact in the first opening, wherein the first contact comprises cobalt;

planarizing the first ILD layer and the first contact, wherein a top surface of the first contact is below a top surface of the first ILD layer after planarizing; and annealing the first contact in a hydrogen-containing atmosphere, wherein a top surface of the first contact is non-planar after annealing the first contact.

10. The method of claim 9, wherein the annealing is performed at a temperature greater than 100° C.

11. The method of claim 9, wherein the top surface of the first contact is disposed above the top surface of the first ILD layer after planarizing and before annealing.

12. The method of claim 9, wherein the top surface of the first contact is concave after planarizing and remains concave after annealing.

13. The method of claim 9, wherein the top surface of the first contact is flat after planarizing and becomes convex after annealing.

14. The method of claim 9, further comprising:

forming a second contact extending through a second ILD layer, wherein the second contact is electrically coupled with the first contact.

15. The method of claim 9, wherein after annealing the first contact, the top surface of the first contact is convex and disposed below the top surface of the first ILD layer.

16. The method of claim 9, wherein after annealing the first contact, the top surface of the first contact is convex and disposed above the top surface of the first ILD layer.

17. A semiconductor device comprising:

a substrate having a transistor structure formed thereon;

a first interlayer dielectric (ILD) layer over the transistor structure;

a first contact extending through the first ILD layer and electrically coupled to a source/drain region of the transistor structure, the first contact having a convex top surface that is recessed relative to a top surface of the first ILD layer; and a second ILD layer formed over the first ILD layer and the first contact; and a second contact in the second ILD, the second contact being electrically coupled to the first contact.

18. The semiconductor device of claim 17, wherein the first contact comprises a metal selected from the group consisting of tungsten, copper, and aluminum.

19. The semiconductor device of claim 17, further comprising a silicide contact interface between the first contact and the source/drain region.

20. The semiconductor device of claim 17, wherein the second ILD layer comprises a low-k dielectric material.

* * * * *